(12) United States Patent
Sasaki et al.

(10) Patent No.: US 9,153,649 B2
(45) Date of Patent: Oct. 6, 2015

(54) SEMICONDUCTOR DEVICE AND METHOD FOR EVALUATING SEMICONDUCTOR DEVICE

(71) Applicant: Semiconductor Energy Laboratory Co., Ltd., Kanagawa-ken (JP)

(72) Inventors: Toshinari Sasaki, Tokyo (JP); Hiroshi Kanemura, Tochigi (JP); Yasuharu Hosaka, Tochigi (JP); Shuhei Yokoyama, Shizuoka (JP); Toshimitsu Obonai, Tochigi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 127 days.

(21) Appl. No.: 14/091,907

(22) Filed: Nov. 27, 2013

(65) Prior Publication Data

US 2014/0152336 A1 Jun. 5, 2014

(30) Foreign Application Priority Data

Nov. 30, 2012 (JP) .................................. 2012-263819

(51) Int. Cl.

| | |
|---|---|
| *G01R 31/02* | (2006.01) |
| *H01L 29/22* | (2006.01) |
| *H01L 29/786* | (2006.01) |
| *H01L 27/146* | (2006.01) |
| *G09G 3/00* | (2006.01) |

(Continued)

(52) U.S. Cl.
CPC .......... *H01L 29/22* (2013.01); *H01L 27/14678* (2013.01); *H01L 27/14692* (2013.01); *H01L 29/7869* (2013.01); *G01R 31/2656* (2013.01); *G09G 3/006* (2013.01); *G09G 3/3225* (2013.01); *G09G 3/3648* (2013.01)

(58) Field of Classification Search
USPC .................................................. 324/762.01
See application file for complete search history.

(56) References Cited

U.S. PATENT DOCUMENTS 5,523,694 A * 6/1996 Cole, Jr. ................... 324/750.14
5,528,032 A   6/1996 Uchiyama
(Continued)

FOREIGN PATENT DOCUMENTS

EP 1737044 12/2006
EP 2226847 9/2010
(Continued)

OTHER PUBLICATIONS

Fortunato et al., "Wide-Bandgap High-Mobility ZnO Thin-Film Transistors Produced at Room Temperature," *Applied Physics Letters*, Sep. 27, 2004, vol. 85, No. 13, pp. 2541-2543.
(Continued)

*Primary Examiner* — Benjamin M Baldridge
(74) *Attorney, Agent, or Firm* — Husch Blackwell LLP

(57) ABSTRACT

A semiconductor layer with a low density of trap states is provided. A transistor with stable electrical characteristics is provided. A transistor having high field-effect mobility is provided. A semiconductor device including the transistor is provided. A method for evaluating a semiconductor layer is provided. A method for evaluating a transistor is provided. A method for evaluating a semiconductor device is provided. Provided is, for example, a semiconductor layer with a low defect density which can be used for a channel formation region of a transistor, a transistor including a semiconductor layer with a low defect density in a channel formation region, or a semiconductor device including the transistor.

11 Claims, 45 Drawing Sheets

(51) Int. Cl.
G09G 3/32 (2006.01)
G09G 3/36 (2006.01)
G01R 31/265 (2006.01)

(56) References Cited

U.S. PATENT DOCUMENTS

| | | | |
|---|---|---|---|
| 5,543,334 A * | 8/1996 | Yoshii et al. ................ 438/17 |
| 5,731,856 A | 3/1998 | Kim et al. |
| 5,744,864 A | 4/1998 | Cillessen et al. |
| 5,999,006 A * | 12/1999 | Kikuchi ................ 324/762.01 |
| 6,294,274 B1 | 9/2001 | Kawazoe et al. |
| 6,437,592 B1 * | 8/2002 | Polignano et al. ....... 324/762.01 |
| 6,563,174 B2 | 5/2003 | Kawasaki et al. |
| 6,727,522 B1 | 4/2004 | Kawasaki et al. |
| 6,768,324 B1 * | 7/2004 | Yamada et al. ......... 324/754.22 |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 * | 12/2008 | Kaji et al. ................ 438/308 |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,994,500 B2 | 8/2011 | Kim et al. |
| 8,058,645 B2 | 11/2011 | Jeong et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,274,078 B2 | 9/2012 | Itagaki et al. |
| 8,421,083 B2 | 4/2013 | Yamazaki et al. |
| 8,890,159 B2 | 11/2014 | Yamazaki et al. |
| 2001/0046027 A1 | 11/2001 | Tai et al. |
| 2002/0056838 A1 | 5/2002 | Ogawa |
| 2002/0125900 A1 * | 9/2002 | Savtchouk et al. ........... 324/750 |
| 2002/0130674 A1 * | 9/2002 | Lagowski et al. ............ 324/750 |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2004/0160239 A1 * | 8/2004 | Reynick ..................... 324/765 |
| 2004/0212373 A1 * | 10/2004 | Yamada ..................... 324/537 |
| 2005/0017302 A1 | 1/2005 | Hoffman |
| 2005/0191768 A1 * | 9/2005 | Yoon et al. ................... 438/7 |
| 2005/0199959 A1 | 9/2005 | Chiang et al. |
| 2006/0022295 A1 * | 2/2006 | Takafuji et al. ............... 257/495 |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 * | 3/2007 | Kaji et al. .................... 438/795 |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 * | 3/2009 | Kuwabara et al. ............ 348/790 |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0320458 A1 | 12/2010 | Umeda et al. |
| 2010/0320459 A1 | 12/2010 | Umeda et al. |
| 2011/0140100 A1 | 6/2011 | Takata et al. |
| 2011/0148455 A1 * | 6/2011 | Kato et al. ................ 324/762.01 |
| 2011/0156026 A1 | 6/2011 | Yamazaki et al. |
| 2011/0193083 A1 | 8/2011 | Kim et al. |
| 2011/0215328 A1 | 9/2011 | Morosawa et al. |
| 2011/0240990 A1 | 10/2011 | Yamazaki |
| 2011/0240991 A1 | 10/2011 | Yamazaki |
| 2012/0119205 A1 | 5/2012 | Taniguchi et al. |
| 2012/0305913 A1 | 12/2012 | Yamazaki et al. |
| 2012/0319102 A1 | 12/2012 | Yamazaki et al. |
| 2012/0319114 A1 | 12/2012 | Yamazaki et al. |
| 2012/0319183 A1 | 12/2012 | Yamazaki et al. |
| 2013/0009209 A1 | 1/2013 | Yamazaki |
| 2013/0009220 A1 | 1/2013 | Yamazaki et al. |
| 2013/0248855 A1 * | 9/2013 | Miki et al. ..................... 257/43 |
| 2013/0341617 A1 * | 12/2013 | Tao et al. ..................... 257/43 |
| 2014/0125645 A1 * | 5/2014 | Ghaderi et al. ................ 345/211 |

FOREIGN PATENT DOCUMENTS

| | | |
|---|---|---|
| JP | 60-198861 | 10/1985 |
| JP | 63-210022 | 8/1988 |
| JP | 63-210023 | 8/1988 |
| JP | 63-210024 | 8/1988 |
| JP | 63-215519 | 9/1988 |
| JP | 63-239117 | 10/1988 |
| JP | 63-265818 | 11/1988 |
| JP | 5-251705 | 9/1993 |
| JP | 6-275697 | 9/1994 |

(56) References Cited

FOREIGN PATENT DOCUMENTS

| | | |
|---|---|---|
| JP | 8-264794 | 10/1996 |
| JP | 11-505377 | 5/1999 |
| JP | 2000-044236 | 2/2000 |
| JP | 2000-150900 | 5/2000 |
| JP | 2002-076356 | 3/2002 |
| JP | 2002-289859 | 10/2002 |
| JP | 2003-086000 | 3/2003 |
| JP | 2003-086808 | 3/2003 |
| JP | 2004-103957 | 4/2004 |
| JP | 2004-273614 | 9/2004 |
| JP | 2004-273732 | 9/2004 |
| JP | 2006-165528 | 6/2006 |
| JP | 2007-96055 | 4/2007 |
| JP | 2007-123861 | 5/2007 |
| JP | 2010-177431 | 8/2010 |
| JP | 2012-160679 | 8/2012 |
| WO | WO 2004/114391 | 12/2004 |

OTHER PUBLICATIONS

Dembo et al., "RFCPUS on Glass and Plastic Substrates Fabricated by TFT Transfer Technology," *IEDM 05: Technical Digest of International Electron Devices Meeting*, Dec. 5, 2005, pp. 1067-1069.

Ikeda et al., "21.2: Full-Functional System Liquid Crystal Display Using CG-Silicon Technology," *SID 2004 Digest, SID International Symposium Digest of Technical Papers*, 2004, vol. 35, pp. 860-863.

Nomura et al., "Room-Temperature Fabrication of Transparent Flexible Thin-Film Transistors Using Amorphous Oxide Semiconductors," *Nature*, Nov. 25, 2004, vol. 432, pp. 488-492.

Park et al., "Improvements in the Device Characteristics of Amorphous Indium Gallium Zinc Oxide Thin-Film Transistors by Ar Plasma Treatment," *Applied Physics Letters*, Jun. 26, 2007, vol. 90, No. 26, pp. 262106-1-262106-3.

Takahashi et al., "Theoretical Analysis of IGZO Transparent Amorphous Oxide Semiconductor," *IDW '08: Proceedings of the 15th International Display Workshops*, Dec. 3, 2008, pp. 1637-1640.

Hayashi et al., "42.1: Invited Paper: Improved Amorphous In—Ga—Zn—O TFTS," *SID 2008 Digest, SID International Symposium Digest of Technical Papers*, May 20, 2008, vol. 39, pp. 621-624.

Prins et al., "A Ferroelectric Transparent Thin-Film Transistor," *Applied Physics Letters*, Jun. 17, 1996, vol. 68, No. 25, pp. 3650-3652.

Nakamura et al., "The phase relations in the $In_2O_3$—$Ga_2ZnO_4$—ZnO system at 1350° C," *Journal of Solid State Chemistry*, Aug. 1, 1991, vol. 93, No. 2, pp. 298-315.

Kimizuka et al., "Syntheses and Single-Crystal Data of HoMologous Compounds, $In_2O_3(ZnO)m$ (m = 3, 4, and 5), $InGaO_3(ZnO)3$, and $Ga_2O_3(ZnO)m$ (m = 7, 8, 9, and 16) in the $In_2O_3$—$ZnGa_2O_4$—ZnO System," *Journal of Solid State Chemistry*, Apr. 1, 1995, vol. 116, No. 1, pp. 170-178.

Nomura et al., "Thin-Film Transistor Fabricated in Single-Crystalline Transparent Oxide Semiconductor," *Science*, May 23, 2003, vol. 300, No. 5623, pp. 1269-1272.

Masuda et al., "Transparent thin film transistors using ZnO as an active channel layer and their electrical properties," Journal of Applied Physics, Feb. 1, 2003, vol. 93, No. 3, pp. 1624-1630.

Asakuma et al., "Crystallization and Reduction of Sol-Gel-Derived Zinc Oxide Films by Irradiation With Ultraviolet Lamp," *Journal of Sol-Gel Science and Technology*, 2003, vol. 26, pp. 181-184.

Osada et al., "15.2: Development of Driver-Integrated Panel using Amorphous In—Ga—Zn—Oxide TFT," *SID 2009 Digest, SID International Symposium Digest of Technical Papers*, May 31, 2009, pp. 184-187.

Nomura et al., "Carrier transport in transparent oxide semiconductor with intrinsic structural randomness probed using single-crystalline $InGaO_3(ZnO)5$ films," *Applied Physics Letters*, Sep. 13, 2004, vol. 85, No. 11, pp. 1993-1995.

Li et al., "Modulated Structures of Homologous Compounds $InMO_3(ZnO)m$ (M=In,Ga; m=Integer) Described by Four-Dimensional Superspace Group," *Journal of Solid State Chemistry*, 1998, vol. 139, pp. 347-355.

Son et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID *2008 Digest, SID International Symposium Digest of Technical Papers*, May 20, 2008, vol. 39, pp. 633-636.

Lee et al., "42.2: World's Largest (15-Inch) XGA AMLCD Panel Using IGZO Oxide TFT," *SID 2008 Digest, SID International Symposium Digest of Technical Papers*, May 20, 2008, vol. 39, pp. 625-628.

Nowatari et al., "60.2: Intermediate Connector With Suppressed Voltage Loss for White Tandem OLEDS," *SID 2009 Digest, SID International Symposium Digest of Technical Papers*, May 31, 2009, vol. 40, pp. 899-902.

Kanno et al., "White Stacked Electrophosphorecent Organic Light-Emitting Devices Employing $MOO_3$ as a Charge-Generation Layer," *Advanced Materials*, 2006, vol. 18, No. 3, pp. 339-342.

Tsuda et al., "Ultra Low Power Consumption Technologies for Mobile TFT-LCDs," *Proceedings of the 9th International Display Workshops*, Dec. 4, 2002, pp. 295-298.

Van De Walle, "Hydrogen as a Cause of Doping in Zinc Oxide," *Physical Review Letters*, Jul. 31, 2000, vol. 85, No. 5, pp. 1012-1015.

Fung et al., "2-D Numerical Simulation of High Performance Amorphous In—Ga—Zn—O TFTs for Flat Panel Displays," *The Japan Society of Applied Physics Digest of Technical Papers*, Jul. 2, 2008, pp. 251-252.

Jeong et al., "3.1: Distinguished Paper: 12.1-Inch WXGA Amoled Display Driven by Indium—Gallium—Zinc Oxide TFTs Array," *SID 2008 Digest, SID International Symposium Digest of Technical Papers*, May 20, 2008, vol. 39, No. 1, pp. 1-4.

Park et al., "High performance amorphous oxide thin film transistors with self-aligned top-gate structure," *Technical Digest of International Electron Devices Meeting*, Dec. 7, 2009, pp. 191-194.

Kurokawa et al., "UHF RFCPUS on Flexible and Glass Substrates for Secure RFID Systems," *Journal of Solid-State Circuits*, 2008, vol. 43, No. 1, pp. 292-299.

Ohara et al., "Amorphous In—Ga—Zn—Oxide TFTs with Suppressed Variation for 4.0 inch QVGA AMOLED Display," *The Japan Society of Applied Physics Digest of Technical Papers*, Jul. 1, 2009, pp. 227-230.

Coates et al., "Optical Studies of the Amorphous Liquid-Cholesteric Liquid Crystal Transition: The Blue Phase," *Physics Letters*, Sep. 10, 1973, vol. 45A, No. 2, pp. 115-116.

Cho et al., "21.2:AL and SN-Doped Zinc Indium Oxide Thin Film Transistors for AMOLED Backplane," *SID 2009 Digest, SID International Symposium Digest of Technical Papers*, May 31, 2009, pp. 280-283.

Lee et al., "15.4: Excellent Performance of Indium—Oxide-Based Thin-Film Transistors by DC Sputtering," *SID 2009 Digest, SID International Symposium Digest of Technical Papers*, May 31, 2009, pp. 191-193.

Jin et al., "65.2:Distinguished Paper:World-Largest (6.5.∴) Flexible Full Color Top Emission AMOLED Display on Plastic Film and its Bending Properties," *SID 2009 Digest, SID International Symposium Digest of Technical Papers*, May 31, 2009, pp. 983-985.

Sakata et al., "Development of 4.0-IN. AMOLED Display With Driver Circuit Using Amorphous In—Ga—Zn—Oxide TFTs," *Proceedings of the 16th International Display Workshops*, 2009, pp. 689-692.

Park et al., "Amorphous Indium—Gallium—Zinc Oxide TFTs and Their Application for Large Size AMOLED," *AM-FPD Digest of Technical Papers*, Jul. 2, 2008, pp. 275-278.

Park et al., "Challenge to Future Displays: Transparent AM-OLED Driven by Peald Grown ZnO TFT," *IMID Digest*, 2007, pp. 1249-1252.

Godo et al., "Temperature Dependence of Characteristics and Electronic Structure for Amorphous In—Ga—Zn—Oxide TFT," AM-FPD Digest of Technical Papers, Jul. 1, 2009, pp. 41-44.

Osada et al., "Development of Driver-Integrated Panel Using Amorphous In—Ga—Zn—Oxide TFT," *AM-FPD Digest of Technical Papers*, Jul. 1, 2009, pp. 33-36.

Hirao et al., "Novel Top-Gate Zinc Oxide Thin-Film Transistors (ZnO TFTs) for AMLCDs," *Journal of the SID*, 2007, vol. 15, No. 1, pp. 17-22.

(56) References Cited

OTHER PUBLICATIONS

Hosono, "68.3:Invited Paper:Transparent Amorphous Oxide Semiconductors for High Performance TFT," *SID 2007 Digest SID International Symposium Digest of Technical Papers*, 2007, vol. 38, pp. 1830-1833.

Godo et al., "P-9:Numerical Analysis on Temperature Dependence of Characteristics of Amorphous In—Ga—Zn—Oxide TFT," *SID 2009 Digest, SID International Symposium Digest of Technical Papers*, May 31, 2009, pp. 1110-1112.

Ohara et al., "21.3:4.0 In. QVGA AMOLED Display Using In—Ga—Zn—Oxide TFTs With a Novel Passivation Layer," *SID 2009 Digest, SID International Symposium Digest of Technical Papers*, May 31, 2009, pp. 284-287.

Miyasaka, "58.2: Invited Paper: SUFTLA Flexible Microelectronics on Their Way to Business," *SID 2007 Digest, SID International Symposium Digest of Technical Papers*, 2007, vol. 38, pp. 1673-1676.

Chern et al., "An Analytical Model for the Above-Threshold Characteristics of Polysilicon Thin-Film Transistors," *IEEE Transactions on Electron Devices*, Jul. 1, 1995, vol. 42, No. 7, pp. 1240-1246.

Kikuchi et al., "39.1:Invited Paper:Optically Isotropic Nano-Structured Liquid Crystal Composites for Display Applications," *SID 2009 Digest, SID International Symposium Digest of Technical Papers*, May 31, 2009, pp. 578-581.

Asaoka et al., "29.1:Polarizer-Free Reflective LCD Combined With Ultra Low-Power Driving Technology," *SID 2009 Digest, SID International Symposium Digest of Technical Papers*, May 31, 2009, pp. 395-398.

Lee et al., "Current Status of, Challenges to, and Perspective View of AM-OLED", *Proceedings of the 13th International Display Workshops*, Dec. 7, 2006, pp. 663-666.

Kikuchi et al., "62.2:Invited Paper:Fast Electro-Optical Switching in Polymer-Stabilized Liquid Crystalline Blue Phases for Display Application," SID 2007 Digest, *SID International Symposium Digest of Technical Papers*, 2007, vol. 38, pp. 1737-1740.

Nakamura "Synthesis of Homologous Compound with New Long-Period Structure," *NIRIM Newsletter*, Mar. 1, 1995, vol. 150, pp. 1-4.

Kikuchi et al., "Polymer-Stabilized Liquid Crystal Blue Phases," *Nature Materials*, Sep. 2, 2002, vol. 1, pp. 64-68.

Kimizuka et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] At Temperatures Over 1000°C," *Journal of Solid State Chemistry*, 1985, vol. 60, pp. 382-384.

Kitzerow et al., "Observation of Blue Phases in Chiral Networks," *Liquid Crystals*, 1993, vol. 14, No. 3, pp. 911-916.

Costello et al., "Electron Microscopy of a Cholesteric Liquid Crystal and Its Blue Phase," *Physical Review B.*, May 1, 1984, vol. 29, No. 5, pp. 2957-2959.

Meiboom et al., "Theory of the Blue Phase of Cholesteric Liquid Crystals," *Physical Review Letters*, May 4, 1981, vol. 46, No. 18, pp. 1216-1219.

Park et al., "42.3: Transparent ZnO Thin Film Transistor for the Application of High Aperture Ratio Bottom Emission AM-OLED Display," *SID 2008 Digest, SID International Symposium Digest of Technical Papers*, May 20, 2008, vol. 39, pp. 629-632.

Orita et al., "Mechanism of Electrical Conductivity of Transparent InGaZnO4," *Physical Review. B*, Jan. 15, 2000, vol. 61, No. 3, pp. 1811-1816.

Nomura et al., "Amorphous Oxide Semiconductors for High-Performance Flexible Thin-Film Transistors," *Japanese Journal of Applied Physics*, 2006, vol. 45, No. 5B, pp. 4303-4308.

Janotti et al., "Native Point Defects in ZnO," *Physical Review B*, Oct. 4, 2007, vol. 76, No. 16, pp. 165202-1-165202-22.

Park et al., "Electronic Transport Properties of Amorphous Indium—Gallium—Zinc Oxide Semiconductor Upon Exposure to Water," *Applied Physics Letters*, 2008, vol. 92, pp. 072104-1-072104-3.

Hsieh et al., "P-29:Modeling of Amorphous Oxide Semiconductor Thin Film Transistors and Subgap Density of States," *SID 2008 Digest, SID International Symposium Digest of Technical Papers*, 2008, vol. 39, pp. 1277-1280.

Janotti et al., "Oxygen Vacancies in ZnO," *Applied Physics Letters*, 2005, vol. 87, pp. 122102-1-122102-3.

Oba et al., "Defect energetics in ZnO: A hybrid Hartree-Fock density functional study," *Physical Review B*, 2008, vol. 77, pp. 245202-1-245202-6.

Orita et al., "Amorphous transparent conductive oxide InGaO3(ZnO)m (m<4):a Zn4s conductor," *Philosophical Magazine*, 2001, vol. 81, No. 5, pp. 501-515.

Hosono et al., "Working hypothesis to explore novel wide band gap electrically conducting amorphous oxides and examples," *Journal of Non-Crystalline Solids*, 1996, vol. 198-200, pp. 165-169.

Mo et al., "Amorphous Oxide TFT Backplanes for Large Size AMOLED Displays," *Proceedings of the 6th International Display Workshops*, Dec. 3, 2008, pp. 581-584.

Clark et al., "First Principles Methods Using CASTEP," *Zeitschrift fur Kristallographie*, 2005, vol. 220, pp. 567-570.

Lany et al., "Dopability, Intrinsic Conductivity, and Nonstoichiometry of Transparent Conducting Oxides," *Physical Review Letters*, Jan. 26, 2007, vol. 98, pp. 045501-1-045501-4.

Park.J et al., "Dry etching of ZnO films and plasma-induced damage to optical properties," *Journal of Vacuum Science & Technology B*, Mar. 1, 2003, vol. 21, No. 2, pp. 800-803.

Oh et al., "Improving the Gate Stability of ZnO Thin-Film Transistors With Aluminum Oxide Dielectric Layers," *Journal of the Electrochemical Society*, 2008, vol. 155, No. 12, pp. H1009-H1014.

Ueno et al., "Field-Effect Transistor on SrTiO3 With Sputtered Al2O3 Gate Insulator," *Applied Physics Letters*, Sep. 1, 2003, vol. 83, No. 9, pp. 1755-1757.

Kamiya, T. et al., "Carrier Transport Properties and Electronic Structures of Amorphous Oxide Semiconductors: The Present Status," Solid State Physics, vol. 44, No. 9, Sep. 1, 2009, pp. 621-633, Agne Gijutsu Center (with English translation).

Nakayama, M. et al.,"17a-TL-8: Effect of GaO Layer on IGZO-TFT Channel," Extended Abstracts (The 57th Spring Meeting 2010), The Japan Society of Applied Physics and Related Societies, Mar. 17, 2010, pp. 21-008 (with English translation).

Ono, M. et al., "Novel High Performance IGZO-TFT with High Mobility over 40 cm$^2$/Vs and High Photostability Incorporated Oxygen Diffusion," IDW '11: Proceedings of the 18th International Display Workshops, Dec. 7, 2011, pp. 1689-1690.

Kamiya, T. et al., "Carrier Transport Properties and Electronic Structures of Amorphous Oxide Semiconductors: The Present Status," Solid State Physics, vol. 44, No. 9, Sep. 1, 2009, pp. 621-633, Agne Gijutsu Center.

Nakayama, M. et al., "17a-TL-8: Effect of GaO Layer on IGZO-TFT Channel," Extended Abstracts (The 57th Spring Meeting 2010), The Japan Society of Applied Physics and Related Societies, Mar. 17, 2010, pp. 21-008.

Ono, M. et al., "Novel High Performance IGZO-TFT with High Mobility over 40 cm$^2$/Vs and High Photostability Incorporated Oxygen Diffusion," IDW '11: Proceedings of the $18^{th}$ International Display Workshops, Dec. 7, 2011, pp. 1689-1690.

* cited by examiner

FIG. 2A1
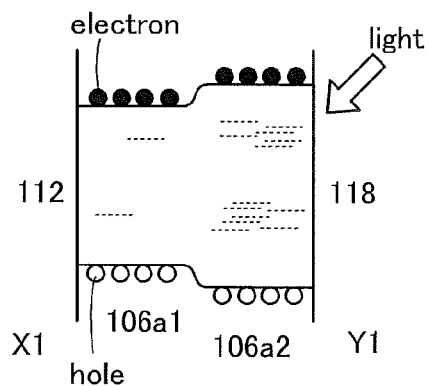
FIG. 2A2
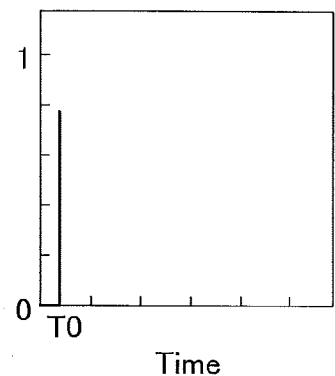
FIG. 2B1
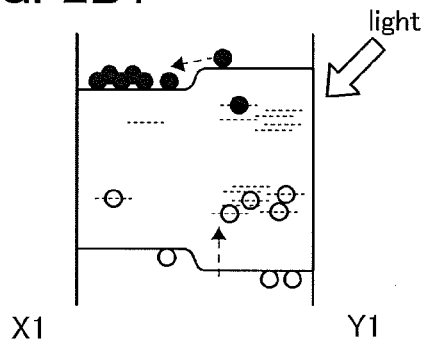
FIG. 2B2
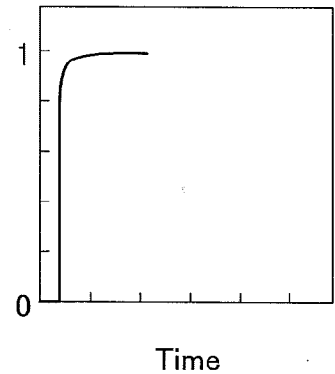
FIG. 2C1
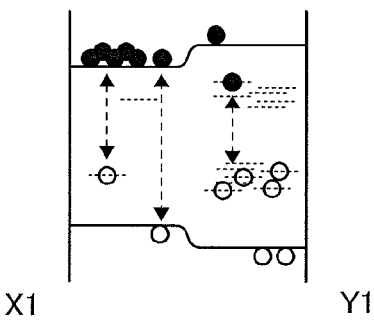
FIG. 2C2
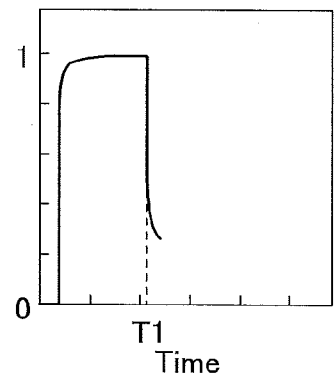
FIG. 2D1
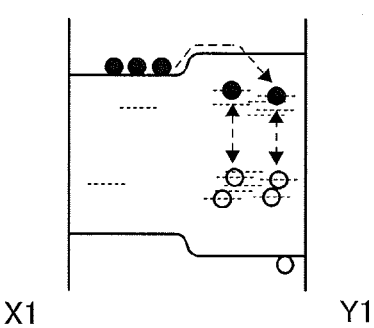
FIG. 2D2
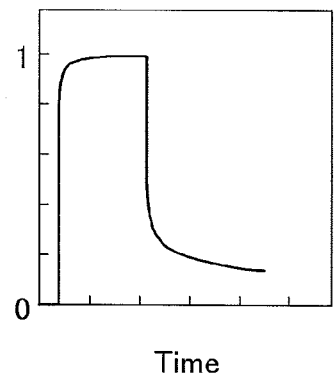

FIG. 4A1
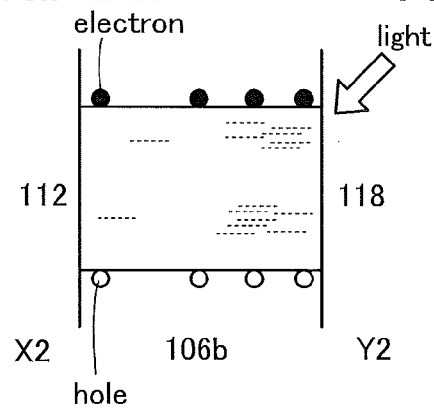
FIG. 4A2
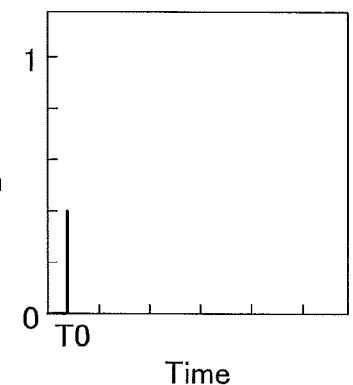
FIG. 4B1
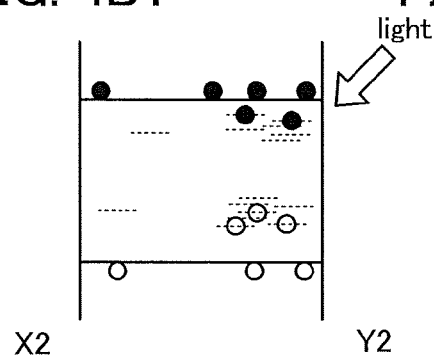
FIG. 4B2
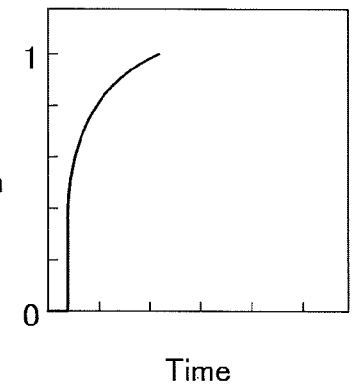
FIG. 4C1
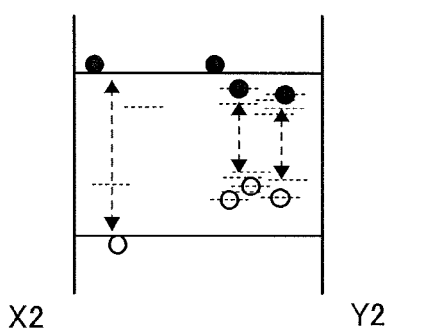
FIG. 4C2
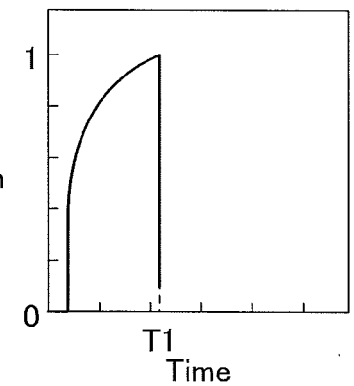
FIG. 4D1
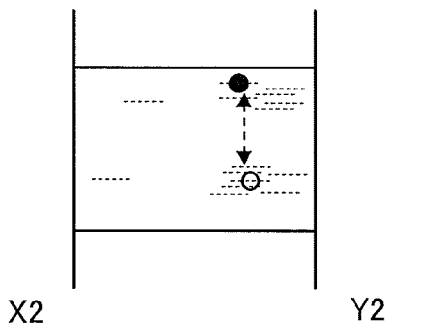
FIG. 4D2
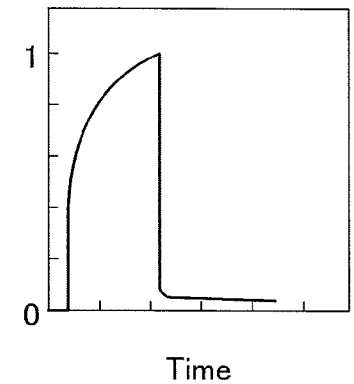

FIG. 6A1
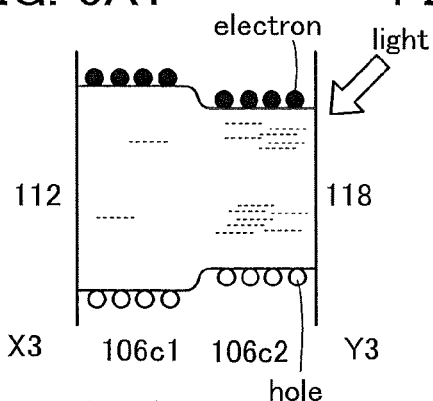
FIG. 6A2
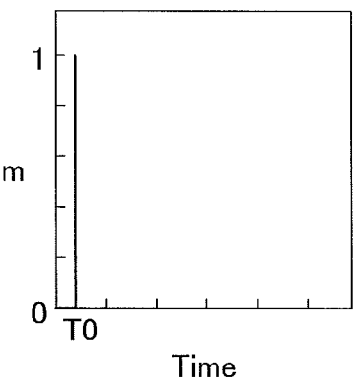
FIG. 6B1
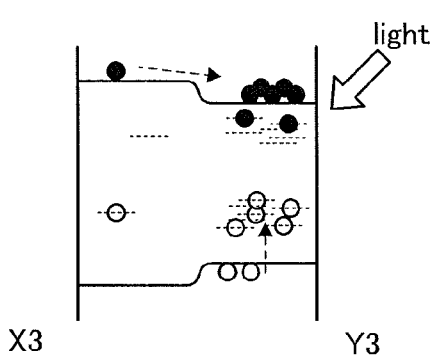
FIG. 6B2
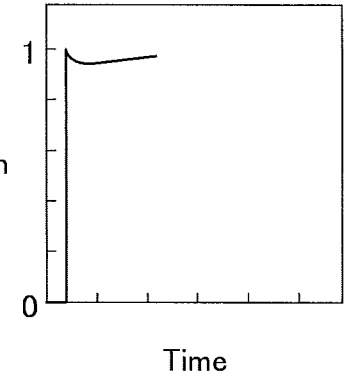
FIG. 6C1
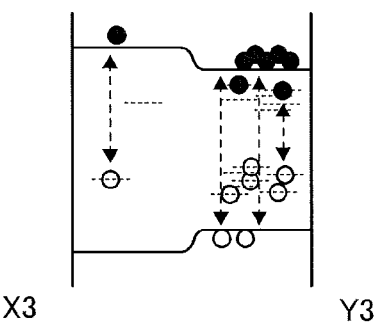
FIG. 6C2
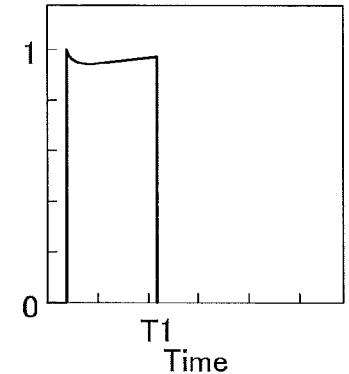
FIG. 6D1
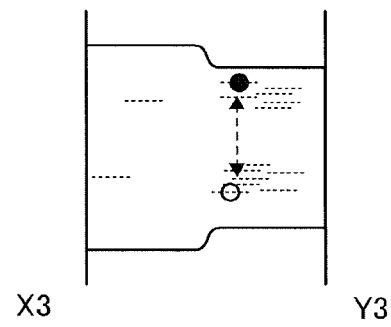
FIG. 6D2
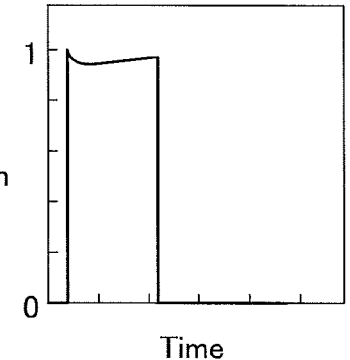

FIG. 18A1   FIG. 18A2
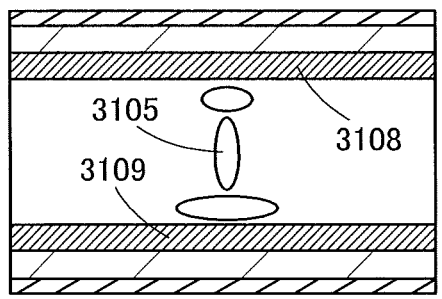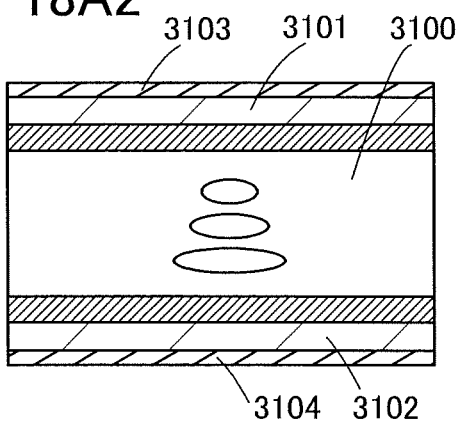
FIG. 18B1   FIG. 18B2
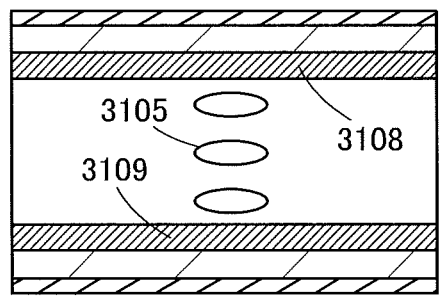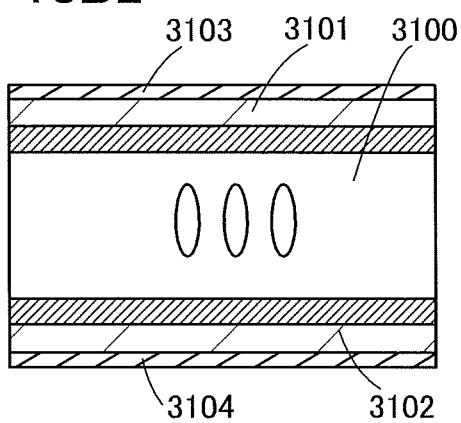
FIG. 18C1   FIG. 18C2
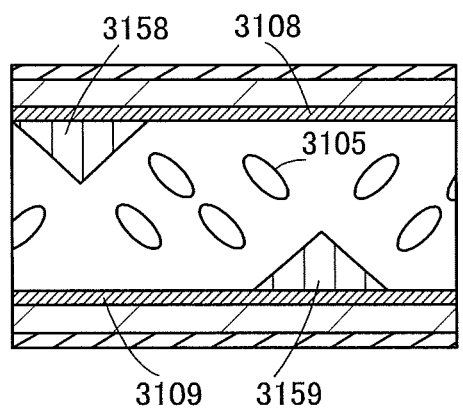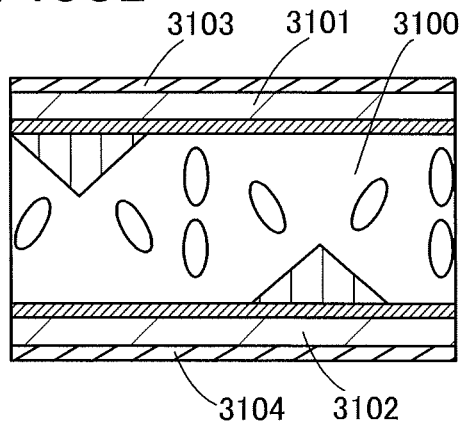

FIG. 19A1 FIG. 19A2
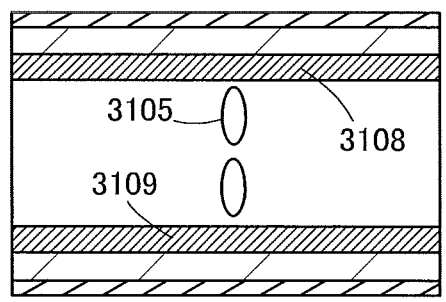
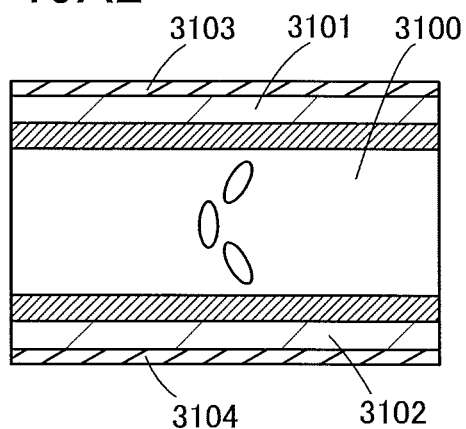
FIG. 19B1 FIG. 19B2
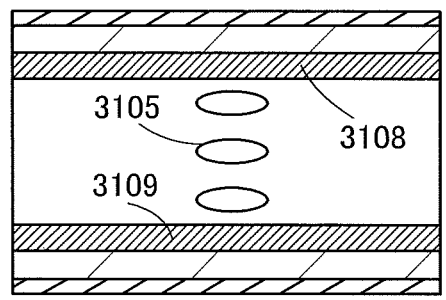
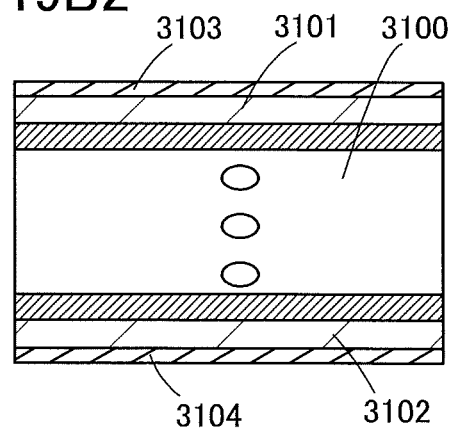

FIG. 20A1
FIG. 20A2
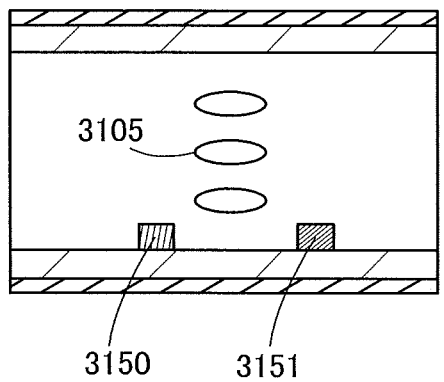
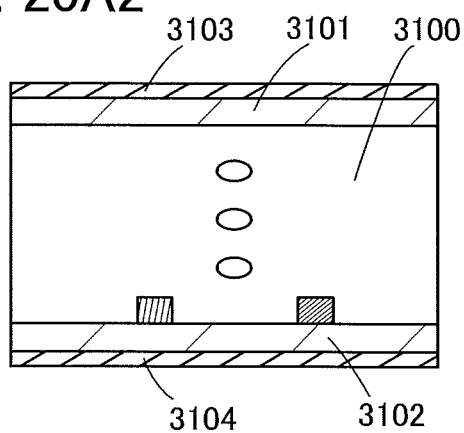
FIG. 20B1
FIG. 20B2
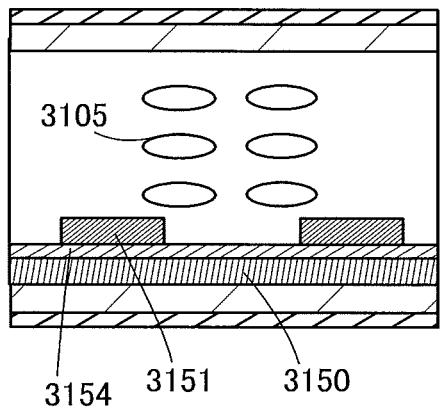
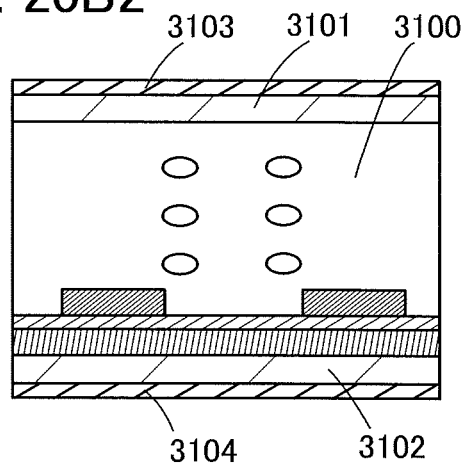

input voltage waveform output current waveform input voltage waveform output current waveform

SEMICONDUCTOR DEVICE AND METHOD FOR EVALUATING SEMICONDUCTOR DEVICE

BACKGROUND OF THE INVENTION

1. Field of the Invention

The present invention relates to an object, a method, a manufacturing method, a process, a machine, manufacture, or a composition of matter. In particular, the present invention relates to, for example, a semiconductor device, a display device, a liquid crystal display device, a light-emitting device, a driving method thereof, or a manufacturing method thereof. In particular, the present invention relates to, for example, a semiconductor device including a transistor, a display device including a transistor, a liquid crystal display device including a transistor, or a light-emitting device including a transistor, or a driving method thereof. Alternatively, the present invention relates to, for example, an electronic appliance including the semiconductor device, the display device, the liquid crystal display device, or the light-emitting device.

Note that in this specification, a semiconductor device refers to any device that can function by utilizing semiconductor characteristics, and an electro-optical device, a semiconductor circuit, an electronic appliance, and the like are all semiconductor devices.

2. Description of the Related Art

A technique for forming a transistor by using a semiconductor film formed over a substrate having an insulating surface has attracted attention. The transistor has been widely used for semiconductor devices such as integrated circuits and display devices. A silicon film is known as a semiconductor film applicable to a transistor.

As the silicon film used as a semiconductor film of a transistor, either an amorphous silicon film or a polycrystalline silicon film is used depending on the purpose. For example, in the case of a transistor included in a large display device, an amorphous silicon film, which can be formed using an established technique for forming a film over a large substrate, is preferably used. On the other hand, in the case of a transistor included in a high-performance display device where driver circuits are formed over the same substrate, a polycrystalline silicon film, which can form a transistor having high field-effect mobility, is preferably used. As a method for forming a polycrystalline silicon film, high-temperature heat treatment or laser light treatment which is performed on an amorphous silicon film has been known.

In recent years, an oxide semiconductor film has attracted attention. For example, a transistor which includes an amorphous oxide semiconductor film containing indium, gallium, and zinc and having a carrier density lower than $10^{18}/cm^3$ is disclosed (see Patent Document 1).

An oxide semiconductor film can be formed by a sputtering method or the like, and thus can be used for a channel formation region of a transistor in a large display device. A transistor including an oxide semiconductor film has high field-effect mobility; therefore, a high-performance display device where driver circuits are formed over the same substrate can be obtained. Moreover, there is an advantage that capital investment can be reduced because part of production equipment for a transistor including an amorphous silicon film can be retrofitted and utilized.

REFERENCE

Patent Document

[Patent Document 1] Japanese Published Patent Application No. 2006-165528

SUMMARY OF THE INVENTION

An object is to provide a semiconductor layer with a low density of trap states. Another object is to provide a transistor with stable electrical characteristics. Another object is to provide a transistor having high field-effect mobility. Another object is to provide a semiconductor device including the transistor.

An object is to provide a method for evaluating a semiconductor layer. Another object is to provide a method for evaluating a transistor. Another object is to provide a method for evaluating a semiconductor device.

Note that the descriptions of these objects do not disturb the existence of other objects. Note that in one embodiment of the present invention, there is no need to achieve all the objects. Other objects will be apparent from and can be derived from the description of the specification, the drawings, the claims, and the like.

One embodiment of the present invention is, for example, a semiconductor layer with a low defect density which can be used for a channel formation region of a transistor, a transistor including a semiconductor layer with a low defect density in a channel formation region, or a semiconductor device including the transistor.

A channel formation region is or includes, for example, a region which serves as a main current path when a voltage higher than or equal to the threshold voltage of a transistor is applied to a gate of the transistor.

A semiconductor layer with a low defect density is, for example, a semiconductor layer with a low density of trap states or a semiconductor layer with a low carrier density.

When a transistor includes a semiconductor layer with a high density of trap states in a channel formation region, for example, charges captured by the trap states cause fluctuations of electrical characteristics of the transistor. Thus, a transistor including a semiconductor layer with a high density of trap states in a channel formation region tends to have low reliability. Accordingly, it is possible to fabricate a transistor having stable electrical characteristics by using a semiconductor layer with a low density of trap states for a channel formation region of the transistor. Note that examples of fluctuations of electrical characteristics of a transistor include fluctuations of threshold voltage (Vth), an increase in sub-threshold swing value (S value), a decrease in on-state current (Ion), and an increase in off-state current (Ioff).

Fluctuations of electrical characteristics of a transistor often cause malfunction of a semiconductor device. Accordingly, it is possible to provide a highly reliable semiconductor device by using a transistor with stable electrical characteristics.

Evaluation of defect density in a semiconductor layer becomes more difficult as the defect density is decreased in most cases. In addition, there are few methods for measuring defects themselves in a semiconductor layer. One example of such methods is to measure the concentration of impurities that form defects in a semiconductor layer and evaluate the defect density in the semiconductor layer by the concentration of the impurities. However, with this method, accurate evaluation is possible only when all (or almost all) the impurities in the semiconductor layer form defects; thus, the measurement target is limited.

In view of this problem, one embodiment of the present invention is, for example, a method for evaluating defect density in a semiconductor layer, a method for evaluating defect density in a channel formation region of a transistor, a method for evaluating reliability of a transistor, or a method for evaluating reliability of a semiconductor device.

One embodiment of the present invention is, for example, a semiconductor device including an oxide semiconductor layer, a first electrode, and a second electrode. The oxide semiconductor layer includes a channel formation region of a transistor and is electrically connected to the first electrode and the second electrode. While a voltage is applied between the first electrode and the second electrode, the oxide semiconductor layer begins to be irradiated with light having a peak in a wavelength range of 340 nm to 360 nm and an intensity of 3 mW/cm$^2$ at a temperature of 25° C. at a time T0 and the irradiation is stopped at a time T1. A value of a current flowing between the first electrode and the second electrode at a time T2 is greater than or equal to 70% and less than 100% of a maximum value of a current flowing between the first electrode and the second electrode between the time T0 and the time T1. The time T2 is after a period of greater than or equal to 1 second and less than or equal to 15 seconds from the time T0 and before the time T1. A value of a current flowing between the first electrode and the second electrode at a time T3 is greater than or equal to 5% and less than 100% of the maximum value of the current flowing between the first electrode and the second electrode between the time T0 and the time T1. The time T3 is after a period of greater than or equal to 1 second and less than or equal to 15 seconds from the time T1.

The semiconductor device of one embodiment of the present invention includes, for example, an oxide layer that is in contact with the oxide semiconductor layer and has a lower electron affinity than an electron affinity of the oxide semiconductor layer.

The semiconductor device of one embodiment of the present invention includes, for example, an insulating film in contact with the oxide semiconductor layer and a third electrode overlapping with the oxide semiconductor layer with the insulating film positioned therebetween.

In the semiconductor device of one embodiment of the present invention, for example, the oxide semiconductor layer contains at least indium.

Another embodiment of the present invention is a method for evaluating a semiconductor device including an oxide semiconductor layer, a first electrode, and a second electrode. The oxide semiconductor layer includes a channel formation region of a transistor and is electrically connected to the first electrode and the second electrode. The method includes the steps of: beginning to irradiate the oxide semiconductor layer with light having an energy higher than an energy gap of the oxide semiconductor layer at a time T0 and stopping the irradiation at a time T1 while a voltage is applied between the first electrode and the second electrode; and evaluating a defect in the oxide semiconductor layer by comparing a value of a current flowing between the first electrode and the second electrode at a time T2 with a maximum value of a current flowing between the first electrode and the second electrode between the time T0 and the time T1 and comparing a value of a current flowing between the first electrode and the second electrode at a time T3 with the maximum value of the current flowing between the first electrode and the second electrode between the time T0 and the time T1. The time T2 is after a period of greater than or equal to 1 second and less than or equal to 15 seconds from the time T0 and before the time T1. The time T3 is after a period of greater than or equal to 1 second and less than or equal to 15 seconds from the time T1.

For example, the time T2 is five seconds after the time T0, and the time T3 is five seconds after the time T1.

For example, the time T1 is after a period of greater than or equal to 100 seconds and less than or equal to 300 seconds from the time T0.

Note that the above-described embodiments of the present invention are examples. For example, the semiconductor layer is not limited to the oxide semiconductor layer. For example, a silicon layer, an organic semiconductor layer, and other compound semiconductor layers (such as a gallium arsenide layer, a silicon carbide layer, and a gallium nitride layer) may be used instead of the oxide semiconductor layer.

According to one embodiment of the present invention, a semiconductor layer with a low density of trap states can be provided. Further, a transistor with stable electrical characteristics can be provided. Further, a transistor having high field-effect mobility can be provided. In addition, a semiconductor device including the transistor can be provided.

According to one embodiment of the present invention, a method for evaluating a semiconductor layer can be provided. Further, a method for evaluating a transistor can be provided. Further, a method for evaluating a semiconductor device can be provided.

BRIEF DESCRIPTION OF THE DRAWINGS

FIGS. 2A1, 2B1, 2C1, and 2D1 show band structures of a sample of one embodiment of the present invention and FIGS. 2A2, 2B2, 2C2, and 2D2 show photoresponse of the sample.

FIGS. 4A1, 4B1, 4C1, and 4D1 show band structures of a sample of one embodiment of the present invention and FIGS. 4A2, 4B2, 4C2, and 4D2 show photoresponse of the sample.

FIGS. 6A1, 6B1, 6C1, and 6D1 show band structures of a sample of one embodiment of the present invention and FIGS. 6A2, 6B2, 6C2, and 6D2 show photoresponse of the sample.

FIGS. 18A1, 18A2, 18B1, 18B2, 18C1, and 18C2 are cross-sectional views each illustrating an example of a pixel of a liquid crystal display device of one embodiment of the present invention.

FIGS. 19A1, 19A2, 19B1, and 19B2 are cross-sectional views each illustrating an example of a pixel of a liquid crystal display device of one embodiment of the present invention.

FIGS. 20A1, 20A2, 20B1, and 20B2 are cross-sectional views each illustrating an example of a pixel of a liquid crystal display device of one embodiment of the present invention.

DETAILED DESCRIPTION OF THE INVENTION

Figure 1A:
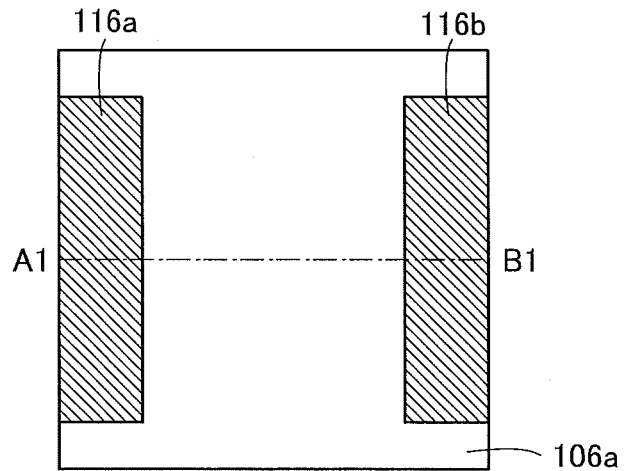
FIGS. 1A and 1B are a top view and a cross-sectional view of a sample of one embodiment of the present invention.

Embodiments will be hereinafter described with reference to the accompanying drawings. Note that the embodiments can be implemented with various modes, and it will be readily appreciated by those skilled in the art that modes and details can be changed in various ways without departing from the spirit and scope of the present invention. Therefore, the present invention is not construed as being limited to description of the embodiments. Note that in structures of the invention described below, the same portions or portions having similar functions are denoted by common reference numerals, and the descriptions thereof are not repeated.

Note that what is described (or part thereof) in one embodiment can be applied to, combined with, or exchanged with another content in the same embodiment and/or what is described (or part thereof) in another embodiment or other embodiments.

Note that in each embodiment, a content described in the embodiment is a content described with reference to a variety of diagrams or a content described with texts described in this specification.

In addition, by combining a diagram (or part thereof) described in one embodiment with another part of the diagram, a different diagram (or part thereof) described in the same embodiment, and/or a diagram (or part thereof) described in one or a plurality of different embodiments, much more diagrams can be formed.

Embodiments of the present invention will be described in detail with reference to the accompanying drawings. Note that the present invention is not limited to the description below, and it is easily understood by those skilled in the art that modes and details disclosed herein can be modified in various ways. Therefore, the present invention is not construed as being limited to description of the embodiments. In describing structures of the present invention with reference to the drawings, the same reference numerals are used in common for the same portions in different drawings. The same hatching pattern is applied to similar parts, and the similar parts are not especially denoted by reference numerals in some cases.

Note that the size, the thickness of a layer, or a region in diagrams is sometimes exaggerated for simplicity. Therefore, embodiments of the present invention are not limited to such scales.

Note that diagrams are schematic views of ideal examples, and shapes or values are not limited to those illustrated in the diagrams. For example, the following can be included: variation in shape due to a manufacturing technique or dimensional deviation; or variation in signal, voltage, or current due to noise or difference in timing.

Note that a voltage refers to a potential difference between a certain potential and a reference potential (e.g., a ground potential (GND) or a source potential) in many cases. Accordingly, a voltage can also be called a potential.

Further, even when the expression "to be electrically connected" is used in this specification, there is a case in which no physical connection is made and a wiring is just extended in an actual circuit.

Note that technical terms are used in order to describe a specific embodiment, example, or the like in many cases. One embodiment of the present invention should not be construed as being limited by the technical terms.

Terms which are not defined in this specification (including terms used for science and technology, such as technical terms or academic teens) can be used as the terms having meaning equal to general meaning that an ordinary person skilled in the art understands. It is preferable that terms defined by dictionaries or the like be construed to have meanings consistent with the background of related art.

Note that the ordinal numbers such as "first" and "second" in this specification are used for convenience and do not denote the order of steps or the stacking order of layers. In addition, the ordinal numbers in this specification do not denote particular names which specify the present invention.

Note that a content which is not specified in any drawing or text in the specification can be excluded from the invention. When the number range of values indicated by e.g., the maximum value and the minimum value is described, the range may be freely narrowed or a value in the range may be excluded, so that the invention can be specified by a range resulting from exclusion of part of the range. In this manner, it is possible to specify the technical scope of the present invention so that a conventional technology is excluded, for example.

Specifically, for example, a diagram of a circuit including first to fifth transistors is described. In that case, it can be specified that the circuit does not include a sixth transistor in the invention. It can be specified that the circuit does not include a capacitor in the invention. It can be specified that the circuit does not include a sixth transistor with a particular connection structure in the invention. It can be specified that the circuit does not include a capacitor with a particular connection structure in the invention. For example, it can be specified that a sixth transistor whose gate is connected to a gate of the third transistor is not included in the invention. For example, it can be specified that a capacitor whose first electrode is connected to the gate of the third transistor is not included in the invention.

As another specific example, a description of a value, "a voltage is preferably higher than or equal to 3 V and lower than or equal to 10 V" is given. In that case, for example, it can be specified that the case where the voltage is higher than or equal to −2 V and lower than or equal to 1 V is excluded from the invention. For example, it can be specified that the case where the voltage is higher than or equal to 13 V is excluded from the invention. Note that, for example, it can be specified that the voltage is higher than or equal to 5 V and lower than or equal to 8 V in the invention. Note that, for example, it can be specified that the voltage is approximately 9 V in the invention. Note that, for example, it can be specified that the voltage is higher than or equal to 3 V and lower than or equal to 10 V but is not 9 V in the invention.

As another specific example, a description of a value, "a voltage is preferably 10 V" is given. In that case, for example, it can be specified that the case where the voltage is higher than or equal to −2 V and lower than or equal to 1 V is excluded from the invention. For example, it can be specified that the case where the voltage is higher than or equal to 13 V is excluded from the invention.

As another specific example, a description of a property of a material, "a film is an insulating film", is given. In that case, for example, it can be specified that the case where the insulating film is an organic insulating film is excluded from the invention. For example, it can be specified that the case where the insulating film is an inorganic insulating film is excluded from the invention.

As another specific example, a description of a stacked structure, "a film is provided between A and B" is given. In that case, for example, it can be specified that the case where the film is a stacked film of four or more layers is excluded from the invention. For example, it can be specified that the case where a conductive film is provided between A and the film is excluded from the invention.

<1. Oxide Semiconductor Layer>

A structure of an oxide semiconductor layer which can be used for a channel formation region of a transistor will be described below. In particular, an oxide semiconductor layer with a low density of trap states will be described. Also described is a method for evaluating trap states in the oxide semiconductor layer on the basis of a change in the conductivity of the oxide semiconductor layer that is caused by light (also referred to as photoresponse).

An oxide semiconductor layer is described below. Note that one embodiment of the present invention is not limited to the oxide semiconductor layer. For example, a silicon layer, an organic semiconductor layer, and other compound semiconductor layers (such as a gallium arsenide layer, a silicon carbide layer, and a gallium nitride layer) may be used instead of the oxide semiconductor layer.

An oxide semiconductor layer used for a channel formation region of a transistor is preferably, for example, an oxide semiconductor layer with a low defect density. For example, a defect in an oxide semiconductor layer may be formed by plasma that is used for etching by a dry etching method or the like or plasma that is used for deposition by a chemical vapor deposition (CVD) method or the like. Alternatively, a defect in an oxide semiconductor may be formed by collision of sputtered particles during deposition by a sputtering method, for example.

An oxide semiconductor layer with a low defect density is, for example, an oxide semiconductor layer with a low density of trap states or an oxide semiconductor layer with a low carrier density. Examples of a defect in an oxide semiconductor layer include a defect due to an oxygen vacancy and a defect caused by entry of an impurity element (e.g., hydrogen or silicon). It is often difficult to identify which defect in the oxide semiconductor layer serves as a trap state, a donor, or an acceptor. In any case, defects can cause fluctuations of electrical characteristics of a transistor; therefore, it is important to remove factors of defect formation as much as possible.

For example, when a transistor includes an oxide semiconductor layer with a high density of trap states in a channel formation region, charges captured by the trap states cause fluctuations of electrical characteristics of the transistor in some cases. Thus, a transistor including an oxide semiconductor layer with a high density of trap states in a channel formation region tends to have low reliability. Accordingly, it is preferable to use an oxide semiconductor layer with a low density of trap states for a channel formation region of a transistor.

<1-1. Evaluation of Trap States in Oxide Semiconductor Layer>

The effect on photoresponse of the density of trap states in an oxide semiconductor layer will be described.

<1-1-1. Model A>

Model A is described with reference to FIGS. 1A to 1C. FIG. 1A is a top view of a sample which serves as Model A (hereinafter called Sample A). Note that an insulating film 112, an insulating film 118, and the like are not illustrated in FIG. 1A for easy understanding.

Figure 1B:
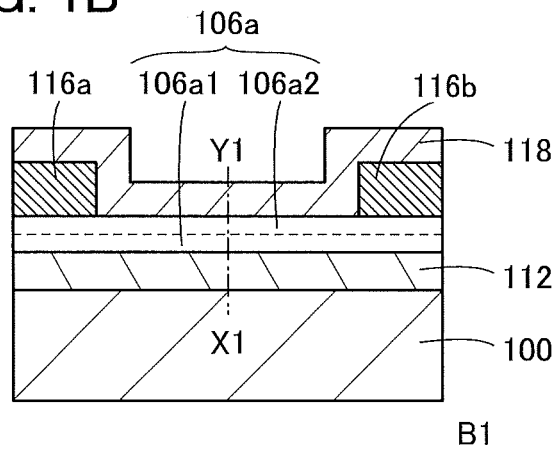

FIG. 1B is a cross-sectional view of Sample A taken along dashed-dotted line A1-B1 in FIG. 1A.

FIG. 1B is a cross-sectional view of Sample A including a substrate 100; the insulating film 112 provided over the substrate 100; a multilayer film 106a including an oxide semiconductor layer 106a1 provided over the insulating film 112 and an oxide semiconductor layer 106a2 provided over the oxide semiconductor layer 106a1; an electrode 116a and an electrode 116b provided over and in contact with the multilayer film 106a; and the insulating film 118 provided over the multilayer film 106a, the electrode 116a, and the electrode 116b.

Figure 1C:
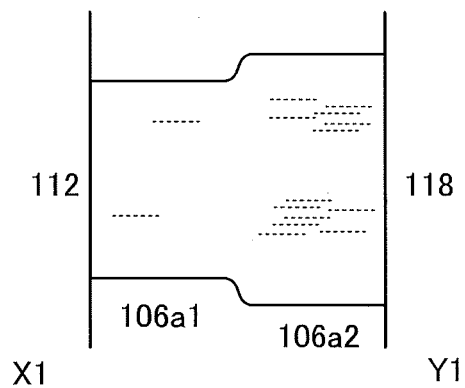
FIG. 1C shows a band structure of the sample.

FIG. 1C shows a band structure which corresponds to a cross section of Sample A taken along dashed-dotted line X1-Y1 in FIG. 1B. Note that the dotted lines in the oxide semiconductor layer 106a1 and the oxide semiconductor layer 106a2 in FIG. 1C indicate trap states.

The oxide semiconductor layer 106a1 in Sample A is an oxide semiconductor layer having higher electron affinity than that of the oxide semiconductor layer 106a2. For example, as the oxide semiconductor layer 106a1, an oxide semiconductor layer having higher electron affinity than that of the oxide semiconductor layer 106a2 by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that the electron affinity refers to an energy gap between the vacuum level and the bottom of the conduction band.

As each of the oxide semiconductor layer 106a1 and the oxide semiconductor layer 106a2, an oxide semiconductor layer having a large energy gap is used. For example, the energy gap of the oxide semiconductor layer 106a1 is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV. Further, for example, the energy gap of the oxide semiconductor layer 106a2 is greater than or equal to 2.7 eV and less than or equal to 4.9 eV, preferably greater than or equal to 3 eV and less than or equal to 4.7 eV, more preferably greater than or equal to 3.2 eV and less than or equal to 4.4 eV. Note that as the oxide semiconductor layer 106a2, an oxide semiconductor layer having a larger energy gap than that of the oxide semiconductor layer 106a1 is used.

An oxide semiconductor layer with a low carrier density is used as each of the oxide semiconductor layer 106a1 and the oxide semiconductor layer 106a2. For example, an oxide semiconductor layer whose carrier density is lower than or equal to $1\times10^{17}/cm^3$, preferably lower than or equal to $1\times10^{15}/cm^3$, more preferably lower than or equal to $1\times10^{13}/cm^3$, still more preferably lower than or equal to $1\times10^{11}/cm^3$ is used as the oxide semiconductor layer 106a1. For example, an oxide semiconductor layer whose carrier density is lower than or equal to $1\times10^{15}/cm^3$, preferably lower than or equal to $1\times10^{13}/cm^3$, more preferably lower than or equal to $1\times10^{11}/cm^3$, still more preferably lower than or equal to $1\times10^{9}/cm^3$ is used as the oxide semiconductor layer 106a2.

The oxide semiconductor layer 106a1 contains at least indium. In addition to indium, an element M (aluminum, titanium, silicon, gallium, germanium, yttrium, zirconium, tin, lanthanum, cerium, or hafnium) is preferably contained.

The oxide semiconductor layer 106a2 contains one or more elements other than oxygen contained in the oxide semiconductor layer 106a1. Note that the oxide semiconductor layer 106a1 preferably contains at least indium in order that the carrier mobility (electron mobility) is high. Since the oxide semiconductor layer 106a2 contains one or more elements other than oxygen contained in the oxide semiconductor layer 106a1, interface scattering is unlikely to occur at the interface between the oxide semiconductor layer 106a1 and the oxide semiconductor layer 106a2. Thus, the transistor can have high field-effect mobility because the movement of carriers is not inhibited at the interface.

The oxide semiconductor layer 106a2 may contain, for example, aluminum, titanium, silicon, gallium, germanium, yttrium, zirconium, tin, lanthanum, cerium, or hafnium at a proportion higher than that of indium. Specifically, the amount of any of the above elements in the oxide semiconductor layer 106a2 in an atomic ratio is 1.5 times or more, preferably 2 times or more, more preferably 3 times or more as much as that of indium in an atomic ratio. The above elements increase the energy gap of the oxide semiconductor layer in some cases. When any of the above elements is contained in the oxide semiconductor layer at a high proportion, it decreases the electron affinity of the oxide semiconductor layer in some cases. The oxide semiconductor layer 106a2 contains any of the above elements at a higher proportion than the oxide semiconductor layer 106a1.

In the case of using an In-M-Zn oxide (an element M is aluminum, titanium, silicon, gallium, germanium, yttrium, zirconium, tin, lanthanum, cerium, or hafnium) as the oxide semiconductor layer 106a1, the atomic ratio of In to M is preferably as follows: the percentage of In is higher than or equal to 25 atomic % and the percentage of M is lower than 75 atomic %; further preferably, the percentage of In is higher than or equal to 34 atomic % and the percentage of M is lower than 66 atomic %. In the case of using an In-M-Zn oxide as the oxide semiconductor layer 106a2, the atomic ratio of In to M is preferably as follows: the percentage of In is lower than 50 atomic % and the percentage of M is higher than or equal to 50 atomic %; further preferably, the percentage of In is lower than 25 atomic % and the percentage of M is higher than or equal to 75 atomic %.

The thickness of the oxide semiconductor layer 106a2 is greater than or equal to 3 nm and less than or equal to 100 nm, preferably greater than or equal to 3 nm and less than or equal to 50 nm. The thickness of the oxide semiconductor layer 106a1 is greater than or equal to 3 nm and less than or equal to 200 nm, preferably greater than or equal to 3 nm and less than or equal to 100 μm, more preferably greater than or equal to 3 nm and less than or equal to 50 nm.

In Sample A, owing to the formation of the insulating film 118, there is a region where the oxide semiconductor layer 106a2 has a higher density of trap states than that of the oxide semiconductor layer 106a1. In other words, there is a region where the oxide semiconductor layer 106a1 has a lower density of trap states than that of the oxide semiconductor layer 106a2.

Next, description is given with reference to FIGS. 2A1, 2A2, 2B1, 2B2, 2C1, 2C2, 2D1, and 2D2 on changes in current value of Sample A in FIGS. 1A to 1C in the following case: while voltage is applied between the electrode 116a and the electrode 116b, the multilayer film 106a is irradiated with light and then light irradiation is stopped. Note that FIGS. 2A1, 2B1, 2C1, and 2D1 are models corresponding to the band structure in FIG. 1C. FIG. 2A2, FIG. 2B2, FIG. 2C2, and FIG. 2D2 show changes in the value of current flowing between the electrode 116a and the electrode 116b in the models of FIG. 2A1, FIG. 2B1, FIG. 2C1, and FIG. 2D1, respectively. The current value is divided by the maximum current value to be normalized. The energy of the light (denoted by "light" in the drawings) with which the multilayer film 106a is irradiated is higher than the energy gaps of both the oxide semiconductor layer 106a1 and the oxide semiconductor layer 106a2.

First, voltage is applied between the electrode 116a and the electrode 116b of Sample A without the multilayer film 106a being irradiated with light. In this case, current hardly flows between the electrode 116a and the electrode 116b because the oxide semiconductor layer 106a1 and the oxide semiconductor layer 106a2 each have a sufficiently low carrier density.

Next, upon irradiation of the multilayer film 106a at a time T0, in the oxide semiconductor layer 106a1 and the oxide semiconductor layer 106a2, electrons (denoted by "electron" in the drawings) in the valence band are excited to the conduction band and holes (denoted by "hole" in the drawings) are generated in the valence band; thus, current begins to flow between the electrode 116a and the electrode 116b (see FIGS. 2A1 and 2A2).

Then, the excited electrons move from the oxide semiconductor layer 106a2 to the oxide semiconductor layer 106a1, so that the electron density in the oxide semiconductor layer 106a1 is increased. The generated electrons move rapidly because there is no barrier between the oxide semiconductor layer 106a2 and the oxide semiconductor layer 106a1. Here, since the oxide semiconductor layer 106a1 includes a region with a low density of trap states, movement of electrons is hardly inhibited; thus, Sample A has high conductivity. Accordingly, a large amount of current rapidly flows between the electrode 116a and the electrode 116b when the multilayer film 106a is irradiated with light. Meanwhile, the generated holes are partly captured by the trap states in the multilayer film 106a. When recombination of electrons and holes (e.g., band-to-band recombination, band-to-state recombination, or state-to-state recombination) comes in balance with the generation of electrons and holes due to light, the increase in current value stops. Thus, when light irradiation is continued, the value of current flowing between the electrode 116a and the electrode 116b is brought close to a certain value (see FIGS. 2B1 and 2B2).

Note that in this embodiment, the measurement temperature is room temperature; however, the measurement temperature is not limited thereto and may be, for example, a temperature within the range of −40° C. to 150° C.

Further, in this embodiment, the energy of the irradiation light is higher than the energy gaps of both the oxide semiconductor layer 106a1 and the oxide semiconductor layer 106a2; however, the energy of the irradiation light may be lower than the energy gaps of both the oxide semiconductor layer 106a1 and the oxide semiconductor layer 106a2. For example, light having a peak in a wavelength range from 440 nm to 460 nm or light having a peak in a wavelength range from 540 nm to 560 nm may be used for irradiation.

Further, in this embodiment, the irradiation light has an intensity of 3 mW/cm$^2$; however, the irradiation light may have a different intensity. For example, light with an intensity within the range of 0.03 mW/cm$^2$ to 300 mW/cm$^2$, preferably an intensity of 0.3 mW/cm$^2$ or 30 mW/cm$^2$ may be used for irradiation.

Next, light irradiation is stopped at a time T1, so that generation of electrons and holes stops. Further, electrons and holes are recombined, so that the number of electrons and holes is reduced. The reduction in the number of electrons and holes proceeds rapidly in a first step, and proceeds slowly in a second step. In the first step, for example, band-to-band recombination in the oxide semiconductor layer 106a1, band-to-state recombination in the oxide semiconductor layer 106a1, or state-to-state recombination in the oxide semiconductor layer 106a1 and the oxide semiconductor layer 106a2 occurs. First, the electron density is decreased to some extent in the first step; thus, the amount of current flowing between the electrode 116a and the electrode 116b is decreased (see FIGS. 2C1 and 2C2).

Then, the number of electrons and holes is reduced in the second step. In the second step, for example, state-to-state recombination in the oxide semiconductor layer 106a2 occurs. Since the oxide semiconductor layer 106a2 includes a region with a high density of trap states, holes are captured by the trap states. Further, in Sample A, the oxide semiconductor layer 106a1 has a high electron density in the conduction band. For recombination of holes at the trap states in the oxide semiconductor layer 106a2 and electrons in the oxide semiconductor layer 106a1, the electrons should move from the conduction band in the oxide semiconductor layer 106a1 to the conduction band in the oxide semiconductor layer 106a2. Since the energy of the bottom of the conduction band in the oxide semiconductor layer 106a2 is higher than that in the oxide semiconductor layer 106a1, it takes time for the electrons to move. Accordingly, the second step proceeds slowly. The electron density is decreased gradually, so that the amount of current flowing between the electrode 116a and the electrode 116b is decreased gradually (see FIGS. 2D1 and 2D2).

For example, the multilayer film 106a begins to be irradiated with light having an energy higher than the energy gaps of both the oxide semiconductor layer 106a1 and the oxide semiconductor layer 106a2 (e.g., light having a peak in a wavelength range of 340 nm to 360 nm) and an intensity of 3 mW/cm$^2$ at room temperature (about 20° C. to 25° C.) at a time T0 and the irradiation is stopped at a time T1. The value of current flowing between the electrode 116a and the electrode 116b at a time T2 is greater than or equal to 70% and less than 100%, preferably greater than or equal to 80% and less than 100%, further preferably greater than or equal to 90% and less than 100% of the maximum value of current flowing between the electrode 116a and the electrode 116b between the time T0 and the time T1. The time T2 is after a period of greater than or equal to 1 second and less than or equal to 15 seconds from the time T0 and before the time T1. The value of current flowing between the electrode 116a and the electrode 116b at a time T3 is greater than or equal to 5% and less than 100%, preferably greater than or equal to 10% and less than 100%, further preferably greater than or equal to 15% and less than 100% of the maximum value of the current flowing between the electrode 116a and the electrode 116b between the time T0 and the time T1. The time T3 is after a period of greater than or equal to 1 second and less than or equal to 15 seconds from the time T1.

As described above, when the multilayer film 106a is used for a transistor, the oxide semiconductor layer 106a1 with a high electron affinity serves as a channel formation region of the transistor. Since the oxide semiconductor layer 106a1 includes a region with a low density of trap states, the transistor can have stable electrical characteristics.

<1-1-2. Model B>

Figure 3A:
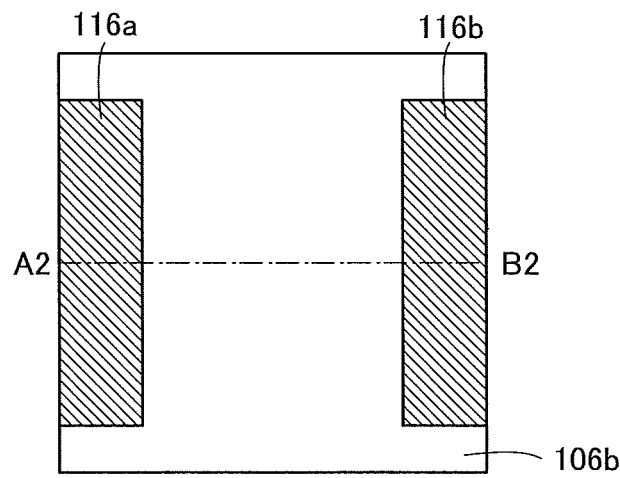
FIGS. 3A and 3B are a top view and a cross-sectional view of a sample of one embodiment of the present invention.

Model B is described with reference to FIGS. 3A to 3C. FIG. 3A is a top view of a sample which serves as Model B (hereinafter called Sample B). Note that the insulating film 112, the insulating film 118, and the like are not illustrated in FIG. 3A for easy understanding.

Figure 3B:
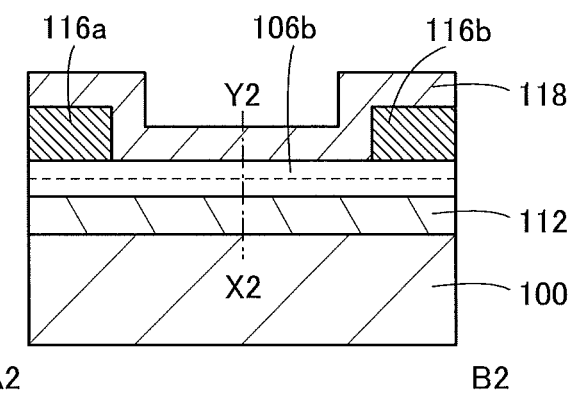

FIG. 3B is a cross-sectional view of Sample B taken along dashed-dotted line A2-B2 in FIG. 3A.

FIG. 3B is a cross-sectional view of Sample B including the substrate 100; the insulating film 112 provided over the substrate 100; an oxide semiconductor layer 106b provided over the insulating film 112; the electrode 116a and the electrode 116b provided over and in contact with the oxide semiconductor layer 106b; and the insulating film 118 provided over the oxide semiconductor layer 106b, the electrode 116a, and the electrode 116b.

Figure 3C:
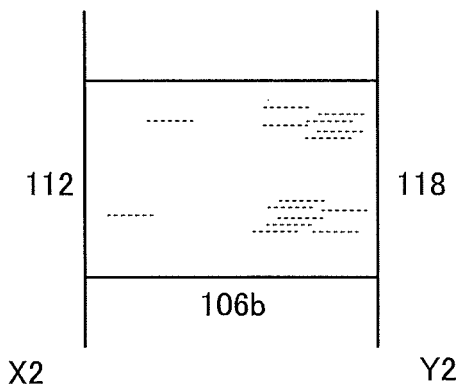
FIG. 3C shows a band structure of the sample.

FIG. 3C shows a band structure which corresponds to a cross section of Sample B taken along dashed-dotted line X2-Y2 in FIG. 3B. Note that the dotted lines in the oxide semiconductor layer 106*b* in FIG. 3C indicate trap states.

An oxide semiconductor layer with a wide energy gap is used as the oxide semiconductor layer 106*b*. For example, the energy gap of the oxide semiconductor layer 106*b* is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

An oxide semiconductor layer with a low carrier density is used as the oxide semiconductor layer 106*b*. For example, an oxide semiconductor layer whose carrier density is lower than or equal to $1\times10^{17}/cm^3$, preferably lower than or equal to $1\times10^{15}/cm^3$, more preferably lower than or equal to $1\times10^{13}/cm^3$, still more preferably lower than or equal to $1\times10^{11}/cm^3$ is used as the oxide semiconductor layer 106*b*.

The oxide semiconductor layer 106*b* contains at least indium. In addition to indium, an element M (aluminum, titanium, silicon, gallium, germanium, yttrium, zirconium, tin, lanthanum, cerium, or hafnium) is preferably contained.

In the case of using an In-M-Zn oxide (an element M is aluminum, titanium, silicon, gallium, germanium, yttrium, zirconium, tin, lanthanum, cerium, or hafnium) as the oxide semiconductor layer 106*b*, the atomic ratio of In to M is preferably as follows: the percentage of In is higher than or equal to 25 atomic % and the percentage of M is lower than 75 atomic %; further preferably, the percentage of In is higher than or equal to 34 atomic % and the percentage of M is lower than 66 atomic %.

The thickness of the oxide semiconductor layer 106*b* is greater than or equal to 3 nm and less than or equal to 200 nm, preferably greater than or equal to 5 nm and less than or equal to 70 nm, more preferably greater than or equal to 10 nm and less than or equal to 50 nm.

In Sample B, owing to the formation of the insulating film 118, there is a region with a high density of trap states on the insulating film 118 side of the oxide semiconductor layer 106*b*. In other words, the oxide semiconductor layer 106*b* includes a region with a low density of trap states on the insulating film 112 side.

Next, description is given with reference to FIGS. 4A1, 4A2, 4B1, 4B2, 4C1, 4C2, 4D1, and 4D2 on changes in current value of Sample B in FIGS. 3A to 3C in the following case: while voltage is applied between the electrode 116*a* and the electrode 116*b*, the oxide semiconductor layer 106*b* is irradiated with light and then light irradiation is stopped. Note that FIGS. 4A1, 4B1, 4C1, and 4D1 are models corresponding to the band structure in FIG. 3C. FIG. 4A2, FIG. 4B2, FIG. 4C2, and FIG. 4D2 show changes in the value of current flowing between the electrode 116*a* and the electrode 116*b* in the models of FIG. 4A1, FIG. 4B1, FIG. 4C1, and FIG. 4D1, respectively. The current value is divided by the maximum current value to be normalized. The energy of the light (denoted by "light" in the drawings) with which the oxide semiconductor layer 106*b* is irradiated is higher than the energy gap of the oxide semiconductor layer 106*b*.

First, voltage is applied between the electrode 116*a* and the electrode 116*b* of Sample B without the oxide semiconductor layer 106*b* being irradiated with light. In this case, current hardly flows between the electrode 116*a* and the electrode 116*b* because the oxide semiconductor layer 106*b* has a sufficiently low carrier density.

Next, upon irradiation of the oxide semiconductor layer 106*b* at a time T0, in the oxide semiconductor layer 106*b*, electrons (denoted by "electron" in the drawings) in the valence band are excited to the conduction band and holes (denoted by "hole" in the drawings) are generated in the valence band; thus, current begins to flow between the electrode 116*a* and the electrode 116*b*. For several milliseconds to several tens of milliseconds after irradiation of the oxide semiconductor layer 106*b*, generation of electrons and holes by band-to-band transition mainly occurs (see FIGS. 4A1 and 4A2).

Then, the generated electrons are dispersed in the oxide semiconductor layer 106*b*. Recombination of electrons and holes frequently occurs in the region with a high density of trap states in the oxide semiconductor layer 106*b*, so that the electron density in the oxide semiconductor layer 106*b* is decreased. Further, since the oxide semiconductor layer 106*b* has a high density of trap states, movement of electrons is likely to be inhibited; thus, the conductivity of Sample B is lower than that of Sample A. Accordingly, the value of current flowing between the electrode 116*a* and the electrode 116*b* upon irradiation of the oxide semiconductor layer 106*b* is small. In a period between several milliseconds to several tens of milliseconds after irradiation of the oxide semiconductor layer 106*b* and several seconds to several minutes after irradiation of the oxide semiconductor layer 106*b*, electrons captured by trap states are excited to the conduction band, so that the electron density in the conduction band is increased. This is presumably because the excitation of the electrons captured by trap states proceeds more slowly than band-to-band transition. Thus, upon irradiation of the oxide semiconductor layer 106*b*, the current value is gradually increased instead of being rapidly increased (see FIGS. 4B1 and 4B2).

Next, light irradiation is stopped at a time T1, so that generation of electrons and holes stops. Further, electrons and holes are recombined, so that the number of electrons and holes is reduced. The reduction in the number of electrons and holes in Sample B proceeds rapidly. The reduction in the number of electrons and holes in Sample B is attributed to, for example, band-to-band recombination, band-to-state recombination, or state-to-state recombination in the oxide semiconductor layer 106*b*. In Sample B, since the oxide semiconductor layer 106*b* includes a region with a high density of trap states, almost all the electrons and holes are recombined by state-to-state recombination or the like in the region and disappear, so that the amount of current flowing between the electrode 116*a* and the electrode 116*b* is rapidly decreased. Further, electrons captured by trap states are recombined immediately if they are excited to the conduction band; thus, the electron density in the conduction band becomes extremely low (see FIGS. 4C1 and 4C2).

Next, a small number of electrons and holes that remain are recombined and disappear, so that the amount of current flowing between the electrode 116*a* and the electrode 116*b* is further decreased (see FIGS. 4D1 and 4D2).

For example, the oxide semiconductor layer 106*b* begins to be irradiated with light having an energy higher than the energy gap of the oxide semiconductor layer 106*b* (e.g., light having a peak in a wavelength range of 340 nm to 360 nm) and an intensity of 3 mW/cm² at room temperature (about 20° C. to 25° C.) at a time T0 and the irradiation is stopped at a time T1. The value of current flowing between the electrode 116*a* and the electrode 116*b* at a time T2 is greater than or equal to 30% and less than 100%, preferably greater than or equal to 40% and less than 100%, further preferably greater than or equal to 50% and less than 100% of the maximum value of current flowing between the electrode 116*a* and the electrode 116*b* between the time T0 and the time T1. The time T2 is after a period of greater than or equal to 1 second and less than or equal to 15 seconds from the time T0 and before the time T1. The value of current flowing between the electrode 116a and the electrode 116b at a time T3 is greater than or equal to 1% and less than 100%, preferably greater than or equal to 2% and less than 100%, further preferably greater than or equal to 5% and less than 100% of the maximum value of the current flowing between the electrode 116a and the electrode 116b between the time T0 and the time T1. The time T3 is after a period of greater than or equal to 1 second and less than or equal to 15 seconds from the time T1.

As described above, when the oxide semiconductor layer 106b is used for a transistor, the switching characteristics of the transistor are likely to be degraded because the oxide semiconductor layer 106b includes a region with a high density of trap states. Therefore, in the case where a single oxide semiconductor layer, like the oxide semiconductor layer 106b, is used for a channel formation region of a transistor, treatment for decreasing the density of trap states caused owing to the insulating film 118 or the like is preferably performed.

The use of an oxide semiconductor layer with a low density of trap states makes it possible to provide a transistor with stable electrical characteristics.

<1-1-3. Model C>

Model C is described with reference to FIGS. 5A to 5C.

Figure 5A:
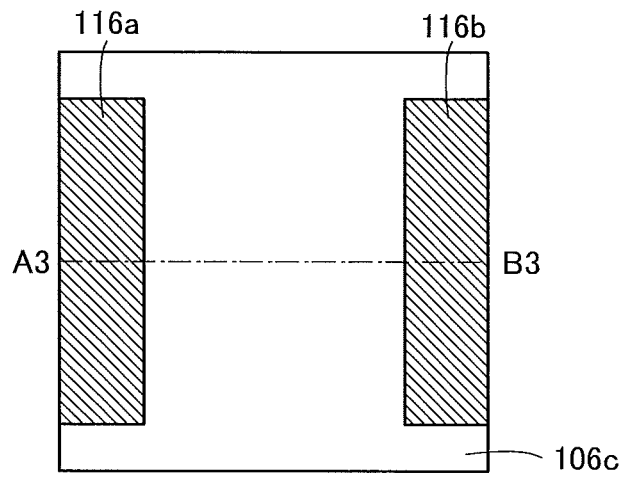
FIGS. 5A and 5B are a top view and a cross-sectional view of a sample of one embodiment of the present invention.

FIG. 5A is a top view of a sample which serves as Model C (hereinafter called Sample C). Note that the insulating film 112, the insulating film 118, and the like are not illustrated in FIG. 5A for easy understanding.

Figure 5B:
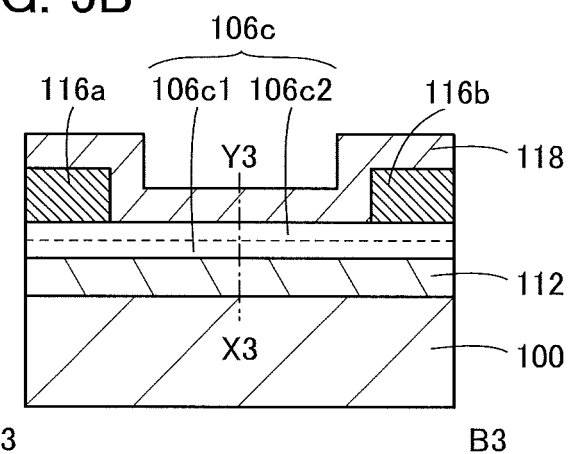

FIG. 5B is a cross-sectional view of Sample C taken along dashed-dotted line A3-B3 in FIG. 5A.

FIG. 5B is a cross-sectional view of Sample C including the substrate 100; the insulating film 112 provided over the substrate 100; a multilayer film 106c including an oxide semiconductor layer 106c1 provided over the insulating film 112 and an oxide semiconductor layer 106c2 provided over the oxide semiconductor layer 106c1; the electrode 116a and the electrode 116b provided over and in contact with the multilayer film 106c; and the insulating film 118 provided over the multilayer film 106c, the electrode 116a, and the electrode 116b.

Figure 5C:
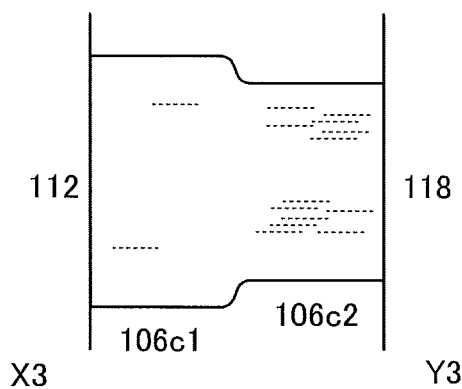
FIG. 5C shows a band structure of the sample.

FIG. 5C shows a band structure which corresponds to a cross section of Sample C taken along dashed-dotted line X3-Y3 in FIG. 5B. Note that the dotted lines in the oxide semiconductor layer 106c2 and the oxide semiconductor layer 106c1 in FIG. 5C indicate trap states.

The oxide semiconductor layer 106c2 in Sample C is an oxide semiconductor layer having higher electron affinity than that of the oxide semiconductor layer 106c1. For example, as the oxide semiconductor layer 106c2, an oxide semiconductor layer having higher electron affinity than that of the oxide semiconductor layer 106c1 by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that the electron affinity refers to an energy gap between the vacuum level and the bottom of the conduction band.

As each of the oxide semiconductor layer 106c2 and the oxide semiconductor layer 106c1, an oxide semiconductor layer having a large energy gap is used. For example, the energy gap of the oxide semiconductor layer 106c2 is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV. Further, for example, the energy gap of the oxide semiconductor layer 106c1 is greater than or equal to 2.7 eV and less than or equal to 4.9 eV, preferably greater than or equal to 3 eV and less than or equal to 4.7 eV, more preferably greater than or equal to 3.2 eV and less than or equal to 4.4 eV. Note that as the oxide semiconductor layer 106c1, an oxide semiconductor layer having a larger energy gap than that of the oxide semiconductor layer 106c2 is used.

An oxide semiconductor layer with a low carrier density is used as each of the oxide semiconductor layer 106c2 and the oxide semiconductor layer 106c1. For example, an oxide semiconductor layer whose carrier density is lower than or equal to $1\times10^{17}/cm^3$, preferably lower than or equal to $1\times10^{15}/cm^3$, more preferably lower than or equal to $1\times10^{13}/cm^3$, still more preferably lower than or equal to $1\times10^{11}/cm^3$ is used as the oxide semiconductor layer 106c2. For example, an oxide semiconductor layer whose carrier density is lower than or equal to $1\times10^{15}/cm^3$, preferably lower than or equal to $1\times10^{13}/cm^3$, more preferably lower than or equal to $1\times10^{11}/cm^3$, still more preferably lower than or equal to $1\times10^{9}/cm^3$ is used as the oxide semiconductor layer 106c1.

The oxide semiconductor layer 106c2 contains at least indium. In addition to indium, an element M (aluminum, titanium, silicon, gallium, germanium, yttrium, zirconium, tin, lanthanum, cerium, or hafnium) is preferably contained.

The oxide semiconductor layer 106c1 contains one or more elements other than oxygen contained in the oxide semiconductor layer 106c2. Note that the oxide semiconductor layer 106c2 preferably contains at least indium in order that the carrier mobility (electron mobility) is high. Since the oxide semiconductor layer 106c1 contains one or more elements other than oxygen contained in the oxide semiconductor layer 106c2, interface scattering is unlikely to occur at the interface between the oxide semiconductor layer 106c2 and the oxide semiconductor layer 106c1. Thus, the transistor can have high field-effect mobility because the movement of carriers is not inhibited at the interface.

The oxide semiconductor layer 106c1 may contain, for example, aluminum, titanium, silicon, gallium, germanium, yttrium, zirconium, tin, lanthanum, cerium, or hafnium at a proportion higher than that of indium. Specifically, the amount of any of the above elements in the oxide semiconductor layer 106c1 in an atomic ratio is 1.5 times or more, preferably 2 times or more, more preferably 3 times or more as much as that of indium in an atomic ratio. The above elements increase the energy gap of the oxide semiconductor layer in some cases. When any of the above elements is contained in the oxide semiconductor layer at a high proportion, it decreases the electron affinity of the oxide semiconductor layer in some cases. The oxide semiconductor layer 106c1 contains any of the above elements at a higher proportion than the oxide semiconductor layer 106c2.

In the case of using an In-M-Zn oxide (an element M is aluminum, titanium, silicon, gallium, germanium, yttrium, zirconium, tin, lanthanum, cerium, or hafnium) as the oxide semiconductor layer 106c2, the atomic ratio of In to M is preferably as follows: the percentage of In is higher than or equal to 25 atomic % and the percentage of M is lower than 75 atomic %; further preferably, the percentage of In is higher than or equal to 34 atomic % and the percentage of M is lower than 66 atomic %. In the case of using an In-M-Zn oxide as the oxide semiconductor layer 106c1, the atomic ratio of In to M is preferably as follows: the percentage of In is lower than 50 atomic % and the percentage of M is higher than or equal to 50 atomic %; further preferably, the percentage of In is lower than 25 atomic % and the percentage of M is higher than or equal to 75 atomic %.

The thickness of the oxide semiconductor layer 106c1 is greater than or equal to 3 nm and less than or equal to 100 nm, preferably greater than or equal to 3 nm and less than or equal to 50 nm. The thickness of the oxide semiconductor layer 106c2 is greater than or equal to 3 nm and less than or equal to 200 nm, preferably greater than or equal to 3 nm and less than or equal to 100 nm, more preferably greater than or equal to 3 nm and less than or equal to 50 nm.

In Sample C, owing to the formation of the insulating film 118, there is a region where the oxide semiconductor layer 106c2 has a higher density of trap states than that of the oxide semiconductor layer 106c1. In other words, there is a region where the oxide semiconductor layer 106c1 has a lower density of trap states than that of the oxide semiconductor layer 106c2.

Next, description is given with reference to FIGS. 6A1, 6A2, 6B1, 6B2, 6C1, 6C2, 6D1, and 6D2 on changes in current value of Sample C in FIGS. 5A to 5C in the following case: while voltage is applied between the electrode 116a and the electrode 116b, the multilayer film 106c is irradiated with light and then light irradiation is stopped. Note that FIGS. 6A1, 6B1, 6C1, and 6D1 are models corresponding to the band structure in FIG. 5C. FIG. 6A2, FIG. 6B2, FIG. 6C2, and FIG. 6D2 show changes in the value of current flowing between the electrode 116a and the electrode 116b in the models of FIG. 6A1, FIG. 6B1, FIG. 6C1, and FIG. 6D1, respectively. The current value is divided by the maximum current value to be normalized. The energy of the light (denoted by "light" in the drawings) with which the multilayer film 106c is irradiated is higher than the energy gaps of both the oxide semiconductor layer 106c1 and the oxide semiconductor layer 106c2.

First, voltage is applied between the electrode 116a and the electrode 116b of Sample C without the multilayer film 106c being irradiated with light. In this case, current hardly flows between the electrode 116a and the electrode 116b because the oxide semiconductor layer 106c1 and the oxide semiconductor layer 106c2 each have a sufficiently low carrier density.

Next, upon irradiation of the multilayer film 106c at a time T0, in the oxide semiconductor layer 106c1 and the oxide semiconductor layer 106c2, electrons (denoted by "electron" in the drawings) in the valence band are excited to the conduction band and holes (denoted by "hole" in the drawings) are generated in the valence band; thus, current begins to flow between the electrode 116a and the electrode 116b (see FIGS. 6A1 and 6A2).

Then, the excited electrons move from the oxide semiconductor layer 106c1 to the oxide semiconductor layer 106c2, so that the electron density in the oxide semiconductor layer 106c2 is increased. The generated electrons move rapidly because there is no barrier between the oxide semiconductor layer 106c1 and the oxide semiconductor layer 106c2. Here, since the oxide semiconductor layer 106c2 includes a region with a high density of trap states, movement of electrons is likely to be inhibited. Accordingly, Sample C has a higher conductivity than that of Sample B, but has a lower conductivity than that of Sample A. Thus, upon irradiation of the multilayer film 106c, the value of current flowing between the electrode 116a and the electrode 116b is temporarily increased, and then is temporarily decreased because electrons are captured by the trap states in the oxide semiconductor layer 106c2. After that, the trap states are filled with electrons, so that the current value is increased again. Meanwhile, the generated holes are partly captured by the trap states in the multilayer film 106c. When recombination of electrons and holes (e.g., band-to-band recombination, band-to-state recombination, or state-to-state recombination) comes in balance with the generation of electrons and holes due to light, the increase in current value stops. Thus, when light irradiation is continued, the value of current flowing between the electrode 116a and the electrode 116b is brought close to a certain value (see FIGS. 6B1 and 6B2).

Next, light irradiation is stopped at a time T1, so that generation of electrons and holes stops. Further, electrons and holes are recombined, so that the number of electrons and holes is reduced. The reduction in the number of electrons and holes in Sample C proceeds rapidly. The reduction in the number of electrons and holes in Sample C is attributed to, for example, band-to-band recombination in the oxide semiconductor layer 106c2, band-to-state recombination in the oxide semiconductor layer 106c2, or state-to-state recombination in the oxide semiconductor layer 106c1 and the oxide semiconductor layer 106c2. In Sample C, since the oxide semiconductor layer 106c2 has a high electron density in the conduction band and includes a region with a high density of trap states, almost all the electrons and holes are recombined by state-to-state recombination in the oxide semiconductor layer 106c2 and disappear, so that the amount of current flowing between the electrode 116a and the electrode 116b is rapidly decreased (see FIGS. 6C1 and 6C2).

Next, a small number of electrons and holes that remain are recombined and disappear, so that the amount of current flowing between the electrode 116a and the electrode 116b is further decreased (see FIGS. 6D1 and 6D2).

For example, the multilayer film 106c begins to be irradiated with light having an energy higher than the energy gaps of both the oxide semiconductor layer 106c1 and the oxide semiconductor layer 106c2 (e.g., light having a peak in a wavelength range of 340 nm to 360 nm) and an intensity of 3 mW/cm$^2$ at room temperature (about 20° C. to 25° C.) at a time T0 and the irradiation is stopped at a time T1. The value of current flowing between the electrode 116a and the electrode 116b at a time T2 is greater than or equal to 90% and less than 100%, preferably greater than or equal to 95% and less than 100%, further preferably greater than or equal to 98% and less than 100% of the maximum value of current flowing between the electrode 116a and the electrode 116b between the time T0 and the time T1. The time T2 is after a period of greater than or equal to 1 second and less than or equal to 15 seconds from the time T0 and before the time T1. The value of current flowing between the electrode 116a and the electrode 116b at a time T3 is greater than or equal to 0% and less than 10%, preferably greater than or equal to 0% and less than 5%, further preferably greater than or equal to 0% and less than 2% of the maximum value of the current flowing between the electrode 116a and the electrode 116b between the time T0 and the time T1. The time T3 is after a period of greater than or equal to 1 second and less than or equal to 15 seconds from the time T1.

As described above, when the multilayer film 106c is used for a transistor, the oxide semiconductor layer 106c2 with a high electron affinity serves as a channel formation region of the transistor. Since the oxide semiconductor layer 106c2 includes a region with a high density of trap states, the switching characteristics of the transistor are likely to be degraded. Note that this transistor can be suitably used in some cases depending on applications.

<2. Transistor>

A transistor including a multilayer film 306 is described below.

<2-1. Transistor Structure (1)>

Here, a bottom-gate transistor is described. In this section, a bottom-gate top-contact (BGTC) transistor which is one kind of a bottom-gate transistor is described with reference to FIGS. 7A to 7D.

Figure 7A:
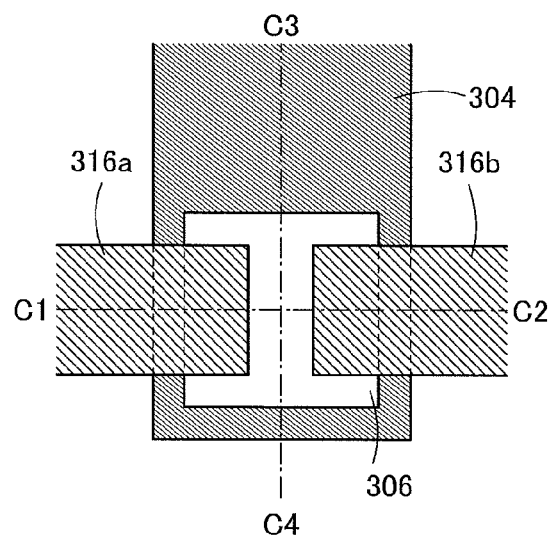
FIGS. 7A to 7D are a top view and cross-sectional views illustrating a semiconductor device of one embodiment of the present invention.
Figure 7C:
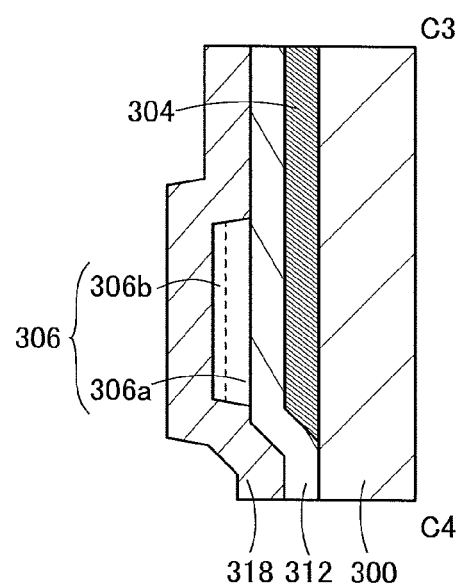
Figure 7B:
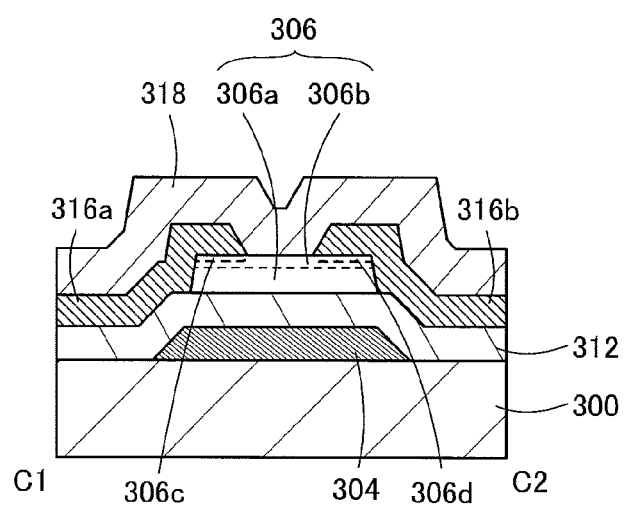

FIGS. 7A to 7D are a top view and cross-sectional views illustrating a BGTC transistor. FIG. 7A is a top view of the transistor. FIG. 7B is a cross-sectional view taken along dashed-dotted line C1-C2 in FIG. 7A. FIG. 7C is a cross-sectional view taken along dashed-dotted line C3-C4 in FIG. 7A.

The transistor illustrated in FIG. 7B includes a gate electrode 304 provided over a substrate 300, a gate insulating film 312 provided over the gate electrode 304, the multilayer film 306 which includes an oxide semiconductor layer 306a provided over the gate insulating film 312 and an oxide semiconductor layer 306b provided over the oxide semiconductor layer 306a, a source electrode 316a and a drain electrode 316b provided over the gate insulating film 312 and the multilayer film 306, and a protective insulating film 318 provided over the multilayer film 306, the source electrode 316a, and the drain electrode 316b.

Note that a conductive film used for the source electrode 316a and the drain electrode 316b takes oxygen away from part of the oxide semiconductor layer 306b or forms a mixed layer depending on the kind of the conductive film used for the source electrode 316a and the drain electrode 316b, which results in formation of a source region 306c and a drain region 306d in the oxide semiconductor layer 306b.

In FIG. 7A, the distance between the source electrode 316a and the drain electrode 316b in a region overlapping with the gate electrode 304 is called channel length. Note that in the case where the transistor includes the source region 306c and the drain region 306d, the distance between the source region 306c and the drain region 306d in a region overlapping with the gate electrode 304 may be called channel length.

Note that a channel formation region refers to a region, which overlaps with the gate electrode 304 and is located between the source electrode 316a and the drain electrode 316b, in the multilayer film 306 (see FIG. 7B). Further, a channel region refers to a region through which current mainly flows in the channel formation region. Here, the channel region is a portion of the oxide semiconductor layer 306a in the channel formation region.

Note that as illustrated in FIG. 7A, the gate electrode 304 is provided such that the edge of the multilayer film 306 is located on the inner side than the edge of the gate electrode 304. This can suppress generation of carriers in the multilayer film 306 due to light entering from the substrate 300 side. In other words, the gate electrode 304 functions as a light-blocking film. Note that the edge of the multilayer film 306 may be located on the outer side than the edge of the gate electrode 304.

<2-1-1. Multilayer Film>

The multilayer film 306 and the oxide semiconductor layer 306a and the oxide layer 306b which are included in the multilayer film 306 are described below.

The oxide semiconductor layer 306a is an oxide semiconductor layer having higher electron affinity than that of the oxide semiconductor layer 306b. For example, as the oxide semiconductor layer 306a, an oxide semiconductor layer having higher electron affinity than that of the oxide semiconductor layer 306b by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. In that case, when an electric field is applied to the gate electrode 304, a channel is formed in the oxide semiconductor layer 306a having higher electron affinity in the multilayer film 306. That is, forming the oxide semiconductor layer 306b between the oxide semiconductor layer 306a and the protective insulating film 318 enables the channel of the transistor to be formed in the oxide semiconductor layer 306a which is apart from the protective insulating film 318. In addition, since the oxide semiconductor layer 306b contains one or more elements other than oxygen contained in the oxide semiconductor layer 306a, interface scattering is unlikely to occur between the oxide semiconductor layer 306a and the oxide semiconductor layer 306b. Thus, movement of carriers is not inhibited between the oxide semiconductor layer 306a and the oxide semiconductor layer 306b, which results in an increase in the field-effect mobility of the transistor. Moreover, an interface state is less likely to be formed between the oxide semiconductor layer 306a and the oxide semiconductor layer 306b. When an interface state is formed between the oxide semiconductor layer 306a and the oxide semiconductor layer 306b, a second transistor in which the interface between the oxide semiconductor layer 306a and the oxide semiconductor layer 306b serves as a channel and which has different threshold voltage from the transistor is formed and the apparent threshold voltage of the transistor is changed in some cases. Thus, with the oxide semiconductor layer 306b, variations of electrical characteristics, such as threshold voltage, between transistors can be reduced.

As each of the oxide semiconductor layer 306a and the oxide semiconductor layer 306b, an oxide semiconductor layer having a large energy gap is used. For example, the energy gap of the oxide semiconductor layer 306a is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV. Further, for example, the energy gap of the oxide semiconductor layer 306b is greater than or equal to 2.7 eV and less than or equal to 4.9 eV, preferably greater than or equal to 3 eV and less than or equal to 4.7 eV, more preferably greater than or equal to 3.2 eV and less than or equal to 4.4 eV. Note that as the oxide semiconductor layer 306b, an oxide semiconductor layer having a larger energy gap than that of the oxide semiconductor layer 306a is used.

An oxide semiconductor layer with a low carrier density is used as each of the oxide semiconductor layer 306a and the oxide semiconductor layer 306b. For example, an oxide semiconductor layer whose carrier density is lower than or equal to $1\times10^{17}/cm^3$, preferably lower than or equal to $1\times10^{15}/cm^3$, more preferably lower than or equal to $1\times10^{13}/cm^3$, still more preferably lower than or equal to $1\times10^{11}/cm^3$ is used as the oxide semiconductor layer 306a. For example, an oxide semiconductor layer whose carrier density is lower than or equal to $1\times10^{15}/cm^3$, preferably lower than or equal to $1\times10^{13}/cm^3$, more preferably lower than or equal to $1\times10^{11}/cm^3$, still more preferably lower than or equal to $1\times10^{9}/cm^3$ is used as the oxide semiconductor layer 306b.

The oxide semiconductor layer 306a contains at least indium. In addition to indium, an element M (aluminum, titanium, silicon, gallium, germanium, yttrium, zirconium, tin, lanthanum, cerium, or hafnium) is preferably contained.

The oxide semiconductor layer 306b contains one or more elements other than oxygen contained in the oxide semiconductor layer 306a. Note that the oxide semiconductor layer 306a preferably contains at least indium in order that the carrier mobility (electron mobility) is high. Since the oxide semiconductor layer 306b contains one or more elements other than oxygen contained in the oxide semiconductor layer 306a, interface scattering is unlikely to occur at the interface between the oxide semiconductor layer 306a and the oxide semiconductor layer 306b. Thus, the transistor can have high field-effect mobility because the movement of carriers is not inhibited at the interface.

The oxide semiconductor layer 306b may contain, for example, aluminum, titanium, silicon, gallium, germanium, yttrium, zirconium, tin, lanthanum, cerium, or hafnium at a proportion higher than that of indium. Specifically, the amount of any of the above elements in the oxide semiconductor layer 306b in an atomic ratio is 1.5 times or more, preferably 2 times or more, more preferably 3 times or more as much as that of indium in an atomic ratio. The above elements increase the energy gap of the oxide semiconductor layer in some cases. When any of the above elements is contained in the oxide semiconductor layer at a high proportion, it decreases the electron affinity of the oxide semiconductor layer in some cases. The oxide semiconductor layer 306b contains any of the above elements at a higher proportion than the oxide semiconductor layer 306a.

In the case of using an In-M-Zn oxide (an element M is aluminum, titanium, silicon, gallium, germanium, yttrium, zirconium, tin, lanthanum, cerium, or hafnium) as the oxide semiconductor layer 306a, the atomic ratio of In to M is preferably as follows: the percentage of In is higher than or equal to 25 atomic % and the percentage of M is lower than 75 atomic %; further preferably, the percentage of In is higher than or equal to 34 atomic % and the percentage of M is lower than 66 atomic %. In the case of using an In-M-Zn oxide as the oxide semiconductor layer 306b, the atomic ratio of In to M is preferably as follows: the percentage of In is lower than 50 atomic % and the percentage of M is higher than or equal to 50 atomic %; further preferably, the percentage of In is lower than 25 atomic % and the percentage of M is higher than or equal to 75 atomic %.

The thickness of the oxide semiconductor layer 306b is greater than or equal to 3 nm and less than or equal to 100 nm, preferably greater than or equal to 3 nm and less than or equal to 50 nm. The thickness of the oxide semiconductor layer 306a is greater than or equal to 3 nm and less than or equal to 200 nm, preferably greater than or equal to 3 nm and less than or equal to 100 nm, more preferably greater than or equal to 3 nm and less than or equal to 50 nm.

As described above, the multilayer film 306 is a multilayer film similar to the multilayer film 106a described in Model A. That is, the oxide semiconductor layer 306a is an oxide semiconductor layer similar to the oxide semiconductor layer 106a1. Further, the oxide semiconductor layer 306b is an oxide semiconductor layer similar to the oxide semiconductor layer 106a2. Note that the multilayer film 306 may be a multilayer film similar to the multilayer film 106c described in Model C. Alternatively, the multilayer film 306 may be replaced with the oxide semiconductor layer 106b described in Model B. The multilayer film 306 is not limited to a stack of two oxide semiconductor layers. For example, the multilayer film 306 may include three or more oxide semiconductor layers. Specifically, the multilayer film 306 may include an oxide semiconductor layer similar to the oxide semiconductor layer 306b, the oxide semiconductor layer 306a provided over the oxide semiconductor layer, and the oxide semiconductor layer 306b provided over the oxide semiconductor layer 306a.

The concentration of silicon in each of the oxide semiconductor layer 306a and the oxide semiconductor layer 306b is described below. In order to obtain stable electrical characteristics of a transistor, it is effective to reduce the concentration of impurities in the oxide semiconductor layer 306a so that the oxide semiconductor layer 306a is highly purified to be intrinsic. The carrier density of the oxide semiconductor layer 306a is set to lower than $1\times10^{17}/cm^3$, lower than $1\times10^{15}/cm^3$, or lower than $1\times10^{13}/cm^3$. In the oxide semiconductor layer 306a, a light element, a semimetal element, a metal element, and the like (lower than 1 atomic %), other than main components serve as impurities. For example, hydrogen, nitrogen, carbon, silicon, germanium, titanium, and hafnium serve as impurities in the oxide semiconductor layer 306a. Thus, the concentrations of impurities in the gate insulating film 312 and the oxide semiconductor layer 306b which are adjacent to the oxide semiconductor layer 306a are preferably reduced.

For example, when silicon is contained in the oxide semiconductor layer 306a, an impurity state is formed. In particular, when silicon exists between the oxide semiconductor layer 306a and the oxide semiconductor layer 306b, the impurity state serves as a trap state. For this reason, the concentration of silicon in a region between the oxide semiconductor layer 306a and the oxide semiconductor layer 306b is set to lower than $1\times10^{19}$ atoms/cm$^3$, preferably lower than $5\times10^{18}$ atoms/cm$^3$, more preferably lower than $2\times10^{18}$ atoms/cm$^3$.

Further, hydrogen and nitrogen in the oxide semiconductor layer 306a form donor states, which increase carrier density. The concentration of hydrogen in the oxide semiconductor layer 306a, which is measured by secondary ion mass spectrometry (SIMS), is set to lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. The concentration of nitrogen, which is measured by SIMS, is set to lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

It is preferable to reduce the concentrations of hydrogen and nitrogen in the oxide semiconductor layer 306b in order to reduce the concentrations of hydrogen and nitrogen in the oxide semiconductor layer 306a. The concentration of hydrogen in the oxide semiconductor layer 306b, which is measured by SIMS, is set to lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. The concentration of nitrogen, which is measured by SIMS, is set to lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

A structure of an oxide semiconductor layer which can be used for the oxide semiconductor layer 306a and the oxide semiconductor layer 306b is described below. Note that the trigonal and rhombohedral crystal systems are included in the hexagonal crystal system.

A structure of an oxide semiconductor layer is described below.

An oxide semiconductor layer is classified roughly into a single-crystal oxide semiconductor layer and a non-single-crystal oxide semiconductor layer. The non-single-crystal oxide semiconductor layer includes any of an amorphous oxide semiconductor layer, a microcrystalline oxide semiconductor layer, a polycrystalline oxide semiconductor layer, a c-axis aligned crystalline oxide semiconductor (CAAC-OS) layer, and the like.

The amorphous oxide semiconductor layer has disordered atomic arrangement and no crystalline component. A typical example thereof is an oxide semiconductor layer in which no crystal part exists even in a microscopic region, and the whole of the layer is amorphous.

The microcrystalline oxide semiconductor layer includes a microcrystal (also referred to as nanocrystal) with a size greater than or equal to 1 nm and less than 10 nm, for example.

Thus, the microcrystalline oxide semiconductor layer has a higher degree of atomic order than the amorphous oxide semiconductor layer. Hence, the density of defect states of the microcrystalline oxide semiconductor layer is lower than that of the amorphous oxide semiconductor layer.

The CAAC-OS layer is one of oxide semiconductor layers including a plurality of crystal parts, and most of the crystal parts each fit inside a cube whose one side is less than 100 nm. Thus, there is a case where a crystal part included in the CAAC-OS layer fits inside a cube whose one side is less than 10 nm, less than 5 nm, or less than 3 nm. The density of defect states of the CAAC-OS layer is lower than that of the microcrystalline oxide semiconductor layer. The CAAC-OS layer is described in detail below.

In a transmission electron microscope (TEM) image of the CAAC-OS layer, a boundary between crystal parts, that is, a grain boundary is not clearly observed. Thus, in the CAAC-OS layer, a reduction in electron mobility due to the grain boundary is less likely to occur.

According to the TEM image of the CAAC-OS layer observed in a direction substantially parallel to a sample surface (cross-sectional TEM image), metal atoms are arranged in a layered manner in the crystal parts. Each metal atom layer has a morphology reflected by a surface over which the CAAC-OS layer is formed (hereinafter, a surface over which the CAAC-OS layer is formed is referred to as a formation surface) or a top surface of the CAAC-OS layer, and is arranged in parallel to the formation surface or the top surface of the CAAC-OS layer.

In this specification, a term "parallel" indicates that the angle formed between two straight lines is greater than or equal to $-10°$ and less than or equal to $10°$, and accordingly also includes the case where the angle is greater than or equal to $-5°$ and less than or equal to $5°$. In addition, a term "perpendicular" indicates that the angle formed between two straight lines is greater than or equal to $80°$ and less than or equal to $100°$, and accordingly includes the case where the angle is greater than or equal to $85°$ and less than or equal to $95°$.

On the other hand, according to the TEM image of the CAAC-OS layer observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS layer.

A CAAC-OS layer is subjected to structural analysis with an X-ray diffraction (XRD) apparatus. For example, when the CAAC-OS layer including an $InGaZnO_4$ crystal is analyzed by an out-of-plane method, a peak appears frequently when the diffraction angle (2θ) is around $31°$. This peak is derived from the (009) plane of the $InGaZnO_4$ crystal, which indicates that crystals in the CAAC-OS layer have c-axis alignment, and that the c-axes are aligned in a direction substantially perpendicular to the formation surface or the top surface of the CAAC-OS layer.

On the other hand, when the CAAC-OS layer is analyzed by an in-plane method in which an X-ray enters a sample in a direction substantially perpendicular to the c-axis, a peak appears frequently when 2θ is around $56°$. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around $56°$. In the case where the sample is a single-crystal oxide semiconductor layer of $InGaZnO_4$, six peaks appear. The six peaks are derived from crystal planes equivalent to the (110) plane. On the other hand, in the case of a CAAC-OS layer, a peak is not clearly observed even when φ scan is performed with 2θ fixed at around $56°$.

According to the above results, in the CAAC-OS layer having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS layer or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS layer is changed by etching or the like, the c-axis might not be necessarily parallel to a normal vector of a formation surface or a normal vector of a top surface of the CAAC-OS layer.

Further, the degree of crystallinity in the CAAC-OS layer is not necessarily uniform. For example, in the case where crystal growth leading to the CAAC-OS layer occurs from the vicinity of the top surface of the layer, the degree of the crystallinity in the vicinity of the top surface is higher than that in the vicinity of the formation surface in some cases. Further, when an impurity is added to the CAAC-OS layer, the crystallinity in a region to which the impurity is added is changed, and the degree of crystallinity in the CAAC-OS layer varies depending on regions.

Note that when the CAAC-OS layer with an $InGaZnO_4$ crystal is analyzed by an out-of-plane method, a peak of 2θ may also be observed at around $36°$, in addition to the peak of 2θ at around $31°$. The peak of 2θ at around $36°$ indicates that a crystal having no c-axis alignment is included in part of the CAAC-OS layer. It is preferable that in the CAAC-OS layer, a peak of 2θ appear at around $31°$ and a peak of 2θ do not appear at around $36°$.

In a transistor using the CAAC-OS layer, change in electrical characteristics due to irradiation with visible light or ultraviolet light is small. Thus, the transistor has high reliability.

Note that an oxide semiconductor layer may be a stacked film including two or more layers of an amorphous oxide semiconductor layer, a microcrystalline oxide semiconductor layer, and a CAAC-OS layer, for example.

Note that when silicon and carbon are contained in the oxide semiconductor layer 306a at a high concentration, the crystallinity of the oxide semiconductor layer 306a is lowered in some cases. In order not to lower the crystallinity of the oxide semiconductor layer 306a, the concentration of silicon in the oxide semiconductor layer 306a is preferably set to lower than $1\times10^{19}$ atoms/cm$^3$, preferably lower than $5\times10^{18}$ atoms/cm$^3$, more preferably lower than $2\times10^{18}$ atoms/cm$^3$. Moreover, in order not to lower the crystallinity of the oxide semiconductor layer 306a, the concentration of carbon in the oxide semiconductor layer 306a is set to lower than $1\times10^{19}$ atoms/cm$^3$, preferably lower than $5\times10^{18}$ atoms/cm$^3$, more preferably lower than $2\times10^{18}$ atoms/cm$^3$.

As described above, in the case where the oxide semiconductor layer 306a in which a channel is formed has high crystallinity and the density of states due to an impurity or a defect is low, a transistor including the multilayer film 306 has stable electrical characteristics.

Localized states of the multilayer film 306 are described below. By reducing the density of localized states due to defect states of the multilayer film 306, a transistor including the multilayer film 306 can have stable electrical characteristics. The density of localized states of the multilayer film 306 can be measured by a constant photocurrent method (CPM).

In order that the transistor has stable electrical characteristics, the absorption coefficient due to the localized states of the multilayer film 306 measured by CPM is preferably lower than $1\times10^{-3}$ cm$^{-1}$, more preferably lower than $3\times10^{-4}$ cm$^{-1}$. Further, when the absorption coefficient due to the localized states of the multilayer film 306 measured by CPM is lower than $1\times10^{-3}$ cm$^{-1}$, preferably lower than $3\times10^{-4}$ cm$^{-1}$, the field-effect mobility of the transistor can be increased. In order that the absorption coefficient due to the localized states of the multilayer film 306 measured by CPM is lower than $1\times10^{-3}$ cm$^{-1}$, preferably lower than $3\times10^{-4}$ cm$^{-1}$, the concentration of silicon, germanium, carbon, hafnium, titanium, and the like in the oxide semiconductor layer 306a which form localized states is preferably lower than $2\times10^{18}$ atoms/cm$^3$, more preferably lower than $2\times10^{17}$ atoms/cm$^3$.

In the CPM measurement, the amount of light with which a surface of the sample between terminals is irradiated is adjusted so that a photocurrent value is kept constant in the state where voltage is applied between electrodes provided in contact with the multilayer film 306 that is the sample, and then an absorption coefficient is derived from the amount of the irradiation light at each wavelength. In the CPM measurement, when the sample has a defect, the absorption coefficient of energy which corresponds to a level at which the defect exists (calculated from a wavelength) is increased. The increase in the absorption coefficient is multiplied by a constant, whereby the defect density of the sample can be obtained.

A transistor which includes the multilayer film 306 having a small absorption coefficient due to the localized states obtained by CPM has stable electrical characteristics.

<2-1-2. Source Electrode and Drain Electrode>

The source electrode 316a and the drain electrode 316b may be formed using a single layer or a stacked layer of a conductive film containing one or more kinds of aluminum, titanium, chromium, cobalt, nickel, copper, yttrium, zirconium, molybdenum, ruthenium, silver, tantalum, and tungsten. The source electrode 316a and the drain electrode 316b are each preferably a multilayer film including a layer containing copper. In the case where the source electrode 316a and the drain electrode 316b are each a multilayer film including a layer containing copper and where a wiring is formed in the same layer as the source electrode 316a and the drain electrode 316b, wiring resistance can be reduced. Note that the source electrode 316a and the drain electrode 316b may have the same composition or different compositions.

In the case where a multilayer film including a layer containing copper is used for the source electrode 316a and the drain electrode 316b, a trap state might be formed at the interface between the oxide semiconductor layer 306b and the protective insulating film 318 due to copper. Even in this case, since the oxide semiconductor layer 306a serves as a channel formation region of the transistor owing to the oxide semiconductor layer 306b, electrons can be prevented from being captured by the trap states. Thus, stable electrical characteristics of a transistor can be achieved and wiring resistance can be reduced.

<2-1-3. Protective Insulating Film>

The protective insulating film 318 may be formed of a single layer or a stacked layer using an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The protective insulating film 318 may be, for example, a multilayer film including a silicon oxide layer as a first layer and a silicon nitride layer as a second layer. In that case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose spin density attributed to a signal with a g factor of 2.001 in electron spin resonance (ESR) is lower than or equal to $3\times10^{17}$ spins/cm$^3$, preferably lower than or equal to $5\times10^{16}$ spins/cm$^3$ is used. As the silicon nitride layer, a silicon nitride layer from which a hydrogen gas and an ammonia gas are less likely to be released is used. The amount of released hydrogen gas or ammonia gas may be measured by thermal desorption spectroscopy (TDS). Further, as the silicon nitride layer, a silicon nitride layer which does not transmit or hardly transmits hydrogen, water, and oxygen is used.

Figure 7D:
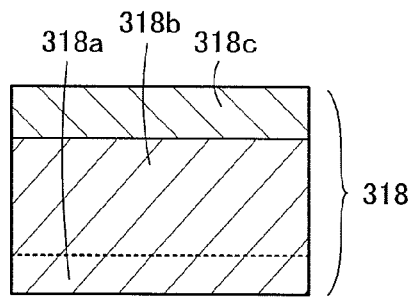

Alternatively, the protective insulating film 318 may be, for example, a multilayer film including a first silicon oxide layer 318a as a first layer, a second silicon oxide layer 318b as a second layer, and a silicon nitride layer 318c as a third layer (see FIG. 7D). In that case, the first silicon oxide layer 318a and/or the second silicon oxide layer 318b may be a silicon oxynitride layer. In addition, the silicon nitride layer may be a silicon nitride oxide layer. As the first silicon oxide layer 318a, a silicon oxide layer whose defect density is low is preferably used. Specifically, a silicon oxide layer whose spin density attributed to a signal with a g factor of 2.001 in ESR is lower than or equal to $3\times10^{17}$ spins/cm$^3$, preferably lower than or equal to $5\times10^{16}$ spins/cm$^3$ is used. As the second silicon oxide layer 318b, a silicon oxide layer containing excess oxygen is used. As the silicon nitride layer 318c, a silicon nitride layer from which a hydrogen gas and an ammonia gas are less likely to be released is used. Further, as the silicon nitride layer, a silicon nitride layer which does not transmit or hardly transmits hydrogen, water, and oxygen is used.

The silicon oxide layer containing excess oxygen means a silicon oxide layer from which oxygen can be released by heat treatment or the like. An insulating film containing excess oxygen means an insulating film from which oxygen is released by heat treatment.

The insulating film containing excess oxygen is capable of reducing oxygen vacancies in the oxide semiconductor layer 306a. Oxygen vacancies in the oxide semiconductor layer 306a form defect states, and some of the defect states become donor states. Thus, by a reduction in the oxygen vacancies in the oxide semiconductor layer 306a, the transistor can have stable electrical characteristics.

Here, a layer from which oxygen is released by heat treatment may release oxygen, the amount of which is higher than or equal to $1\times10^{18}$ atoms/cm$^3$, higher than or equal to $1\times10^{19}$ atoms/cm$^3$, or higher than or equal to $1\times10^{20}$ atoms/cm$^3$ in TDS analysis (converted into the number of oxygen atoms).

Here, the method for measuring the amount of released oxygen using TDS analysis is described below.

The total amount of released gas from a measurement sample in TDS is proportional to the integral value of the ion intensity of the released gas. Then, a comparison with a reference sample is made, whereby the total amount of released gas can be calculated.

For example, the number of released oxygen molecules ($N_{O2}$) from a measurement sample can be calculated according to Formula 1 using the TDS results of a silicon wafer containing hydrogen at a predetermined density, which is a reference sample, and the TDS results of the measurement sample. Here, all gases having a mass number of 32 which are obtained in the TDS analysis are assumed to originate from an oxygen molecule. Note that $CH_3OH$, which is a gas having a mass number of 32, is not taken into consideration because it is unlikely to be present. Further, an oxygen molecule including an oxygen atom having a mass number of 17 or 18 which is an isotope of an oxygen atom is also not taken into consideration because the proportion of such a molecule in the natural world is minimal.

[FORMULA 1]

$$N_{O2} = \frac{N_{H2}}{S_{H2}} \times S_{O2} \times \alpha \quad (1)$$

Here, $N_{H2}$ is the value obtained by conversion of the number of hydrogen molecules desorbed from the reference sample into densities. In addition, $S_{H2}$ is the integral value of ion intensity in the TDS analysis of the reference sample. Here, the reference value of the reference sample is expressed as $N_{H2}/S_{H2}$. Further, $S_{O2}$ is the integral value of ion intensity in the TDS analysis of the measurement sample, and α is a coefficient affecting the ion intensity in the TDS analysis. For details of Formula 1, Japanese Published Patent Application No. H6-275697 is referred to. The amount of released oxygen was measured with a thermal desorption spectroscopy apparatus produced by ESCO Ltd., EMD-WA1000S/W using a silicon wafer containing hydrogen atoms at $1\times10^{16}$ atoms/$cm^2$ as the reference sample.

Further, in the TDS analysis, oxygen is partly detected as an oxygen atom. The ratio between oxygen molecules and oxygen atoms can be calculated from the ionization rate of the oxygen molecules. Note that, since the above α includes the ionization rate of the oxygen molecules, the number of the released oxygen atoms can also be estimated through the evaluation of the number of the released oxygen molecules.

Note that $N_{O2}$ is the number of the released oxygen molecules. The amount of released oxygen when converted into oxygen atoms is twice the number of the released oxygen molecules.

Further, the layer from which oxygen is released by heat treatment may contain a peroxide radical. Specifically, the spin density attributed to a peroxide radical is greater than or equal to $5\times10^{17}$ spins/$cm^3$. Note that the layer containing a peroxide radical may have an asymmetric signal at a g-factor of around 2.01 generated in ESR.

The insulating film containing excess oxygen may be oxygen-excess silicon oxide ($SiO_X$ (X>2)). In the oxygen-excess silicon oxide ($SiO_X$ (X>2)), the number of oxygen atoms per unit volume is more than twice the number of silicon atoms per unit volume. The number of silicon atoms and the number of oxygen atoms per unit volume are measured by Rutherford backscattering spectrometry (RBS).

<2-1-4. Gate Insulating Film>

The gate insulating film 312 may be formed of a single layer or a stacked layer using an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The gate insulating film 312 may be, for example, a multilayer film including a silicon nitride layer as a first layer and a silicon oxide layer as a second layer. In that case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose spin density attributed to a signal with a g factor of 2.001 in ESR is lower than or equal to $3\times10^{17}$ spins/$cm^3$, preferably lower than or equal to $5\times10^{16}$ spins/$cm^3$ is used. As the silicon oxide layer, a silicon oxide layer containing excess oxygen is preferably used. As the silicon nitride layer, a silicon nitride layer from which a hydrogen gas and an ammonia gas are less likely to be released is used. The amount of released hydrogen gas or ammonia gas may be measured by TDS.

In the case where at least one of the gate insulating film 312 and the protective insulating film 318 includes an insulating film containing excess oxygen, oxygen vacancies in the oxide semiconductor layer 306a are reduced, so that stable electrical characteristics of a transistor can be achieved.

<2-1-5. Gate Electrode>

The gate electrode 304 may be formed using a single layer or a stacked layer of a conductive film containing one or more kinds of aluminum, titanium, chromium, cobalt, nickel, copper, yttrium, zirconium, molybdenum, ruthenium, silver, tantalum, and tungsten.

<2-1-6. Substrate>

There is no particular limitation on the substrate 300. For example, a glass substrate, a ceramic substrate, a quartz substrate, or a sapphire substrate may be used as the substrate 300. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used as the substrate 300. Still alternatively, any of these substrates provided with a semiconductor element may be used as the substrate 300.

In the case where a large glass substrate such as the 5th generation (1000 mm×1200 mm or 1300 mm×1500 mm), the 6th generation (1500 mm×1800 mm), the 7th generation (1870 mm×2200 mm), the 8th generation (2200 mm×2500 mm), the 9th generation (2400 mm×2800 mm), or the 10th generation (2880 mm×3130 mm) is used as the substrate 300, minute processing is sometimes difficult due to shrinkage of the substrate 300 caused by heat treatment or the like in a manufacturing process of a semiconductor device. Therefore, in the case where the above-described large glass substrate is used as the substrate 300, a substrate which is unlikely to shrink through the heat treatment is preferably used. For example, as the substrate 300, it is possible to use a large glass substrate in which the amount of shrinkage after heat treatment which is performed for one hour at 400° C., preferably 450° C., more preferably 500° C. is less than or equal to 10 ppm, preferably less than or equal to 5 ppm, more preferably less than or equal to 3 ppm.

Further alternatively, a flexible substrate may be used as the substrate 300. Note that as a method for forming a transistor over a flexible substrate, there is also a method in which, after a transistor is formed over a non-flexible substrate, the transistor is separated from the non-flexible substrate and transferred to the substrate 300 which is a flexible substrate. In that case, a separation layer is preferably provided between the non-flexible substrate and the transistor.

In the transistor described above, a channel is formed in the oxide semiconductor layer 306a; thus, the transistor has stable electrical characteristics and high field-effect mobility. Even when the source electrode 316a and the drain electrode 316b are formed of a multilayer film including a layer containing copper, stable electrical characteristics can be obtained.

<2-2. Method for Manufacturing Transistor Structure (1)>

A method for manufacturing a transistor is described here with reference to FIGS. 8A to 8C and FIGS. 9A and 9B.

First, the substrate 300 is prepared.

Then, a conductive film to be the gate electrode 304 is formed. The conductive film to be the gate electrode 304 may be formed using any of the conductive films given as examples of the gate electrode 304 by a sputtering method, a chemical vapor deposition (CVD) method, a molecular beam epitaxy (MBE) method, an atomic layer deposition (ALD) method, or a pulsed laser deposition (PLD) method.

Figure 8A:
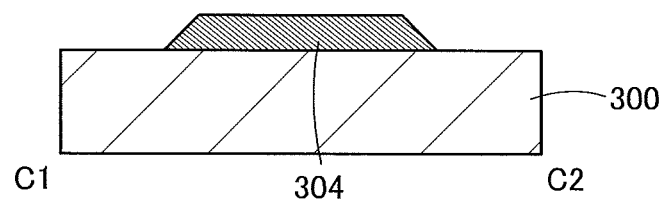
FIGS. 8A to 8C are cross-sectional views illustrating a method for manufacturing a semiconductor device of one embodiment of the present invention.

Next, the conductive film to be the gate electrode 304 is partly etched to form the gate electrode 304 (see FIG. 8A).

Figure 8B:
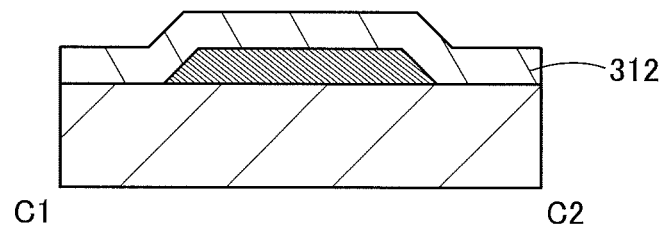

Next, the gate insulating film 312 is formed (see FIG. 8B). The gate insulating film 312 may be formed in such a manner that any of the insulating films given above as examples of the gate insulating film 312 is formed by a sputtering method, a CVD method, an MBE method, an ALD method, or a PLD method.

Next, an oxide semiconductor layer to be the oxide semiconductor layer 306a is formed. Note that the oxide semiconductor layer 306a is formed so as to be a CAAC-OS film, a microcrystalline film, or an amorphous film, for example. When the oxide semiconductor layer 306a is the CAAC-OS film, the microcrystalline film, or the amorphous film, for example, an oxide semiconductor layer to be the oxide semiconductor layer 306b is likely to be a CAAC-OS film.

Next, the oxide semiconductor layer to be the oxide semiconductor layer 306b is formed. As the oxide semiconductor layer to be the oxide semiconductor layer 306b, any of the oxide semiconductor layers mentioned above as the oxide semiconductor layer 306b can be formed by a sputtering method, a CVD method, an MBE method, an ALD method, or a PLD method.

Note that when the oxide semiconductor layer to be the oxide semiconductor layer 306a and the oxide semiconductor layer to be the oxide semiconductor layer 306b are formed successively without being exposed to the air, impurities are less likely to be taken into interfaces between the layers; thus, the density of defect states or the density of trap states in the oxide semiconductor layer to be the oxide semiconductor layer 306a and/or the oxide semiconductor layer to be the oxide semiconductor layer 306b can be reduced in some cases.

Figure 8C:
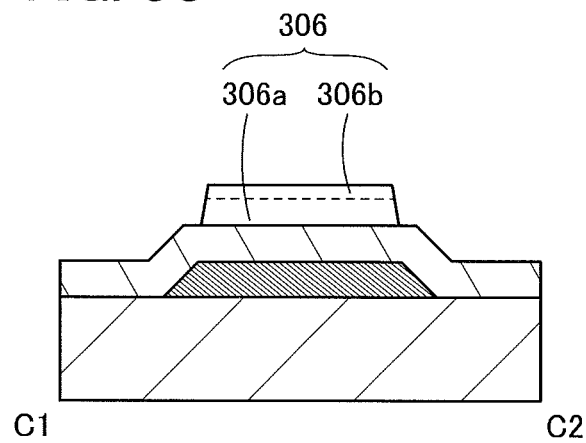

Next, the oxide semiconductor layer to be the oxide semiconductor layer 306a and the oxide semiconductor layer to be the oxide semiconductor layer 306b are partly etched to form the multilayer film 306 including the oxide semiconductor layer 306a and the oxide semiconductor layer 306b (see FIG. 8C).

Next, first heat treatment is preferably performed. The first heat treatment can be performed at a temperature higher than or equal to 250° C. and lower than or equal to 650° C., preferably higher than or equal to 300° C. and lower than or equal to 500° C. The first heat treatment is performed in an inert gas atmosphere, an atmosphere containing an oxidizing gas at 10 ppm or more, 1% or more, or 10% or more, or under reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. By the first heat treatment, the crystallinity of the oxide semiconductor layer 306a can be improved, and in addition, impurities such as hydrogen and water can be removed from the gate insulating film 312 and/or the multilayer film 306. Moreover, by the first heat treatment, the density of defect states or the density of trap states in the oxide semiconductor layer 306a and/or the oxide semiconductor layer 306b can be reduced. Accordingly, treatment like the first heat treatment sometimes can be called treatment for reducing the density of defect states or the density of trap states in an oxide semiconductor layer.

Next, a conductive film to be the source electrode 316a and the drain electrode 316b is formed. The conductive film to be the source electrode 316a and the drain electrode 316b may be formed in such a manner that any of the conductive films given above as examples of the source electrode 316a and the drain electrode 316b is formed by a sputtering method, a CVD method, an MBE method, an ALD method, or a PLD method.

For example, a multilayer film including a tungsten layer and a copper layer over the tungsten layer may be formed as the conductive film to be the source electrode 316a and the drain electrode 316b.

Figure 9A:
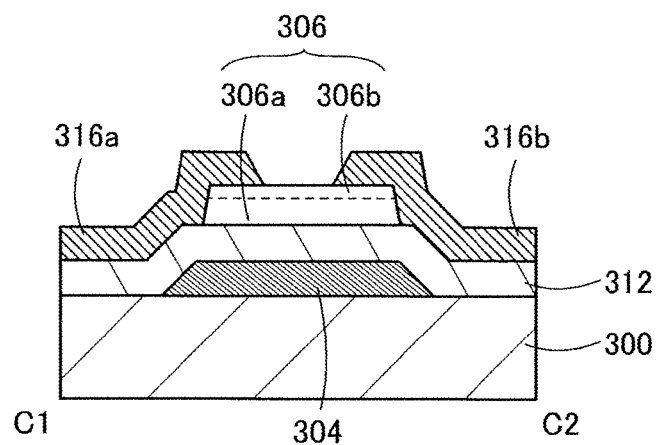
FIGS. 9A and 9B are cross-sectional views illustrating a method for manufacturing a semiconductor device of one embodiment of the present invention.

Next, the conductive film to be the source electrode 316a and the drain electrode 316b is partly etched to form the source electrode 316a and the drain electrode 316b (see FIG. 9A). In the case where a multilayer film including a tungsten layer and a copper layer over the tungsten layer is used as the conductive film to be the source electrode 316a and the drain electrode 316b, the multilayer film can be etched with the use of one photomask. Even when the tungsten layer and the copper layer are etched at once, the concentration of copper in a region between the oxide semiconductor layer 306a and the oxide semiconductor layer 306b can be lower than $1 \times 10^{19}$ atoms/cm$^3$, lower than $2 \times 10^{18}$ atoms/cm$^3$, or lower than $2 \times 10^{17}$ atoms/cm$^3$ owing to the oxide semiconductor layer 306b provided over the oxide semiconductor layer 306a; thus, an increase in the density of defect states or the density of trap states in the oxide semiconductor layer 306a and/or the oxide semiconductor layer 306b due to copper can be prevented. Consequently, deterioration of the electrical characteristics of the transistor can be reduced. Thus, the degree of freedom of the process is increased, so that transistors can be manufactured with improved productivity.

Note that a defect state or a trap state is likely to be formed in the multilayer film 306 when the conductive film to be the source electrode 316a and the drain electrode 316b is partly etched.

Next, second heat treatment is preferably performed. The description of the first heat treatment can be referred to for the second heat treatment. By the second heat treatment, impurities such as hydrogen and water can be removed from the multilayer film 306. Hydrogen easily moves especially in the multilayer film 306; thus, reducing hydrogen by the second heat treatment enables a reduction in the density of defect states or the density of trap states in the oxide semiconductor layer 306a and/or the oxide semiconductor layer 306b. Accordingly, the transistor can have stable electrical characteristics. Note that water is a compound containing hydrogen and thus may act as impurities in the oxide semiconductor layer 306a.

Figure 9B:
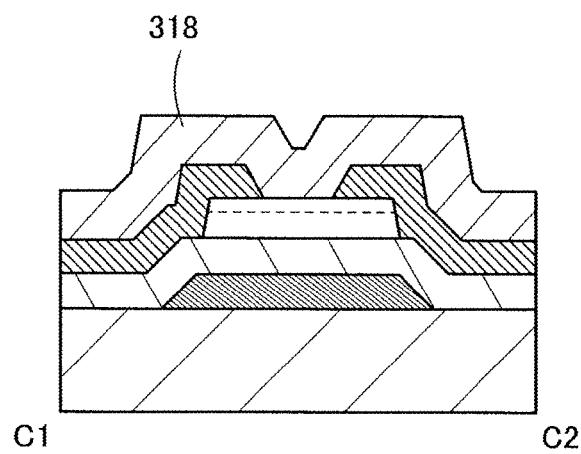

Next, the protective insulating film 318 is formed (see FIG. 9B). The protective insulating film 318 may be formed in such a manner that any of the insulating films given above as examples of the protective insulating film 318 is formed by a sputtering method, a CVD method, an MBE method, an ALD method, or a PLD method.

Here, the case where the protective insulating film 318 has a three-layer structure as illustrated in FIG. 7D is described. First, the first silicon oxide layer 318a is formed, and then the second silicon oxide layer 318b is formed. Next, treatment for adding oxygen ions to the first silicon oxide layer 318a and/or the second silicon oxide layer 318b may be performed. The treatment for adding oxygen ions may be performed with an ion doping apparatus or a plasma treatment apparatus. As the ion doping apparatus, an ion doping apparatus with a mass separation function may be used. As a source material of oxygen ions, an oxygen gas such as $^{16}O_2$ or $^{18}O_2$, a nitrous oxide gas, an ozone gas, or the like may be used. Next, the silicon nitride layer 318c is formed. The protective insulating film 318 may be formed in the above manner.

The first silicon oxide layer 318a is preferably formed by a plasma CVD method which is one type of CVD method. Specifically, the first silicon oxide layer 318a may be formed by supplying high-frequency power to an electrode under the following conditions: the substrate temperature is higher than or equal to 180° C. and lower than or equal to 400° C., preferably higher than or equal to 200° C. and lower than or equal to 370° C., a deposition gas containing silicon and an oxidizing gas are used, and the pressure is higher than or equal to 20 Pa and lower than or equal to 250 Pa, preferably higher than or equal to 40 Pa and lower than or equal to 200 Pa. Note that typical examples of the deposition gas containing silicon include silane, disilane, trisilane, and silane fluoride. Examples of the oxidizing gas include oxygen, ozone, nitrous oxide, and nitrogen dioxide.

By setting the flow rate of the oxidizing gas to 100 times or more the flow rate of the deposition gas containing silicon, the hydrogen content in the first silicon oxide layer 318a can be reduced and dangling bonds can be reduced.

In the above manner, the first silicon oxide layer 318a with a low defect density is formed. That is, the spin density of the first silicon oxide layer 318a, which is attributed to a signal with a g factor of 2.001 in ESR, can be lower than or equal to $3 \times 10^{17}$ spins/cm$^3$ or lower than or equal to $5 \times 10^{16}$ spins/cm$^3$.

The second silicon oxide layer 318b is preferably formed by a plasma CVD method. Specifically, the second silicon oxide layer 318b may be formed by supplying high-frequency power higher than or equal to 0.17 W/cm$^2$ and lower than or equal to 0.5 W/cm$^2$, preferably higher than or equal to 0.25 W/cm$^2$ and lower than or equal to 0.35 W/cm$^2$, to an electrode under the following conditions: the substrate temperature is higher than or equal to 160° C. and lower than or equal to 350° C., preferably higher than or equal to 180° C. and lower than or equal to 260° C., a deposition gas containing silicon and an oxidizing gas are used, and the pressure is higher than or equal to 100 Pa and lower than or equal to 250 Pa, preferably higher than or equal to 100 Pa and lower than or equal to 200 Pa.

By the above-described method, the decomposition efficiency of the gas in plasma is enhanced, oxygen radicals are increased, and oxidation of the gas is promoted; thus, the second silicon oxide layer 318b containing excess oxygen can be formed.

The silicon nitride layer 318c is preferably formed by a plasma CVD method. Specifically, the silicon nitride layer 318c may be formed by supplying high-frequency power under the following conditions: the substrate temperature is higher than or equal to 180° C. and lower than or equal to 400° C., preferably higher than or equal to 200° C. and lower than or equal to 370° C., a deposition gas containing silicon, a nitrogen gas, and an ammonia gas are used, and the pressure is higher than or equal to 20 Pa and lower than or equal to 250 Pa, preferably higher than or equal to 40 Pa and lower than or equal to 200 Pa.

Note that the flow rate of the nitrogen gas is set to 5 times or more and 50 times or less, preferably 10 times or more and 50 times or less the flow rate of the ammonia gas. The use of ammonia gas can promote decomposition of the deposition gas containing silicon and the nitrogen gas. This is because the ammonia gas is dissociated by plasma energy or heat energy, and energy generated by the dissociation contributes to decomposition of a bond of the deposition gas containing silicon and a bond of the nitrogen gas.

Through the above method, the silicon nitride layer 318c from which the hydrogen gas and the ammonia gas are less likely to be released can be formed. The silicon nitride layer 318c has low hydrogen content, and thus is dense and does not transmit or hardly transmit hydrogen, water, and oxygen.

Note that a defect state or a trap state is likely to be formed in the multilayer film 306 when the protective insulating film 318 is formed.

Next, third heat treatment is preferably performed. The description of the first heat treatment can be referred to for the third heat treatment. By the third heat treatment, excess oxygen is released from the gate insulating film 312 and/or the protective insulating film 318; thus, the number of defect states or trap states due to oxygen vacancies in the multilayer film 306 can be reduced in some cases. Note that in the multilayer film 306, an oxygen vacancy captures an adjacent oxygen atom, so that the oxygen vacancy seems to move in some cases.

In the above manner, the BGTC transistor can be manufactured.

In the transistor, the multilayer film 306 has a low density of defect states or trap states in at least the oxide semiconductor layer 306a serving as a channel formation region; thus, the transistor has stable electrical characteristics.

<2-3. Transistor Structure (2)>

In this section, a top-gate transistor is described. Here, a top-gate top-contact (TGTC) transistor, which is one kind of top-gate transistor, is described with reference to FIGS. 10A to 10C.

Figure 10A:
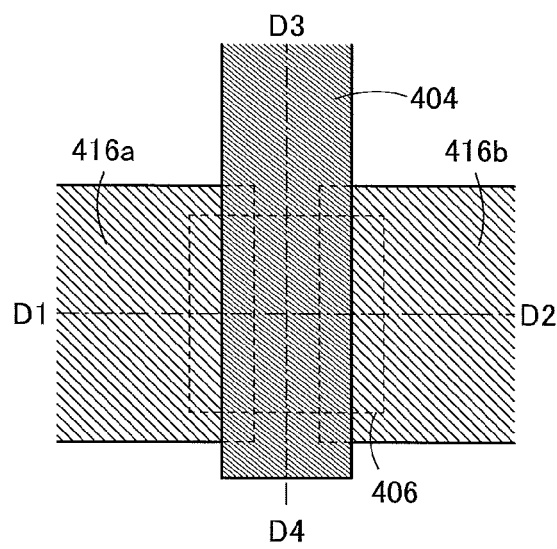
FIGS. 10A to 10C are a top view and cross-sectional views illustrating a semiconductor device of one embodiment of the present invention.
Figure 10C:
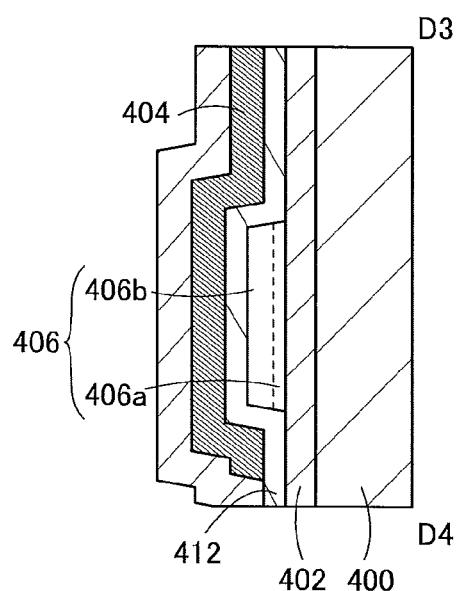
Figure 10B:
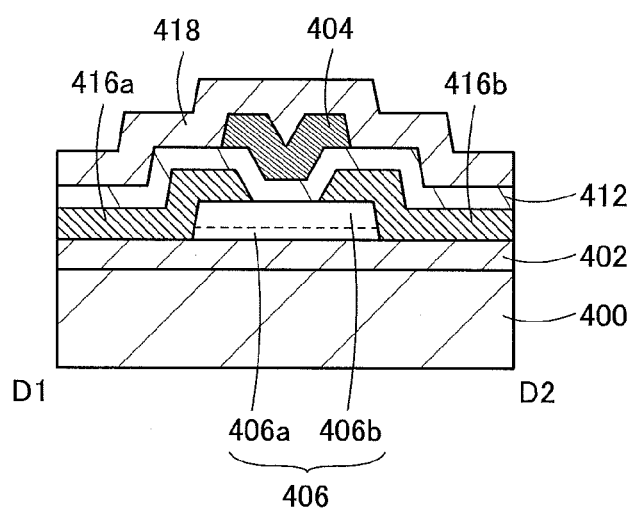

FIGS. 10A to 10C are a top view and cross-sectional views of the TGTC transistor. FIG. 10A is the top view of the transistor. FIG. 10B is the cross-sectional view taken along dashed-dotted line D1-D2 in FIG. 10A. FIG. 10C is the cross-sectional view taken along dashed-dotted line D3-D4 in FIG. 10A.

The transistor illustrated in FIG. 10B includes a base insulating film 402 over a substrate 400; a multilayer film 406 including an oxide semiconductor layer 406a over the base insulating film 402 and an oxide semiconductor layer 406b over the oxide semiconductor layer 406a; a source electrode 416a and a drain electrode 416b over the base insulating film 402 and the multilayer film 406; a gate insulating film 412 over the multilayer film 406, the source electrode 416a, and the drain electrode 416b; a gate electrode 404 over the gate insulating film 412; and a protective insulating film 418 over the gate insulating film 412 and the gate electrode 404. Note that the transistor does not necessarily include the base insulating film 402 and/or the protective insulating film 418.

Depending on the kind of a conductive film used for the source electrode 416a and the drain electrode 416b, oxygen is taken away from part of the oxide semiconductor layer 406b, or a mixed layer is formed, so that a source region and a drain region are formed in the oxide semiconductor layer 406b.

In FIG. 10A, the distance between the source electrode 416a and the drain electrode 416b in a region overlapping with the gate electrode 404 is referred to as a channel length. Note that in the case where the transistor includes the source region and the drain region, the distance between the source region and the drain region in the region overlapping with the gate electrode 404 may be referred to as a channel length.

Note that a channel formation region refers to a region which overlaps with the gate electrode 404 and is located between the source electrode 416a and the drain electrode 416b in the multilayer film 406. Further, a channel region refers to a region through which current mainly flows in the channel formation region. Here, the channel region is a portion of the oxide semiconductor layer 406b in the channel formation region.

For the multilayer film 406, the description of the multilayer film 306 is referred to. For example, for the oxide semiconductor layer 406a, the description of the oxide semiconductor layer 306b is referred to, and for the oxide semiconductor layer 406b, the description of the oxide semiconductor layer 306a is referred to.

For the substrate 400, the description of the substrate 300 is referred to. For the source electrode 416a and the drain electrode 416b, description of the source electrode 316a and the drain electrode 316b is referred to. For the gate insulating film 412, the description of the gate insulating film 312 is referred to. For the gate electrode 404, the description of the gate electrode 304 is referred to. For the protective insulating film 418, the description of the protective insulating film 318 is referred to.

Although the multilayer film 406 is covered with the gate electrode 404, the source electrode 416a, and the drain electrode 416b in FIG. 10A in order to suppress generation of carriers in the multilayer film 406 due to light, the multilayer film 406 is not necessarily covered with the gate electrode 404, the source electrode 416a, and the drain electrode 416b.

The base insulating film 402 may be formed of a single layer or a stacked layer using an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The base insulating film 402 may be, for example, a multilayer film including a silicon nitride layer as a first layer and a silicon oxide layer as a second layer. In that case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose spin density attributed to a signal with a g factor of 2.001 in ESR is lower than or equal to $3\times10^{17}$ spins/cm$^3$, preferably lower than or equal to $5\times10^{16}$ spins/cm$^3$ is used. As the silicon nitride layer, a silicon nitride layer from which hydrogen and ammonia are less likely to be released is used. The amount of released hydrogen or ammonia may be measured by TDS. Further, as the silicon nitride layer, a silicon nitride layer which does not transmit or hardly transmits hydrogen, water, and oxygen is used.

The base insulating film 402 may be, for example, a multilayer film including a silicon nitride layer as a first layer, a first silicon oxide layer as a second layer, and a second silicon oxide layer as a third layer. In that case, the first silicon oxide layer and/or the second silicon oxide layer may be a silicon oxynitride layer. In addition, the silicon nitride layer may be a silicon nitride oxide layer. As the first silicon oxide layer, a silicon oxide layer whose defect density is low is preferably used. Specifically, a silicon oxide layer whose spin density attributed to a signal with a g factor of 2.001 in ESR is lower than or equal to $3\times10^{17}$ spins/cm$^3$, preferably lower than or equal to $5\times10^{16}$ spins/cm$^3$ is used. As the second silicon oxide layer, a silicon oxide layer having excess oxygen is used. As the silicon nitride layer, a silicon nitride layer from which hydrogen and ammonia are less likely to be released is used. Further, as the silicon nitride layer, a silicon nitride layer which does not transmit or hardly transmits hydrogen, water, and oxygen is used.

In the case where at least one of the gate insulating film 412 and the base insulating film 402 contains excess oxygen, the density of defect states or trap states due to oxygen vacancies or the like in the oxide semiconductor layer 406b can be reduced.

In the above-described transistor, the channel is formed in the oxide semiconductor layer 406b of the multilayer film 406; thus, the transistor has stable electrical characteristics and high field-effect mobility.

<2-4. Method for Manufacturing Transistor Structure (2)>

A method for manufacturing the transistor is described here with reference to FIGS. 11A to 11C and FIGS. 12A and 12B.

First, the substrate 400 is prepared.

Next, an oxide semiconductor layer to be the oxide semiconductor layer 406a is formed. For the method for forming the oxide semiconductor layer to be the oxide semiconductor layer 406a, the description of the method for forming the oxide semiconductor layer 306b is referred to. Note that the oxide semiconductor layer 406a is formed so as to be a CAAC-OS film, a microcrystalline film, or an amorphous film. When the oxide semiconductor layer 406a is the CAAC-OS film, the microcrystalline film, or the amorphous film, an oxide semiconductor layer to be the oxide semiconductor layer 406b is likely to be a CAAC-OS film.

Next, an oxide semiconductor layer to be the oxide semiconductor layer 406b is formed. For the method for forming the oxide semiconductor layer to be the oxide semiconductor layer 406b, the description of the method for forming the oxide semiconductor layer 306a is referred to.

Next, first heat treatment is preferably performed. The first heat treatment can be performed at a temperature higher than or equal to 250° C. and lower than or equal to 650° C., preferably higher than or equal to 300° C. and lower than or equal to 500° C. The first heat treatment is performed in an inert gas atmosphere, an atmosphere containing an oxidizing gas at 10 ppm or more, 1% or more, or 10% or more, or under reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. By the first heat treatment, the crystallinity of the oxide semiconductor layer to be the oxide semiconductor layer 406b can be improved, and in addition, impurities such as hydrogen and water can be removed from the base insulating film 402, the oxide semiconductor layer to be the oxide semiconductor layer 406a, and/or the oxide semiconductor layer to be the oxide semiconductor layer 406b. Moreover, by the first heat treatment, the density of defect states or the density of trap states in the oxide semiconductor layer 406a and/or the oxide semiconductor layer 406b can be reduced. Accordingly, treatment like the first heat treatment sometimes can be called treatment for reducing the density of defect states or the density of trap states in an oxide semiconductor layer.

Figure 11A:
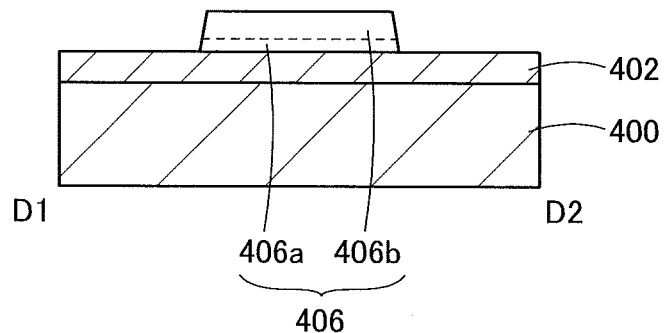
FIGS. 11A to 11C are cross-sectional views illustrating a method for manufacturing a semiconductor device of one embodiment of the present invention.

Next, the oxide semiconductor layer to be the oxide semiconductor layer 406a and the oxide semiconductor layer to be the oxide semiconductor layer 406b are partly etched to form the multilayer film 406 including the oxide semiconductor layer 406a and the oxide semiconductor layer 406b (see FIG. 11A).

Next, a conductive film to be the source electrode 416a and the drain electrode 416b is formed. For the method for forming the conductive film to be the source electrode 416a and the drain electrode 416b, the description of the method for forming the conductive film to be the source electrode 316a and the drain electrode 316b is referred to.

Figure 11B:
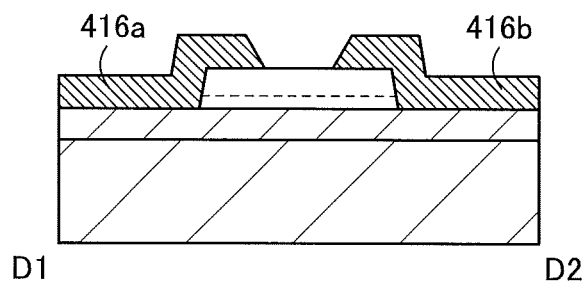

Next, the conductive film to be the source electrode 416a and the drain electrode 416b is partly etched to form the source electrode 416a and the drain electrode 416b (see FIG. 11B).

Note that a defect state or a trap state is likely to be formed in the multilayer film 406 when the conductive film to be the source electrode 416a and the drain electrode 416b is partly etched.

Next, second heat treatment is preferably performed. The description of the first heat treatment can be referred to for the second heat treatment. By the second heat treatment, impurities such as hydrogen and water can be removed from the multilayer film 406. Hydrogen easily moves especially in the multilayer film 406; thus, reducing hydrogen by the second heat treatment enables a reduction in the density of defect states or the density of trap states in the oxide semiconductor layer 406a and/or the oxide semiconductor layer 406b. Accordingly, the transistor can have stable electrical characteristics. Note that water is a compound containing hydrogen and thus may act as impurities in the oxide semiconductor layer 406a.

Figure 11C:
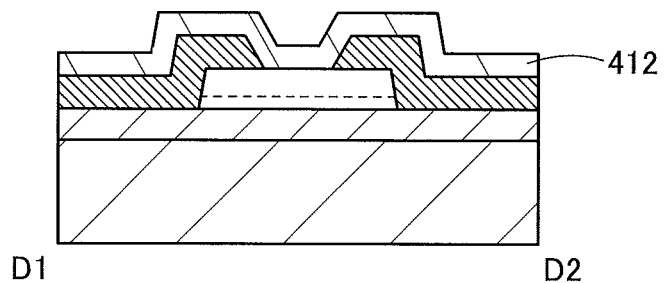

Next, the gate insulating film 412 is formed (see FIG. 11C). For the method for forming the gate insulating film 412, the description of the method for forming the gate insulating film 312 is referred to.

Note that a defect state or a trap state is likely to be formed in the multilayer film 406 when the gate insulating film 412 is formed.

Next, a conductive film to be the gate electrode 404 is formed. For the method for forming the conductive film to be the gate electrode 404, the description of the method for forming the conductive film to be the gate electrode 304 is referred to.

Figure 12A:
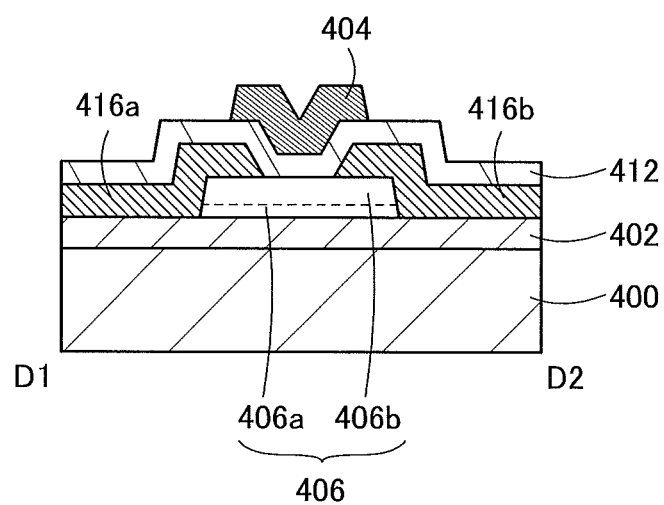
FIGS. 12A and 12B are cross-sectional views illustrating a method for manufacturing a semiconductor device of one embodiment of the present invention.

Next, the conductive film to be the gate electrode 404 is partly etched to form the gate electrode 404 (see FIG. 12A).

Figure 12B:
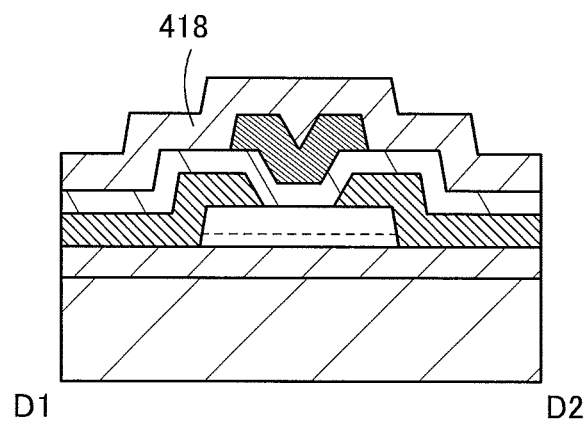

Then, the protective insulating film 418 is formed (see FIG. 12B). For the method for forming the protective insulating film 418, the description of the method for forming the protective insulating film 318 is referred to.

Next, third heat treatment is preferably performed. The description of the first heat treatment can be referred to for the third heat treatment. By the third heat treatment, excess oxygen is released from at least one of the base insulating film 402, the gate insulating film 412, and the protective insulating film 418; thus, the number of defect states or trap states due to oxygen vacancies in the multilayer film 406 can be reduced in some cases. Note that in the multilayer film 406, an oxygen vacancy captures an adjacent oxygen atom, so that the oxygen vacancy seems to move in some cases.

In the above manner, the TGTC transistor can be manufactured.

In the transistor, the multilayer film 406 has a low density of defect states or trap states in at least the oxide semiconductor layer 406b serving as a channel formation region; thus, the transistor has stable electrical characteristics.

<3. Application Products>

Application products using the above transistor are described below.

<3-1. Display Device>

In this section, a display device to which the above transistor is applied is described.

As a display element provided in the display device, a liquid crystal element (also referred to as a liquid crystal display element), a light-emitting element (also referred to as a light-emitting display element), or the like can be used. A light-emitting element includes, in its category, an element whose luminance is controlled by current or voltage, and specifically an inorganic electroluminescent (EL) element, an organic EL element, and the like. Furthermore, a display medium whose contrast is changed by an electric effect, such as electronic ink or an electrophoretic element, can be used as the display element. A display device including an EL element and a display device including a liquid crystal element are described below as examples of the display device.

The display device described below includes, in its category, a panel in which a display element is sealed and a module in which an IC such as a controller is mounted on the panel.

The display device described below refers to an image display device or a light source (including a lighting device). The display device includes any of the following modules in its category: a module provided with a connector such as an FPC or TCP; a module in which a printed wiring board is provided at the end of TCP; and a module in which an integrated circuit (IC) is mounted directly on a display element by a COG method.

<3-1-1. EL Display Device>

First, a display device including an EL element (also called an EL display device) is described.

Figure 13:
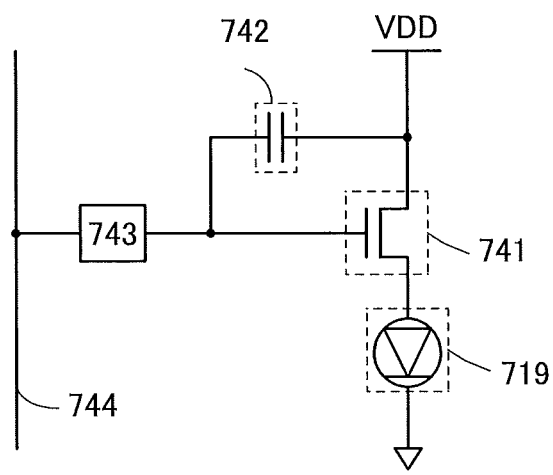
FIG. 13 is a circuit diagram illustrating an example of an EL display device of one embodiment of the present invention.

FIG. 13 is an example of a circuit diagram of a pixel in the EL display device.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, even when such portions are not specified, one embodiment of the present invention can be clear and it can be determined that one embodiment of the present invention is disclosed in this specification and the like in some cases. In particular, in the case where the number of portions to which the terminal is connected might be plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear and it can be determined that one embodiment of the present invention is disclosed in this specification and the like in some cases. Therefore, when a connection portion of a circuit is specified, the circuit is disclosed as one embodiment of the invention even when a function of the circuit is not specified, and one embodiment of the invention can be constituted. Alternatively, when a function of a circuit is specified, the circuit is disclosed as one embodiment of the invention even when a connection portion of the circuit is not specified, and one embodiment of the invention can be constituted.

The EL display device illustrated in FIG. 13 includes a switching element 743, a transistor 741, a capacitor 742, and a light-emitting element 719.

Note that FIG. 13 and the like each illustrate an example of a circuit configuration; thus, a transistor can be provided additionally. On the other hand, for each node in FIG. 13, it is also possible not to provide an additional transistor, switch, passive element, or the like. For example, it is possible not to increase the number of transistors directly connected to the node A, the node B, the node C, the node D, the node E, the node F, and/or the node G. Accordingly, for example, the following structure can be used: only the transistor 741 is directly connected to the node C and the other transistors are not directly connected to the node C.

A gate of the transistor 741 is electrically connected to one terminal of the switching element 743 and one terminal of the capacitor 742. A source of the transistor 741 is electrically connected to one terminal of the light-emitting element 719. A drain of the transistor 741 is electrically connected to the other terminal of the capacitor 742 and is supplied with a power supply potential VDD. The other terminal of the switching element 743 is electrically connected to a signal line 744. The other terminal of the light-emitting element 719 is supplied with a fixed potential. Note that the fixed potential is a ground potential GND or lower.

Note that as the transistor 741, any of the above transistors each of which includes the multilayer film including the oxide semiconductor layer is used. The transistor has stable electrical characteristics. Thus, the EL display device can have high display quality.

As the switching element 743, a transistor is preferably used. When the transistor is used as the switching element, the area of a pixel can be reduced, so that the EL display device can have high resolution. Any of the above transistors each of which includes the multilayer film including the oxide semiconductor layer may be used as the switching element 743. When any of the above transistors is used as the switching element 743, the switching element 743 can be formed in the same process as the transistor 741, so that the productivity of the EL display device can be improved.

Figure 14A:
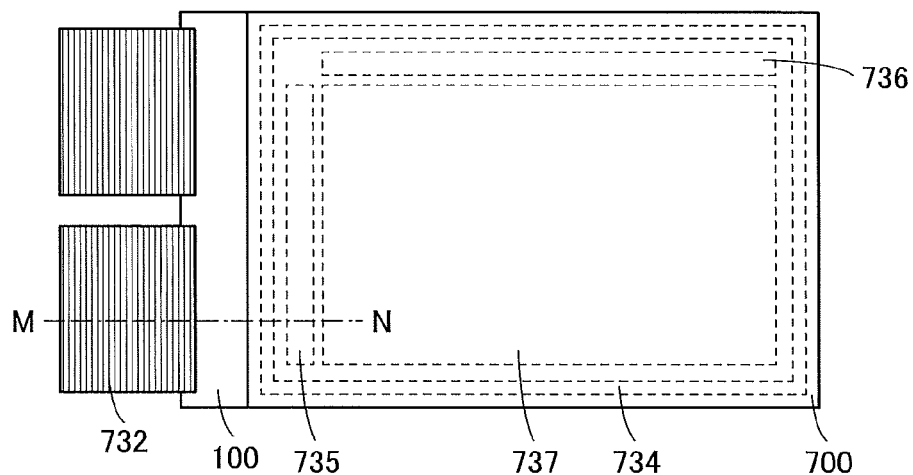
FIGS. 14A to 14C are a top view and cross-sectional views illustrating an example of an EL display device of one embodiment of the present invention.

FIG. 14A is a top view of an EL display device. The EL display device includes the substrate 300, a substrate 700, a sealant 734, a driver circuit 735, a driver circuit 736, a pixel 737, and an FPC 732. The sealant 734 is provided between the substrate 300 and the substrate 700 so as to surround the pixel 737, the driver circuit 735, and the driver circuit 736. Note that the driver circuit 735 and/or the driver circuit 736 may be provided outside the sealant 734.

Figure 14B:
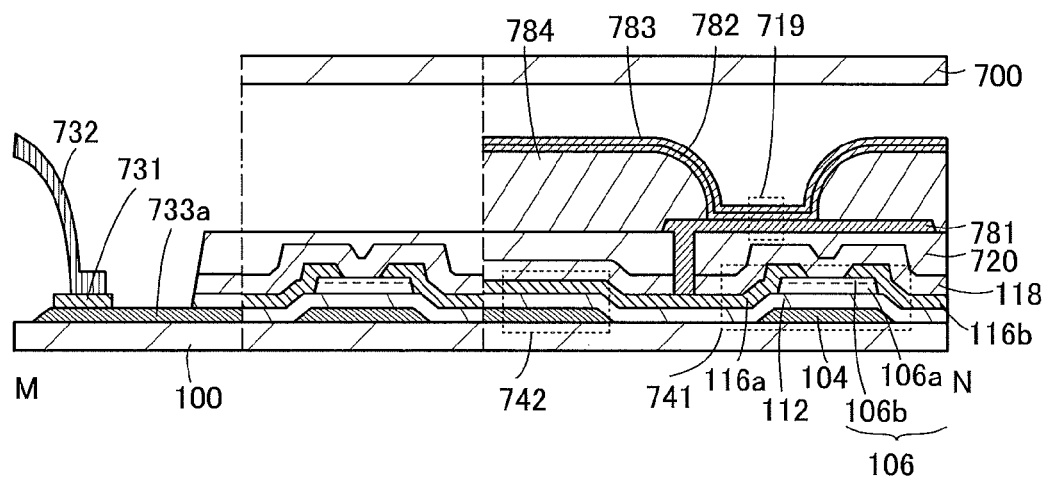

FIG. 14B is a cross-sectional view of the EL display device taken along dashed-dotted line M-N in FIG. 14A. The FPC 732 is connected to a wiring 733a via a terminal 731. Note that the wiring 733a is formed in the same layer as the gate electrode 304.

Note that FIG. 14B shows an example in which the transistor 741 and the capacitor 742 are provided in the same plane. With such a structure, the capacitor 742 can be formed in the same plane as a gate electrode, a gate insulating film, and a source electrode (drain electrode), which are included in the transistor 741. When the transistor 741 and the capacitor 742 are provided in the same plane in this manner, the number of manufacturing steps of the EL display device can be reduced; thus, the productivity can be improved.

FIG. 14B illustrates an example in which the transistor illustrated in FIGS. 7A to 7D is used as the transistor 741. Therefore, for components of the transistor 741 which are not particularly described below, the description on FIGS. 7A to 7D is referred to.

An insulating film 720 is provided over the transistor 741 and the capacitor 742.

Here, an opening reaching the source electrode 316a of the transistor 741 is provided in the insulating film 720 and the protective insulating film 318.

An electrode 781 is provided over the insulating film 720. The electrode 781 is connected to the source electrode 316a of the transistor 741 through the opening provided in the insulating film 720 and the protective insulating film 318.

A partition 784 having an opening reaching the electrode 781 is provided over the electrode 781.

A light-emitting layer 782 in contact with the electrode 781 through the opening provided in the partition 784 is provided over the partition 784.

An electrode 783 is provided over the light-emitting layer 782.

A region where the electrode 781, the light-emitting layer 782, and the electrode 783 overlap with one another serves as the light-emitting element 719.

Note that for the insulating film 720, the description of the protective insulating film 318 is referred to. Alternatively, a resin film of a polyimide resin, an acrylic resin, an epoxy resin, a silicone resin, or the like may be used.

Figure 14C:
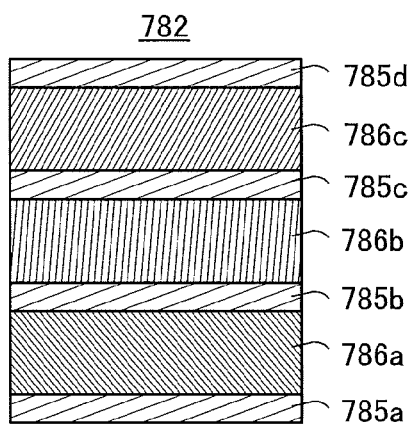

The light-emitting layer 782 is not limited to a single layer, and may be a stack of plural kinds of light-emitting layers and the like. For example, a structure illustrated in FIG. 14C may be employed. FIG. 14C illustrates a structure in which an intermediate layer 785a, a light-emitting layer 786a, an intermediate layer 785b, a light-emitting layer 786b, an intermediate layer 785c, a light-emitting layer 786c, and an intermediate layer 785d are stacked in this order. In that case, when light-emitting layers emitting light of appropriate colors are used as the light-emitting layer 786a, the light-emitting layer 786b, and the light-emitting layer 786c, the light-emitting element 719 with a high color rendering property or higher emission efficiency can be formed.

Plural kinds of light-emitting layers may be stacked to obtain white light. Although not illustrated in FIG. 14B, white light may be extracted through coloring layers.

Although the structure in which three light-emitting layers and four intermediate layers are provided is shown here, the structure is not limited thereto. The number of light-emitting layers and the number of intermediate layers can be changed as appropriate. For example, the light-emitting layer 782 can be formed with only the intermediate layer 785a, the light-emitting layer 786a, the intermediate layer 785b, the light-emitting layer 786b, and the intermediate layer 785c. Alternatively, the light-emitting layer 782 may be formed with the intermediate layer 785a, the light-emitting layer 786a, the intermediate layer 785b, the light-emitting layer 786b, the light-emitting layer 786c, and the intermediate layer 785d; the intermediate layer 785c may be omitted.

Further, the intermediate layer may have a stacked-layer structure including a hole-injection layer, a hole-transport layer, an electron-transport layer, an electron-injection layer, or the like. Note that not all of these layers need to be provided as the intermediate layer. Any of these layers may be selected as appropriate to form the intermediate layer. Note that layers having similar functions may be provided. Further, an electron-relay layer or the like may be added as appropriate as the intermediate layer, in addition to a carrier generation layer.

The electrode 781 can be formed using a conductive film having visible light permeability. Having visible light permeability means to have an average transmittance of 70% or more, particularly 80% or more in the visible light region (e.g., the range of wavelength of from 400 nm to 800 nm).

As the electrode 781, for example, an oxide film such as an In—Zn—W oxide film, an In—Sn oxide film, an In—Zn oxide film, an indium oxide film, a zinc oxide film, or a tin oxide film may be used. The above oxide film may contain a minute amount of Al, Ga, Sb, F, or the like. Further, a metal thin film having a thickness which enables light to be transmitted (preferably, approximately 5 nm to 30 nm) can also be used. For example, an Ag film, a Mg film, or an Ag—Mg alloy film with a thickness of 5 nm may be used.

Alternatively, the electrode 781 is preferably a film which efficiently reflects visible light. For example, a film containing lithium, aluminum, titanium, magnesium, lanthanum, silver, silicon, or nickel can be used as the electrode 781.

The electrode 783 can be formed using any of the films for the electrode 781. Note that when the electrode 781 has visible light permeability, it is preferable that the electrode 783 efficiently reflects visible light. When the electrode 781 efficiently reflects visible light, it is preferable that the electrode 783 have visible light permeability.

Positions of the electrode 781 and the electrode 783 are not limited to the structure illustrated in FIG. 14B, and the electrode 781 and the electrode 783 may be replaced with each other. It is preferable to use a conductive film having a high work function for the electrode which serves as an anode and a conductive film having a low work function for the electrode which serves as a cathode. Note that in the case where a carrier generation layer is provided in contact with the anode, a variety of conductive films can be used for the anode regardless of their work functions.

For the partition 784, the description of the protective insulating film 318 is referred to. Alternatively, a resin film of a polyimide resin, an acrylic resin, an epoxy resin, a silicone resin, or the like may be used.

The transistor 741 connected to the light-emitting element 719 has stable electrical characteristics. Thus, an EL display device having high display quality can be provided.

Figure 15A:
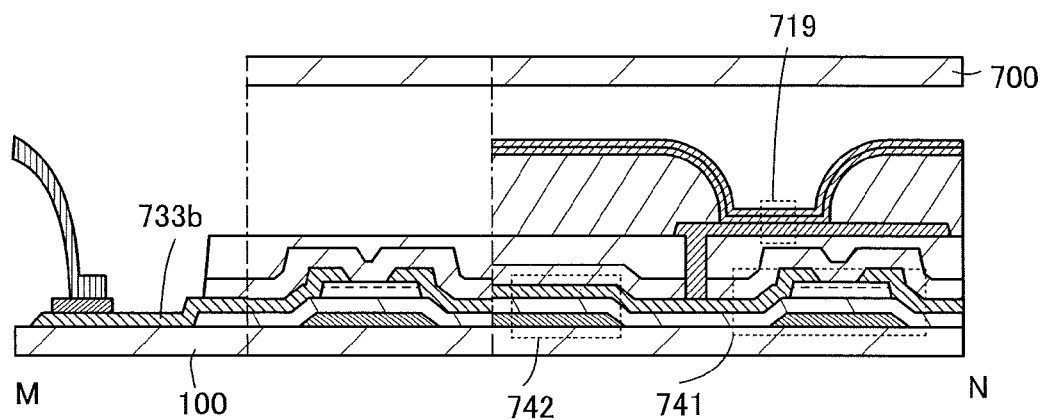
FIGS. 15A and 15B are cross-sectional views illustrating examples of EL display devices of one embodiment of the present invention.
Figure 15B:
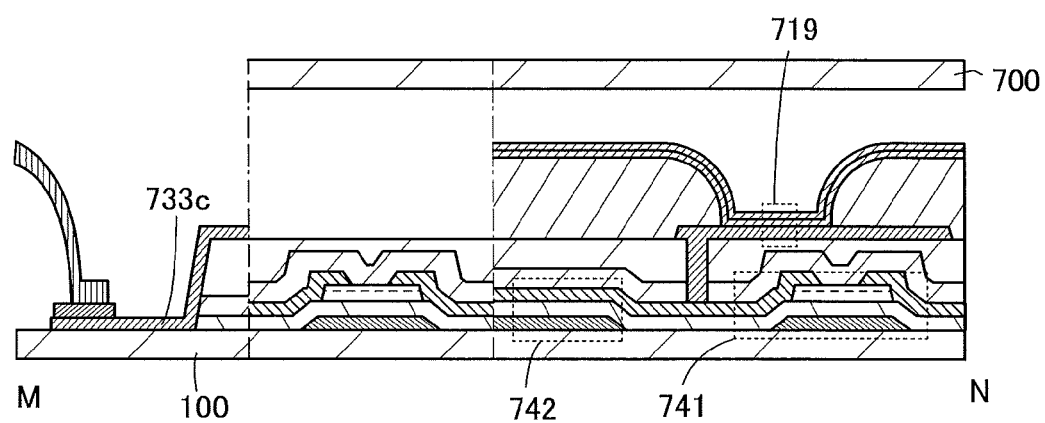

FIGS. 15A and 15B each illustrate an example of a cross section of an EL display device which is partly different from that in FIG. 14B. Specifically, the difference lies in a wiring connected to the FPC 732. In FIG. 15A, a wiring 733b is connected to the FPC 732 via the terminal 731. The wiring 733b is formed in the same layer as the source electrode 316a and the drain electrode 316b. In FIG. 15B, a wiring 733c is connected to the FPC 732 via the terminal 731. The wiring 733c is formed in the same layer as the electrode 781.

<3-1-2. Liquid Crystal Display Device>

Next, a display device including a liquid crystal element (also called a liquid crystal display device) is described.

Figure 16:
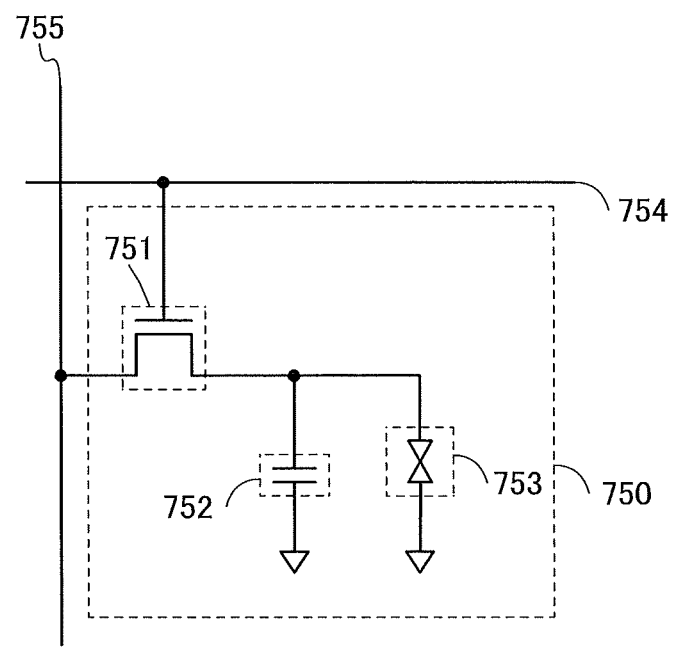
FIG. 16 is a circuit diagram illustrating an example of a liquid crystal display device of one embodiment of the present invention.

FIG. 16 is a circuit diagram showing a structural example of a pixel of the liquid crystal display device. A pixel 750 illustrated in FIG. 16 includes a transistor 751, a capacitor 752, and an element in which liquid crystal is injected between a pair of electrodes (hereinafter also referred to as liquid crystal element) 753.

One of a source and a drain of the transistor 751 is electrically connected to a signal line 755, and a gate of the transistor 751 is electrically connected to a scan line 754.

One of electrodes of the capacitor 752 is electrically connected to the other of the source and the drain of the transistor 751, and the other of the electrodes of the capacitor 752 is electrically connected to a wiring for supplying a common potential.

One of electrodes of the liquid crystal element 753 is electrically connected to the other of the source and the drain of the transistor 751, and the other of the electrodes of the liquid crystal element 753 is electrically connected to a wiring for supplying a common potential. Note that the common potential supplied to the other of the electrodes of the liquid crystal element 753 may be different from the common potential supplied to the wiring to which the other of the electrodes of the capacitor 752 is electrically connected.

Figure 17A:
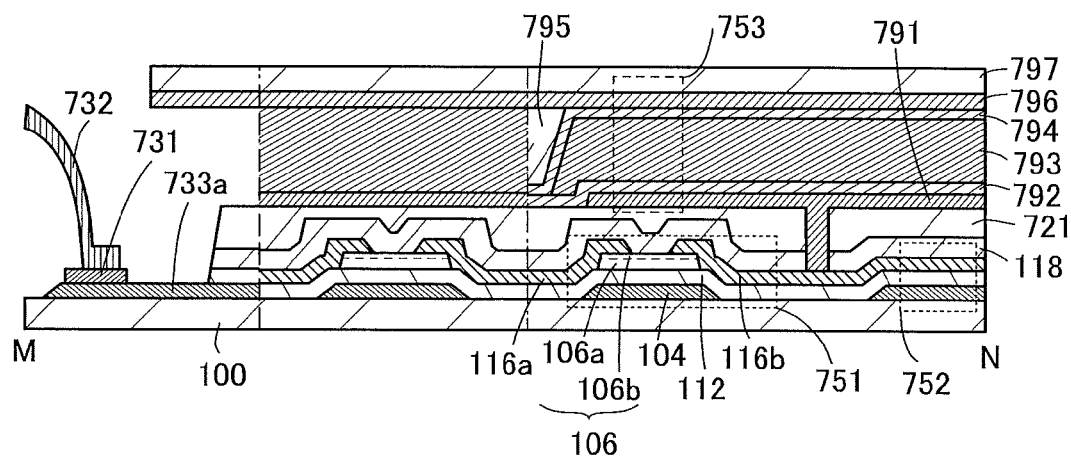
FIGS. 17A to 17C are cross-sectional views illustrating examples of liquid crystal display devices of one embodiment of the present invention.

Note that a top view of the liquid crystal display device is roughly similar to that of the EL display device. FIG. 17A is a cross-sectional view of the liquid crystal display device taken along dashed-dotted line M-N in FIG. 14A. In FIG. 17A, the FPC 732 is connected to the wiring 733a via the terminal 731. Note that the wiring 733a is formed in the same layer as the gate electrode 304.

Note that FIG. 17A illustrates an example in which the transistor 751 and the capacitor 752 are provided in the same plane. With such a structure, the capacitor 752 can be formed in the same plane as a gate electrode, a gate insulating film, and a source electrode (drain electrode), which are included in the transistor 751. When the transistor 751 and the capacitor 752 are provided in the same plane in this manner, the number of manufacturing steps of the liquid crystal display device can be reduced; thus, the productivity can be improved.

As the transistor 751, any of the above transistors can be used. In FIG. 17A, the transistor illustrated in FIGS. 7A to 7D is used as the transistor 751. Therefore, for components of the transistor 751 which are not particularly described below, the description of FIGS. 7A to 7D is referred to.

Note that the transistor 751 can be a transistor having extremely low off-state current. Thus, the charge held in the capacitor 752 is unlikely to leak and voltage applied to the liquid crystal element 753 can be retained for a long time. Thus, by turning off the transistor 751 when an image with little motion or a still image is displayed, power for the operation of the transistor 751 is not needed. As a result, the power consumption of the liquid crystal display device can be low.

An insulating film 721 is provided over the transistor 751 and the capacitor 752.

Here, an opening reaching the drain electrode 316b of the transistor 751 is provided in the insulating film 721 and the protective insulating film 318.

An electrode 791 is provided over the insulating film 721. The electrode 791 is in contact with the drain electrode 316b of the transistor 751 through the opening provided in the insulating film 721 and the protective insulating film 318.

An insulating film 792 serving as an alignment film is provided over the electrode 791.

A liquid crystal layer 793 is provided over the insulating film 792.

An insulating film 794 serving as an alignment film is provided over the liquid crystal layer 793.

A spacer 795 is provided over the insulating film 794.

An electrode 796 is provided over the spacer 795 and the insulating film 794.

A substrate 797 is provided over the electrode 796.

For the insulating film 721, the description of the protective insulating film 318 is referred to. Alternatively, a resin film of a polyimide resin, an acrylic resin, an epoxy resin, a silicone resin, or the like may be used.

For the liquid crystal layer 793, a thermotropic liquid crystal, a low-molecular liquid crystal, a polymer liquid crystal, a polymer-dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Note that as the liquid crystal layer 793, a liquid crystal exhibiting a blue phase may be used. In that case, the insulating films 792 and 794 serving as alignment films are not necessarily provided.

The electrode 791 can be formed using a conductive film having visible light permeability.

As the electrode 791, for example, an oxide film such as an In—Zn—W oxide film, an In—Sn oxide film, an In—Zn oxide film, an indium oxide film, a zinc oxide film, or a tin oxide film may be used. The above oxide film may contain a minute amount of Al, Ga, Sb, F, or the like. Further, a metal thin film having a thickness which enables light to be transmitted (preferably, approximately 5 nm to 30 nm) can also be used.

Alternatively, the electrode 791 is preferably a film which efficiently reflects visible light. For example, a film containing aluminum, titanium, chromium, copper, molybdenum, silver, tantalum, or tungsten can be used as the electrode 791.

The electrode 796 can be formed using any of the films for the electrode 791. Note that when the electrode 791 has visible light permeability, it is preferable that the electrode 796 efficiently reflect visible light. When the electrode 791 efficiently reflects visible light, it is preferable that the electrode 796 have visible light permeability.

Positions of the electrode 791 and the electrode 796 are not limited to the structure illustrated in FIG. 17A, and the electrode 791 and the electrode 796 may be replaced with each other.

Each of the insulating films 792 and 794 may be formed using an organic compound or an inorganic compound.

The spacer 795 may be formed using an organic compound or an inorganic compound. Note that the spacer 795 can have a variety of shapes such as a columnar shape and a spherical shape.

A region where the electrode 791, the insulating film 792, the liquid crystal layer 793, the insulating film 794, and the electrode 796 overlap with one another functions as the liquid crystal element 753.

As the substrate 797, a glass substrate, a resin substrate, a metal substrate, or the like can be used. The substrate 797 may have flexibility.

Figure 17B:
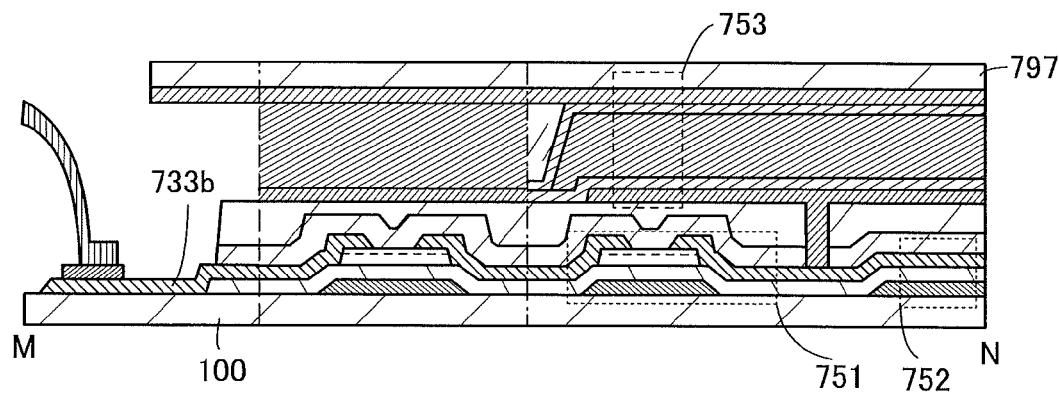
Figure 17C:
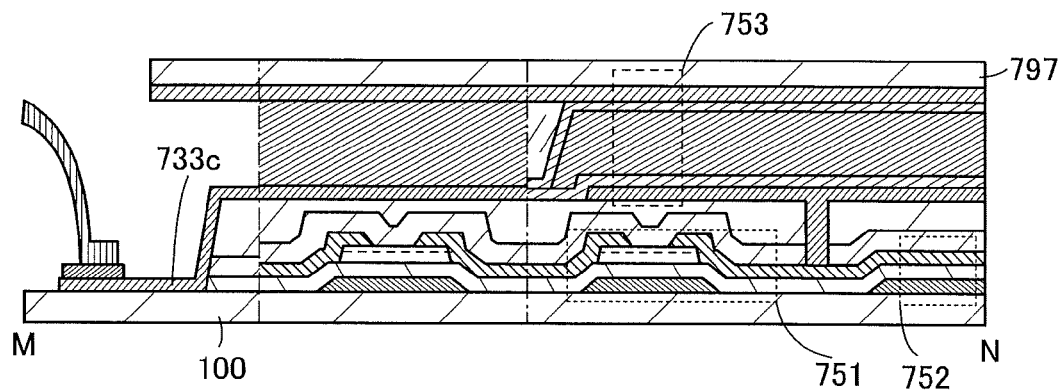

FIGS. 17B and 17C each illustrate an example of a cross section of a liquid crystal display device which is partly different from that in FIG. 17A. Specifically, the difference lies in a wiring connected to the FPC 732. In FIG. 17B, the wiring 733*b* is connected to the FPC 732 via the terminal 731. The wiring 733*b* is formed in the same layer as the source electrode 316*a* and the drain electrode 316*b*. In FIG. 17C, the wiring 733*c* is connected to the FPC 732 via the terminal 731. The wiring 733*c* is formed in the same layer as the electrode 791.

The transistor 751 connected to the liquid crystal element 753 has stable electrical characteristics. Thus, a liquid crystal display device having high display quality can be provided. Further, since the off-state current of the transistor 751 can be extremely low, a display device with low power consumption can be provided.

Operation modes of liquid crystal is described below, using examples. Driving methods of a liquid crystal of a liquid crystal display device include a vertical electric field method where voltage is applied perpendicular to a substrate and a horizontal electric field method where voltage is applied in parallel to a substrate.

First, FIGS. 18A1 and 18A2 are cross-sectional schematic views illustrating a pixel structure of a TN-mode liquid crystal display device.

A liquid crystal layer 3100 is held between a substrate 3101 and a substrate 3102 which are arranged so as to face each other. A polarizing plate 3103 is formed on the substrate 3101 side and a polarizing plate 3104 is formed on the substrate 3102 side. The absorption axis of the polarizing plate 3103 and the absorption axis of the polarizing plate 3104 are arranged in a cross-Nicol state.

Although not illustrated, a backlight and the like are provided outside the polarizing plate 3104. An electrode 3108 and an electrode 3109 are provided on the substrate 3101 and the substrate 3102, respectively. The electrode 3108 on the opposite side to the backlight, that is, on the viewing side, is formed to have a light-transmitting property.

In the case where a liquid crystal display device having such a structure is in a normally white mode, when voltage is applied between the electrode 3108 and the electrode 3109 (referred to as a vertical electric field method), liquid crystal molecules 3105 are aligned vertically as illustrated in FIG. 18A1. Thus, the light from the backlight cannot pass through the polarizing plate 3103, which leads to black display.

When no voltage is applied between the electrode 3108 and the electrode 3109, the liquid crystal molecules 3105 are aligned horizontally and twisted on a plane surface as illustrated in FIG. 18A2. As a result, light from the backlight can pass through the polarizing plate 3103, which leads to white display. In addition, the gray scale can be expressed by adjusting the voltage applied between the electrode 3108 and the electrode 3109. In this manner, a predetermined image is displayed.

At this time, full color display can be performed by providing a coloring layer. The coloring layer can be provided on either the substrate 3101 side or on the substrate 3102 side.

A known liquid crystal molecule may be used as a liquid crystal material for the TN mode.

FIGS. 18B1 and 18B2 are cross-sectional schematic views illustrating a pixel structure of a VA-mode liquid crystal display device. In the VA mode, the liquid crystal molecules 3105 are aligned such that they are perpendicular to the substrate when there is no electric field.

As in FIGS. 18A1 and 18A2, the electrode 3108 and the electrode 3109 are provided on the substrate 3101 and the substrate 3102, respectively. The electrode 3108 on the opposite side to the backlight, that is, on the viewing side, is formed to have a light-transmitting property. The polarizing plate 3103 is formed on the substrate 3101 side, and the polarizing plate 3104 is formed on the substrate 3102 side. The absorption axis of the polarizing plate 3103 and the absorption axis of the polarizing plate 3104 are arranged in a cross-Nicol state.

When voltage is applied between the electrode 3108 and the electrode 3109 (the vertical electric field method) in a liquid crystal display device having such a structure, the liquid crystal molecules 3105 are aligned horizontally as illustrated in FIG. 18B1. Thus, light from the backlight can pass through the polarizing plate 3103, which leads to white display.

When no voltage is applied between the electrode 3108 and the electrode 3109, the liquid crystal molecules 3105 are aligned vertically as illustrated in FIG. 18B2. As a result, light from the backlight which is polarized by the polarizing plate 3104 passes through a cell without being influenced by birefringence of the liquid crystal molecules 3105. Thus, the light from the backlight which is polarized cannot pass through the polarizing plate 3103, which leads to black display. In addition, the gray scale can be expressed by adjusting the voltage applied between the electrode 3108 and the electrode 3109. In this manner, a predetermined image is displayed.

At this time, full color display can be performed by providing a coloring layer. The coloring layer can be provided on either the substrate 3101 side or on the substrate 3102 side.

FIGS. 18C1 and 18C2 are cross-sectional schematic views illustrating a pixel structure of an MVA-mode liquid crystal display device. The MVA mode is a method in which one pixel is divided into a plurality of portions, and the portions have different alignment directions of the liquid crystal molecules 3105 and compensate the viewing angle dependencies with each other. As illustrated in FIG. 18C1, in the MVA mode, a protrusion 3158 whose cross section is a triangle is provided on the electrode 3108 and a protrusion 3159 whose cross section is a triangle is provided on the electrode 3109 for controlling alignment. Note that the other structures are similar to those of the VA mode.

When voltage is applied between the electrode 3108 and the electrode 3109 (the vertical electric field method), the liquid crystal molecules 3105 are aligned so that a long axis of the liquid crystal molecule 3105 is substantially vertical to surfaces of the protrusions 3158 and 3159 as illustrated in FIG. 18C1. Thus, light from the backlight can pass through the polarizing plate 3103, which leads to white display.

When no voltage is applied between the electrode 3108 and the electrode 3109, the liquid crystal molecules 3105 are aligned vertically as illustrated in FIG. 18C2. As a result, light from the backlight cannot pass through the polarizing plate 3103, which leads to black display. In addition, the gray scale can be expressed by adjusting the voltage applied between the electrode 3108 and the electrode 3109. In this manner, a predetermined image is displayed.

At this time, full color display can be performed by providing a coloring layer. The coloring layer can be provided on either the substrate 3101 side or on the substrate 3102 side.

Figure 21A:
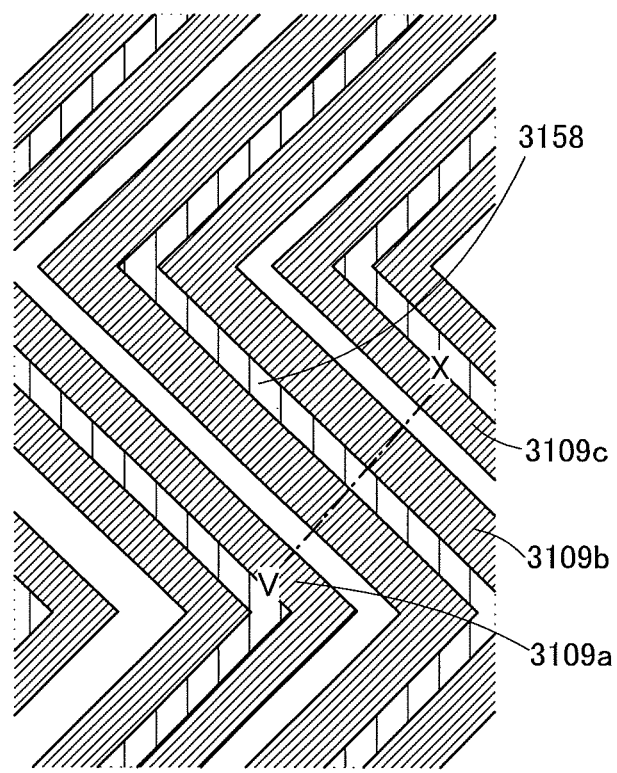
FIGS. 21A and 21B are a top view and a cross-sectional view illustrating an example of a pixel of a liquid crystal display device of one embodiment of the present invention.
Figure 21B:
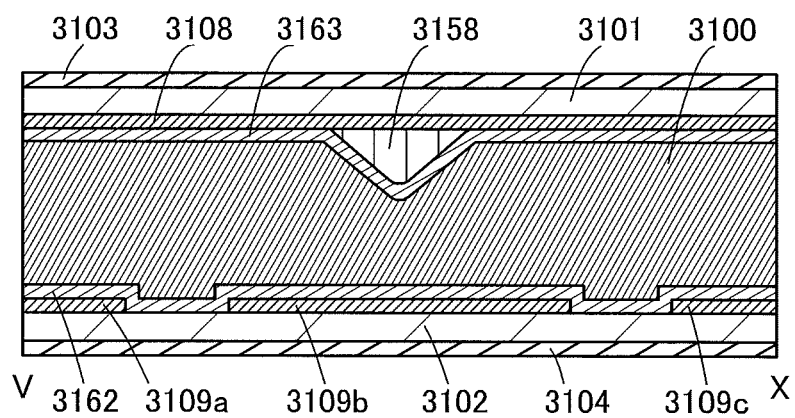

FIGS. 21A and 21B are a top view and a cross-sectional view, respectively, of another example of the MVA mode. As illustrated in FIG. 21A, an electrode 3109a, an electrode 3109b, and an electrode 3109c are each formed into a bent pattern like a dogleg-like shape (V-like shape). As illustrated in FIG. 21B, an insulating film 3162 and an insulating film 3163 which function as alignment films are formed over the electrodes 3109a, 3109b, and 3109c and over the electrode 3108, respectively. The protrusion 3158 is formed on the electrode 3108 so as to overlap with the electrode 3109b.

FIGS. 19A1 and 19A2 are cross-sectional schematic views illustrating a pixel structure of an OCB-mode liquid crystal display device. In the OCB mode, the liquid crystal molecules 3105 in a liquid crystal layer are aligned so that they compensate the viewing angle dependence. This alignment is called a bend alignment.

As in FIGS. 18A1 to 18C2, the electrode 3108 is provided on the substrate 3101 and the electrode 3109 is provided on the substrate 3102. The electrode 3108 on the opposite side to the backlight, that is, on the viewing side, is formed to have a light-transmitting property. The polarizing plate 3103 is formed on the substrate 3101 side, and the polarizing plate 3104 is formed on the substrate 3102 side. The absorption axis of the polarizing plate 3103 and the absorption axis of the polarizing plate 3104 are arranged in a cross-Nicol state.

When voltage is applied between the electrode 3108 and the electrode 3109 (the vertical electric field method) in a liquid crystal display device having such a structure, black display is performed. At this time, the liquid crystal molecules 3105 are aligned vertically as illustrated in FIG. 19A1. Thus, the light from the backlight cannot pass through the polarizing plate 3103, which leads to black display.

When no voltage is applied between the electrode 3108 and the electrode 3109, the liquid crystal molecules 3105 exist in a bend alignment state as illustrated in FIG. 19A2. As a result, light from the backlight can pass through the polarizing plate 3103, which leads to white display. In addition, the gray scale can be expressed by adjusting the voltage applied between the electrode 3108 and the electrode 3109. In this manner, a predetermined image is displayed.

At this time, full color display can be performed by providing a coloring layer. The coloring layer can be provided on either the substrate 3101 side or on the substrate 3102 side.

In such an OCB mode, alignment of the liquid crystal molecules 3105 can compensate the viewing angle dependence. In addition, a contrast ratio can be increased by a pair of stacked layers including polarizers.

FIGS. 19B1 and 19B2 are cross-sectional schematic views illustrating pixel structures of an FLC-mode liquid crystal display device or an AFLC-mode liquid crystal display device.

As in FIGS. 18A1 to 18C2, the electrode 3108 is provided on the substrate 3101 and the electrode 3109 is provided on the substrate 3102. The electrode 3108 on the opposite side to the backlight, that is, on the viewing side, is formed to have a light-transmitting property. The polarizing plate 3103 is formed on the substrate 3101 side, and the polarizing plate 3104 is formed on the substrate 3102 side. The absorption axis of the polarizing plate 3103 and the absorption axis of the polarizing plate 3104 are arranged in a cross-Nicol state.

In the liquid crystal display device having such a structure, when voltage is applied between the electrode 3108 and the electrode 3109 (referred to as vertical electric field method), the liquid crystal molecules 3105 are aligned horizontally in a direction deviated from a rubbing direction as illustrated in FIG. 19B1. As a result, light from the backlight can pass through the polarizing plate 3103, which leads to white display.

When no voltage is applied between the electrode 3108 and the electrode 3109, the liquid crystal molecules 3105 are aligned horizontally along the rubbing direction as illustrated in FIG. 19B2. Thus, the light from the backlight cannot pass through the polarizing plate 3103, which leads to black display. In addition, the gray scale can be expressed by adjusting the voltage applied between the electrode 3108 and the electrode 3109. In this manner, a predetermined image is displayed.

At this time, full color display can be performed by providing a coloring layer. The coloring layer can be provided on either the substrate 3101 side or on the substrate 3102 side.

A known liquid crystal molecule may be used for the FLC-mode liquid crystal display device or the AFLC-mode liquid crystal display device.

FIGS. 20A1 and 20A2 are cross-sectional schematic views illustrating a pixel structure of an IPS-mode liquid crystal display device. The IPS mode is a mode in which the liquid crystal molecules 3105 are rotated in a plane parallel to a substrate by horizontal electric field generated by the electrodes provided for only one substrate side.

The IPS mode is characterized in that liquid crystals are controlled by a pair of electrodes which are provided on one substrate. Thus, a pair of electrodes 3150 and 3151 are provided over the substrate 3102. The pair of electrodes 3150 and 3151 each preferably have a light-transmitting property. The polarizing plate 3103 is formed on the substrate 3101 side, and the polarizing plate 3104 is formed on the substrate 3102 side. The absorption axis of the polarizing plate 3103 and the absorption axis of the polarizing plate 3104 are arranged in a cross-Nicol state.

When voltage is applied between the pair of electrodes 3150 and 3151 in the liquid crystal display device having such a structure, the liquid crystal molecules 3105 are aligned along an electric flux line deviated from a rubbing direction as illustrated in FIG. 20A1. Thus, light from the backlight can pass through the polarizing plate 3103, which leads to white display.

When no voltage is applied between the pair of electrodes 3150 and 3151, the liquid crystal molecules 3105 are aligned horizontally along the rubbing direction as illustrated in FIG. 20A2. As a result, light from the backlight cannot pass through the polarizing plate 3103, which leads to black display. In addition, the grayscale can be expressed by adjusting the voltage applied between the pair of electrodes 3150 and 3151. In this manner, a predetermined image is displayed.

At this time, full color display can be performed by providing a coloring layer. The coloring layer can be provided on either the substrate 3101 side or on the substrate 3102 side.

Figure 22A:
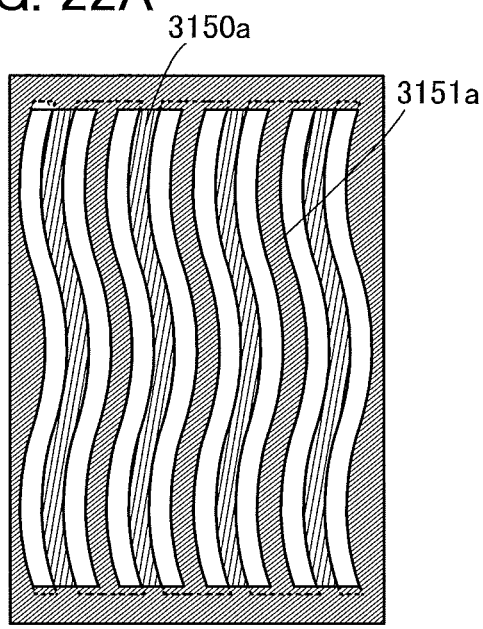
FIGS. 22A to 22C are top views each illustrating an example of a pixel of a liquid crystal display device of one embodiment of the present invention.
Figure 22B:
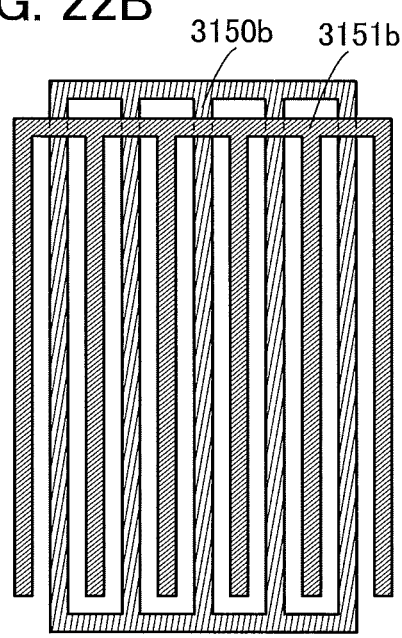
Figure 22C:
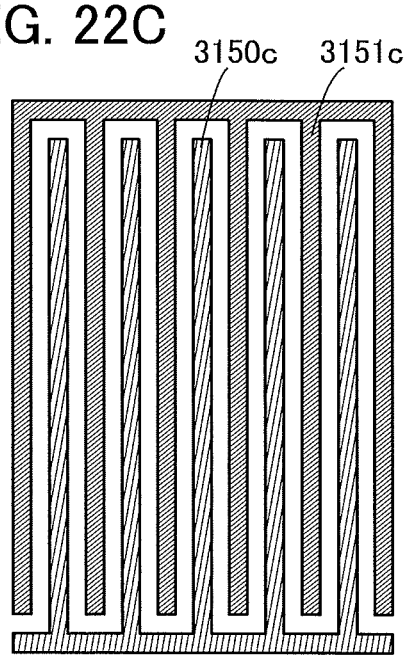

FIGS. 22A to 22C each illustrate an example of the pair of electrodes 3150 and 3151 that can be used in the IPS mode. As illustrated in top views of FIGS. 22A to 22C, the pair of electrodes 3150 and 3151 are arranged alternately. In FIG. 22A, electrodes 3150$a$ and 3151$a$ each have a wave-like shape. In FIG. 22B, electrodes 3150$b$ and 3151$b$ each have a comb-like shape and partly overlap with each other. In FIG. 22C, electrodes 3150$c$ and 3151$c$ have a comb-like shape in which the electrodes are meshed with each other.

FIGS. 20B1 and 20B2 are cross-sectional schematic views illustrating a pixel structure of an FFS-mode liquid crystal display device. The FFS mode is also a horizontal electric field method as in the IPS mode and has a structure in which the electrode 3151 is formed over the electrode 3150 with an insulating film 3154 provided therebetween as illustrated in FIGS. 20B1 and 20B2.

The pair of electrodes 3150 and 3151 each preferably have a light-transmitting property. The polarizing plate 3103 is formed on the substrate 3101 side, and the polarizing plate 3104 is formed on the substrate 3102 side. The absorption axis of the polarizing plate 3103 and the absorption axis of the polarizing plate 3104 are arranged in a cross-Nicol state.

When voltage is applied between the pair of electrodes 3150 and 3151 in a liquid crystal display device having such a structure, the liquid crystal molecules 3105 are aligned along an electric flux line deviated from a rubbing direction as illustrated in FIG. 20B 1. Thus, light from the backlight can pass through the polarizing plate 3103, which leads to white display.

When no voltage is applied between the pair of electrodes 3150 and 3151, the liquid crystal molecules 3105 are aligned horizontally along the rubbing direction as illustrated in FIG. 20B2. As a result, light from the backlight cannot pass through the polarizing plate 3103, which leads to black display. In addition, the grayscale can be expressed by adjusting the voltage applied between the pair of electrodes 3150 and 3151. In this manner, a predetermined image is displayed.

At this time, full color display can be performed by providing a coloring layer. The coloring layer can be provided on either the substrate 3101 side or on the substrate 3102 side.

Figure 23A:
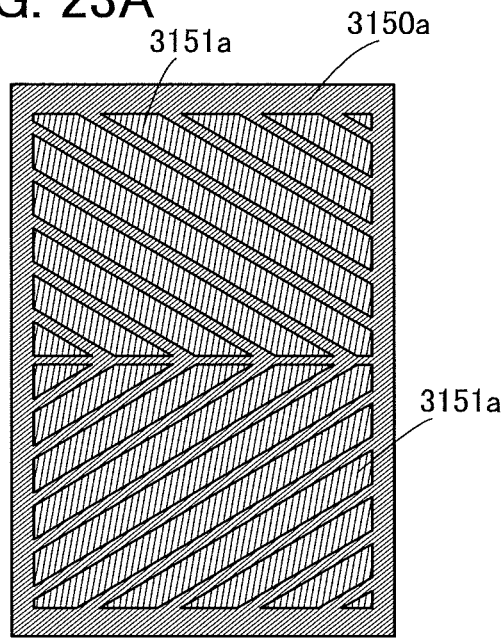
FIGS. 23A to 23C are top views each illustrating an example of a pixel of a liquid crystal display device of one embodiment of the present invention.
Figure 23B:
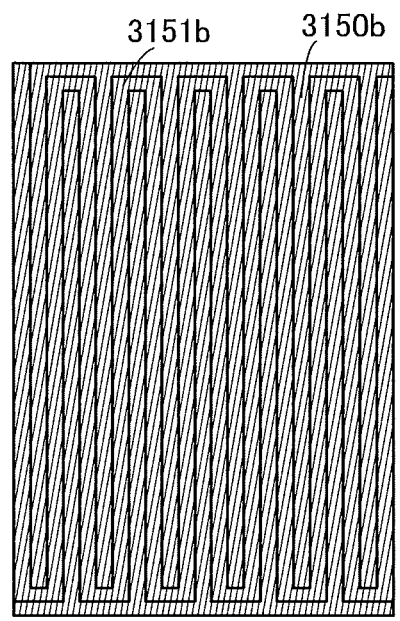
Figure 23C:
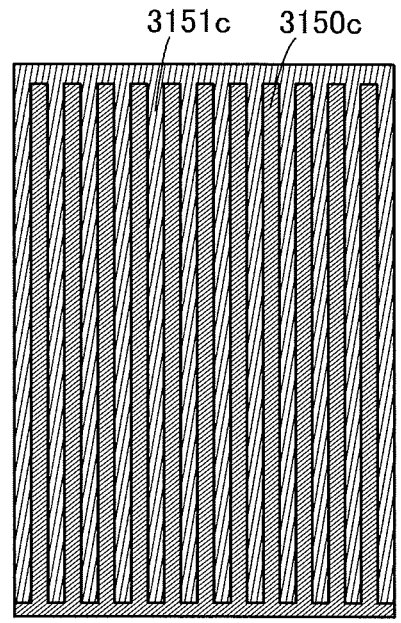

FIGS. 23A to 23C each show an example of the pair of electrodes 3150 and 3151 that can be used in the FFS mode. As illustrated in top views of FIGS. 23A to 23C, the electrodes 3151 are formed into various patterns over the electrodes 3150. In FIG. 23A, the electrode 3151$a$ over the electrode 3150$a$ has a bent dogleg-like shape (V-like shape). In FIG. 23B, the electrode 3151$b$ over the electrode 3150$b$ has a comb-like shape in which the electrodes are meshed with each other. In FIG. 23C, the electrode 3151$c$ over the electrode 3150$c$ has a comb-like shape.

A known liquid crystal molecule may be used for the IPS-mode liquid crystal display device and the FFS-mode liquid crystal display device.

Another operation mode such as a PVA mode, an ASM mode, or a TBA mode may be employed.

In the liquid crystal display device, a black matrix (a light-blocking layer), an optical member (an optical substrate) such as a polarizing member, a retardation member, or an anti-reflection member, and the like are provided as appropriate. For example, circular polarization may be employed by using a polarizing substrate and a retardation substrate. In addition, a backlight, a side light, or the like may be used as a light source.

In addition, it is possible to employ a time-division display method (field-sequential driving method) with the use of a plurality of light-emitting diodes (LEDs) for a backlight. A field-sequential driving method enables color display without using a coloring layer.

As a display method in the pixel portion, a progressive method, an interlace method, or the like is employed. Further, color elements controlled in a pixel at the time of color display are not limited to three colors: R, G, and B (R, G and B correspond to red, green, and blue, respectively). For example, R, G, B, and W (W corresponds to white), or R, G, B, and one or more of yellow, cyan, magenta, and the like can be used. Further, the sizes of display regions may be different between respective dots of color elements. Note that one embodiment of the present invention is not limited to a color liquid crystal display device and can be applied to a monochrome liquid crystal display device.

<3-2. Touch Sensor>

A structure example of a sensor that can sense proximity or a touch of an object (hereinafter referred to as a touch sensor) which is one embodiment of the present invention is described below.

For a touch sensor, a variety of types such as a capacitive type, a resistive type, a surface acoustic wave type, an infrared type, and an optical type can be used.

Typical examples of a capacitive touch sensor are a surface capacitive touch sensor and a projected capacitive touch sensor. Further, examples of the projected capacitive touch sensor are a self capacitive touch sensor and a mutual capacitive touch sensor, which differ mainly in the driving method. The use of a mutual capacitive touch sensor is preferable because multiple points can be sensed simultaneously.

<3-2-1. Example of Detection Method of Touch Sensor>

Figure 24A:
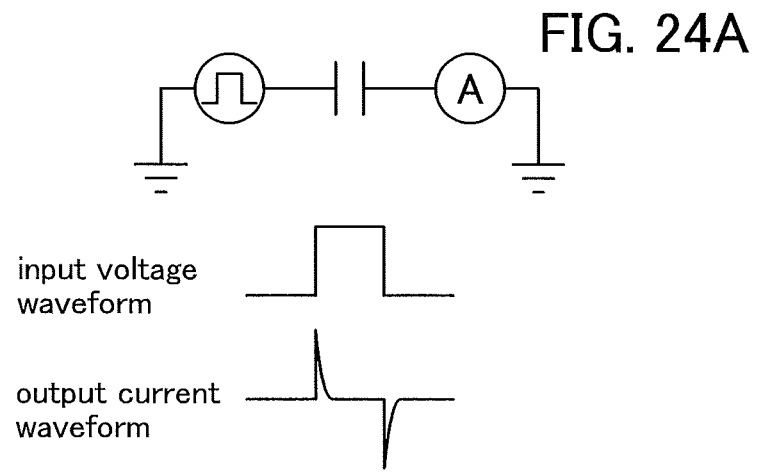
FIGS. 24A to 24C are views for explaining a touch sensor of an embodiment.
Figure 24B:
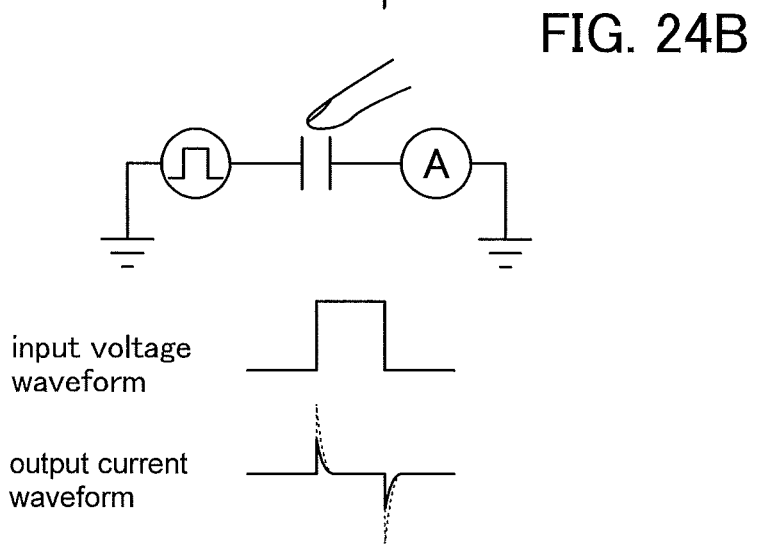

FIGS. 24A and 24B are schematic diagrams each illustrating a structure of a mutual capacitive touch sensor and input and output waveforms. The touch sensor includes a pair of electrodes. Capacitance is formed between the pair of electrodes. Input voltage is input to one of the pair of electrodes. Further, a detection circuit which detects current flowing in the other electrode (or a potential of the other electrode) is provided.

For example, in the case where a rectangular wave is used as an input voltage waveform as illustrated in FIG. 24A, a waveform having a sharp peak is detected as an output current waveform.

Further, in the case where a conductive object is close to or touches a capacitor as illustrated in FIG. 24B, the capacitance value between the electrodes is decreased; accordingly, the value of output current is decreased.

By detecting a change in capacitance by using a change in output current (or potential) with respect to input voltage in this manner, proximity or a touch of an object can be detected.

<3-2-2. Structure Example of Touch Sensor>

Figure 24C:
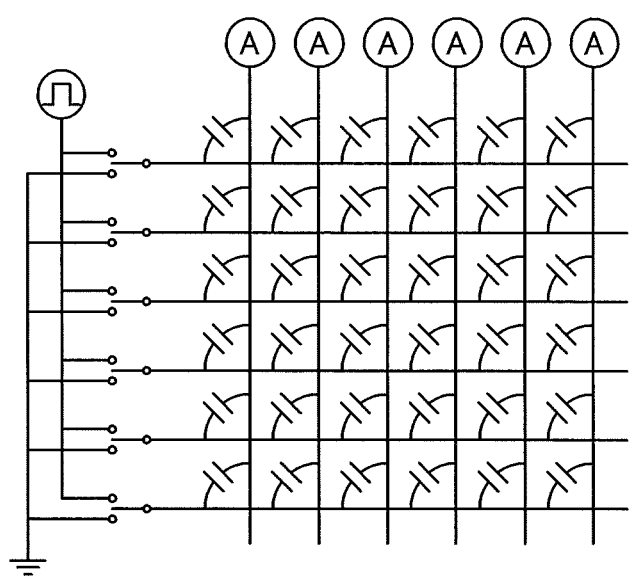

FIG. 24C illustrates a structure example of a touch sensor provided with a plurality of capacitors arranged in a matrix.

The touch sensor includes a plurality of wirings extending in the X direction (the horizontal direction of this figure) and a plurality of wirings extending in the Y direction (the vertical direction of this figure) which intersect with the plurality of wirings. Capacitance is formed between two wirings intersecting with each other.

One of input voltage and a common potential (including a grounded potential and a reference potential) is input to the wiring extending in the X direction. Further, a detection circuit (e.g., a source meter or a sense amplifier) is electrically connected to each of the wirings extending in the Y direction and can detect current flowing through the wiring (or a potential of the wiring).

The touch sensor can perforin sensing two dimensionally in such a manner that the touch sensor sequentially scans the plurality of wirings extending in the X direction so that input voltage is input and detects a change in current flowing through the wirings extending in the Y direction (or potentials of the wirings).

<3-2-3. Structure Example of Touch Panel>

A structure example of a touch panel incorporating the touch sensor into a display portion including a plurality of pixels is described below. Here, an example where a liquid crystal element is used as a display element provided in the pixel is shown. Note that an EL element may be used as the display element provided in the pixel.

Figure 25A:
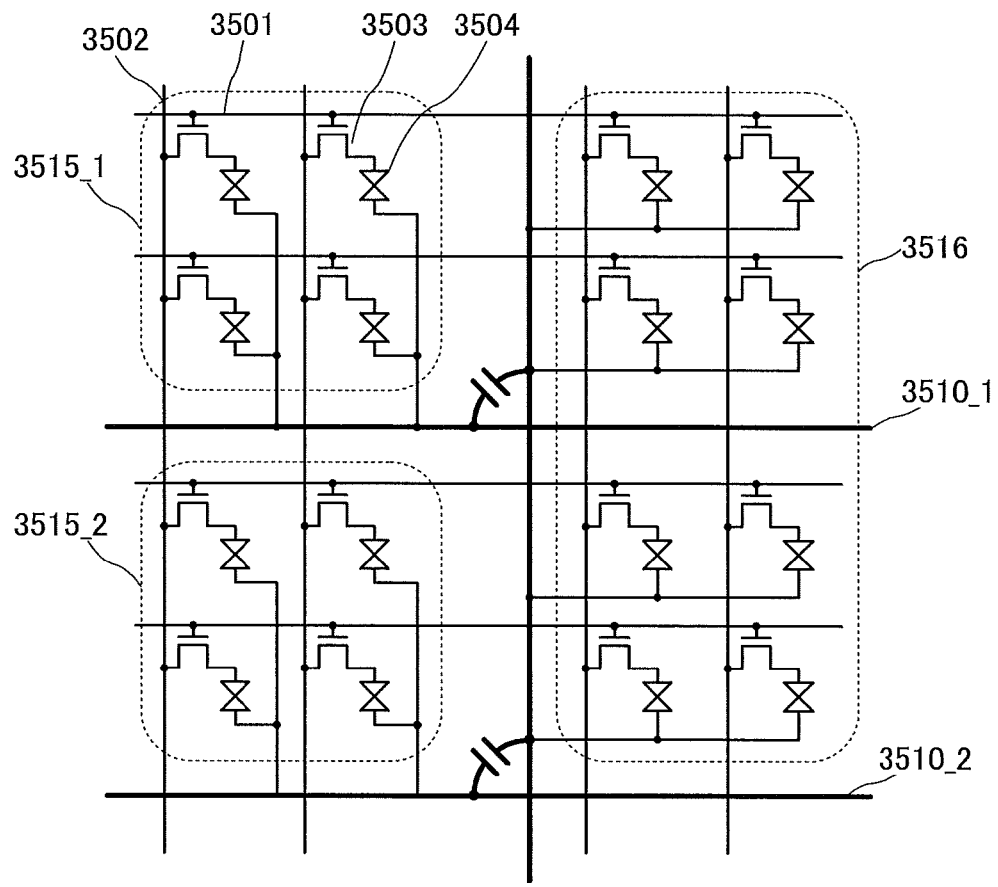
FIGS. 25A and 25B illustrate a pixel provided with a touch sensor of an embodiment.

FIG. 25A is an equivalent circuit diagram of part of a pixel circuit provided in the display portion of the touch panel described in this structure example.

Each pixel includes at least a transistor 3503 and a liquid crystal element 3504. In addition, a gate of the transistor 3503 is electrically connected to a wiring 3501, and one of a source and a drain of the transistor 3503 is electrically connected to a wiring 3502.

The pixel circuit includes a plurality of wirings extending in the X direction (e.g., a wiring 3510_1 and a wiring 3510_2) and a plurality of wirings extending in the Y direction (e.g., wirings 3511). These wirings are provided to intersect with each other, and capacitance is formed therebetween.

Among the pixels provided in the pixel circuit, ones of electrodes of the liquid crystal elements of some pixels adjacent to each other are electrically connected to each other to form one block. The block is classified into two types: an island-shaped block (e.g., a block 3515_1 or a block 3515_2) and a linear block (e.g., a block 3516) extending in the Y direction.

The wiring 3510_1 (or 3510_2) extending in the X direction is electrically connected to the island-shaped block 3515_1 (or the block 3515_2). Further, the wiring 3511 extending in the Y direction is electrically connected to the linear block 3516.

Figure 25B:
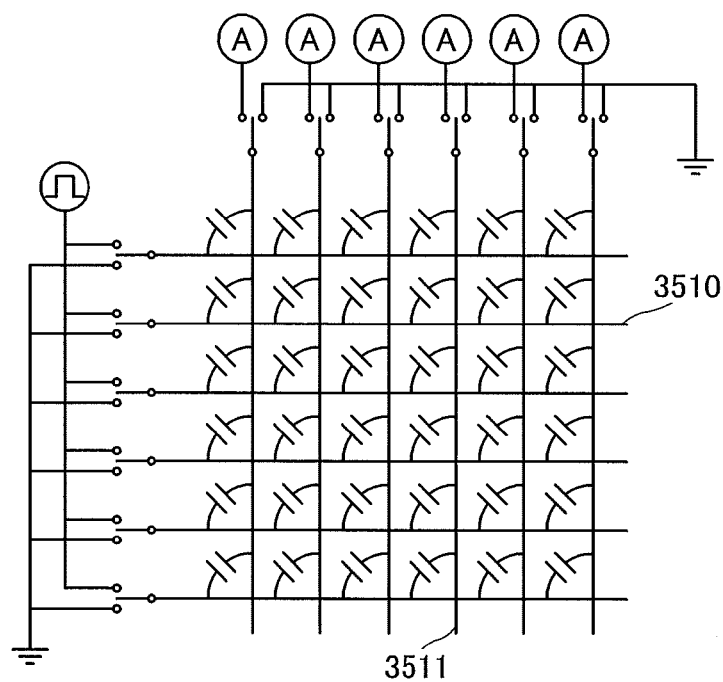

FIG. 25B is an equivalent circuit diagram in which a plurality of wirings 3510 extending in the X direction and the plurality of wirings 3511 extending in the Y direction are illustrated. Input voltage or a common potential can be input to each of the wirings 3510 extending in the X direction. Further, a ground potential can be input to each of the wirings 3511 extending in the Y direction, or each of the wirings 3511 can be electrically connected to a detection circuit.

<3-2-4. Operation Example of Touch Panel>

Operation of the above-described touch panel is described with reference to FIGS. 26A and 26B and FIG. 27.

Figure 27:
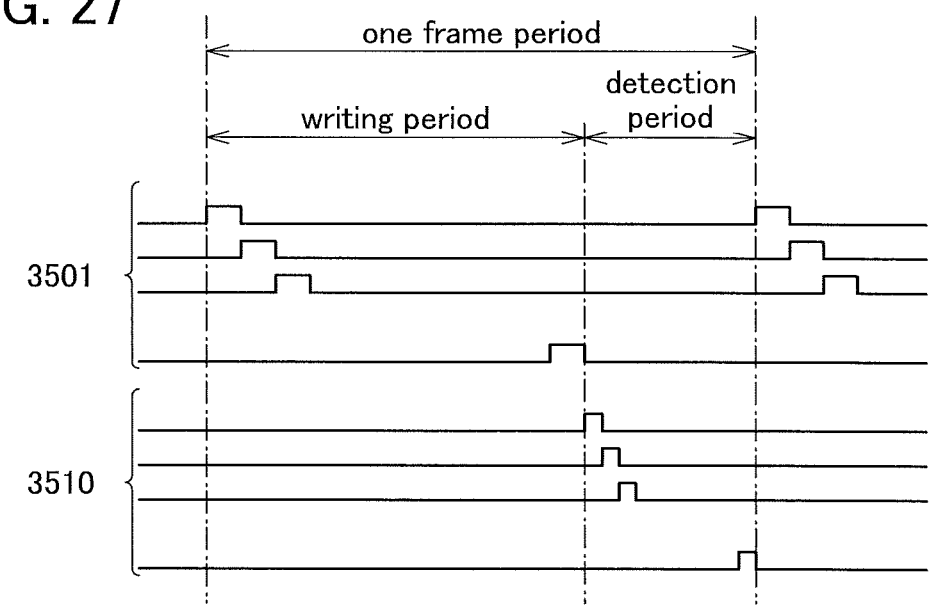
FIG. 27 is a timing chart showing operations of touch sensors and pixels of an embodiment.

As illustrated in FIG. 27, one frame period is divided into a writing period and a detecting period. In the writing period, a period in which image data is written to a pixel, the wirings 3510 (also referred to as gate lines) are sequentially selected. In the detecting period, a period in which sensing is performed by a touch sensor, the wirings 3510 extending in the X direction are sequentially selected and input voltage is input.

Figure 26A:
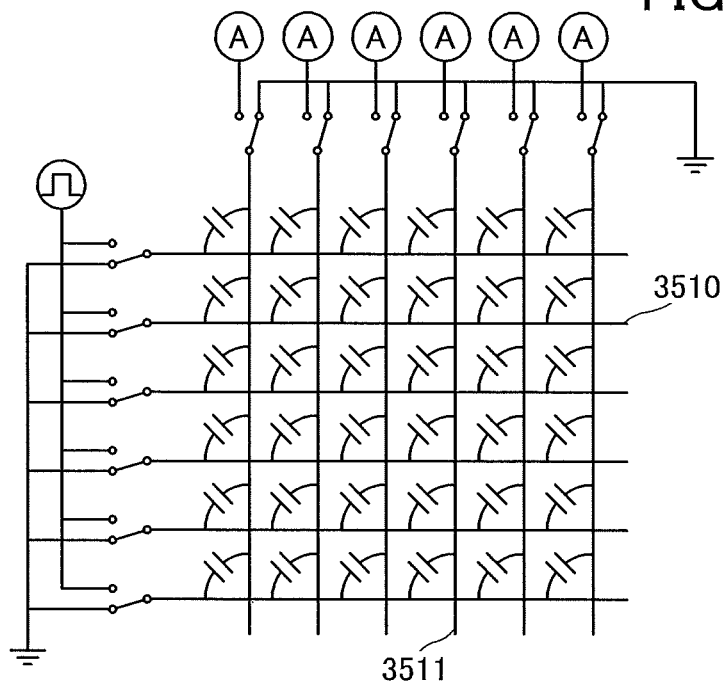
FIGS. 26A and 26B illustrate operations of touch sensors and pixels of an embodiment.

FIG. 26A is an equivalent circuit diagram in the writing period. In the writing period, a common potential is input to both the wiring 3510 extending in the X direction and the wiring 3511 extending in the Y direction.

Figure 26B:
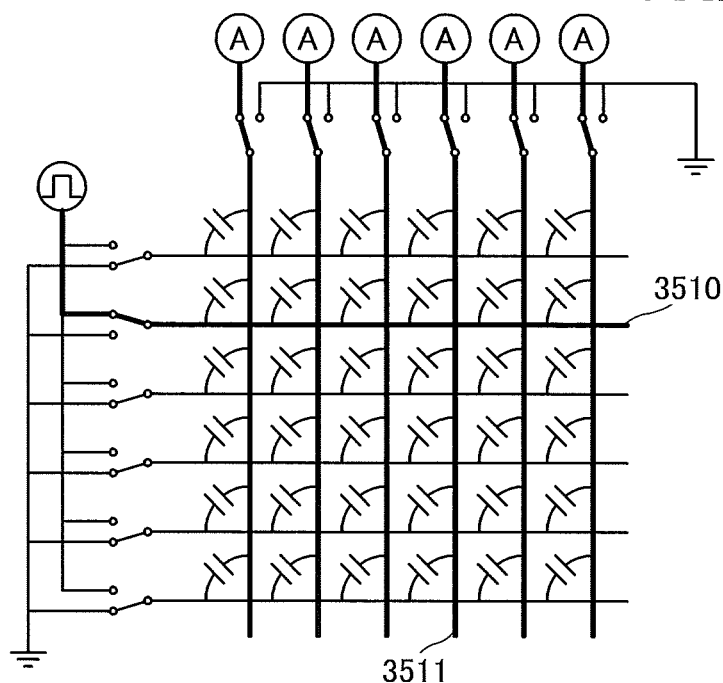

FIG. 26B is an equivalent circuit diagram at some point in time in the detection period. In the detection period, each of the wirings 3511 extending in the Y direction is electrically connected to the detection circuit. Input voltage is input to the wirings 3510 extending in the X direction which are selected, and a common potential is input to the wirings 3510 extending in the X direction which are not selected.

It is preferable that a period in which an image is written and a period in which sensing is performed by a touch sensor be separately provided as described above. Thus, a decrease in sensitivity of the touch sensor caused by noise generated when data is written to a pixel can be suppressed.

<3-2-5. Structure Examples of Pixel>

Structure examples of a pixel which can be used for the above touch panel are described below.

Figure 28A:
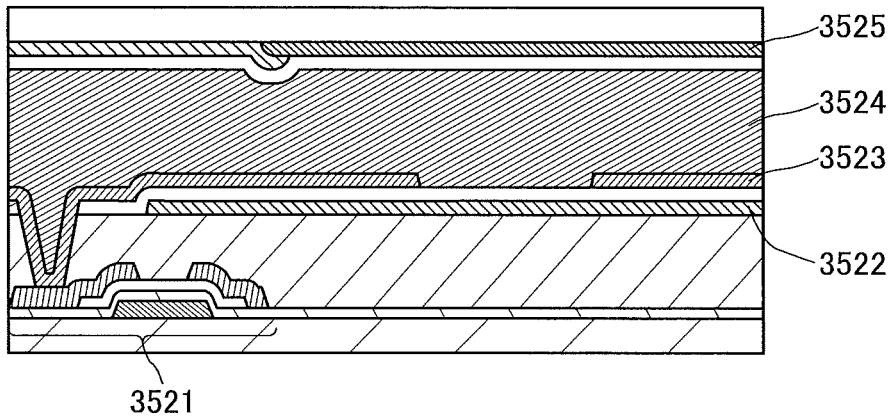
FIGS. 28A to 28C each illustrate a structure of a pixel of an embodiment.

FIG. 28A is a cross-sectional schematic diagram illustrating part of a pixel using an FFS mode of a liquid crystal display device.

The pixel includes a transistor 3521, an electrode 3522, an electrode 3523, a liquid crystal 3524, and a color filter 3525. The electrode 3523 having an opening is electrically connected to one of a source and a drain of the transistor 3521. The electrode 3523 is provided over the electrode 3522 with an insulating film provided therebetween. The electrode 3523 and the electrode 3522 can each function as one electrode of a liquid crystal element, and by applying voltage therebetween, alignment of liquid crystals can be controlled.

For example, the electrode 3522 is electrically connected to the above-described wiring 3510 or wiring 3511; thus, the pixel of the above-described touch panel can be formed.

Note that the electrode 3522 can be provided over the electrode 3523. In that case, the electrode 3522 may have an opening and may be provided over the electrode 3523 with an insulating film provided therebetween.

Figure 28B:
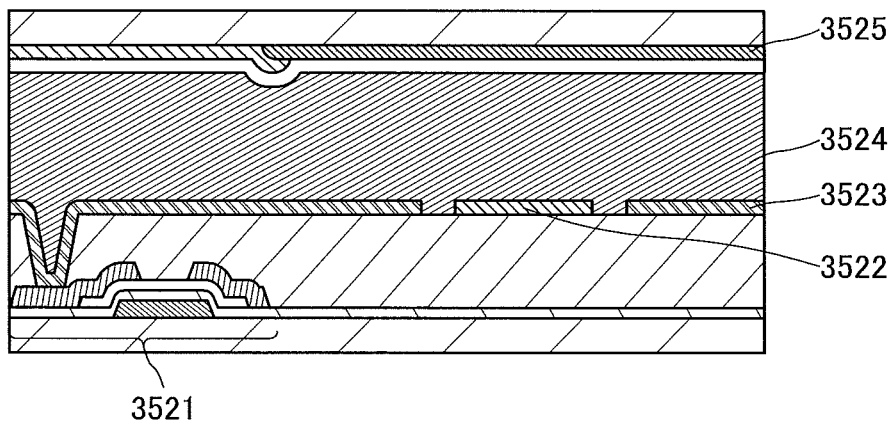

FIG. 28B is a cross-sectional schematic diagram illustrating part of a pixel having an IPS mode of a liquid crystal display device.

The electrode 3523 and electrode 3522 provided in the pixel each have a comb-like shape and are provided on the same plane.

For example, the electrode 3522 is electrically connected to the above-described wiring 3510 or wiring 3511; thus, the pixel of the above-described touch panel can be formed.

Figure 28C:
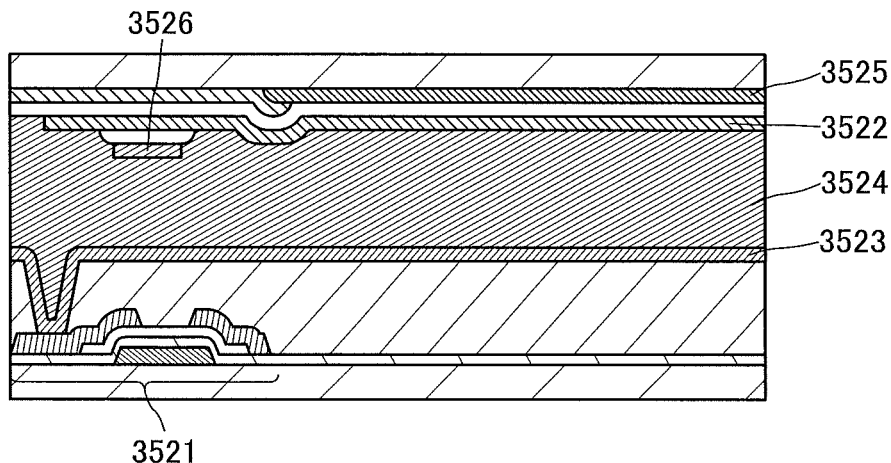

FIG. 28C is a cross-sectional schematic diagram illustrating part of a pixel having a VA mode of a liquid crystal display device.

The electrode 3522 is provided so as to face the electrode 3523 with the liquid crystal 3524 provided therebetween. The wiring 3526 is provided on the electrode 3522. For example, the wiring 3526 can be provided to electrically connect the block including the pixel illustrated in FIG. 28C and blocks different from the block including the pixel illustrated in FIG. 28C.

For example, the electrode 3522 is electrically connected to the above-described wiring 3510 or wiring 3511; thus, the pixel of the above-described touch panel can be formed.

<3-3. Microcomputer>

The transistors described above can be applied to a microcomputer used for a variety of electronic appliances.

A structure and operation of a fire alarm that is an example of the electronic appliance using a microcomputer are described with reference to FIG. 29, FIG. 30, FIGS. 31A to 31C, and FIG. 32A.

The fire alarm in this specification refers to any system which raises an alarm over fire occurrence instantly and includes, for example, a residential fire alarm, an automatic fire alarm system, and a fire detector used for the automatic fire alarm system in its category.

Figure 29:
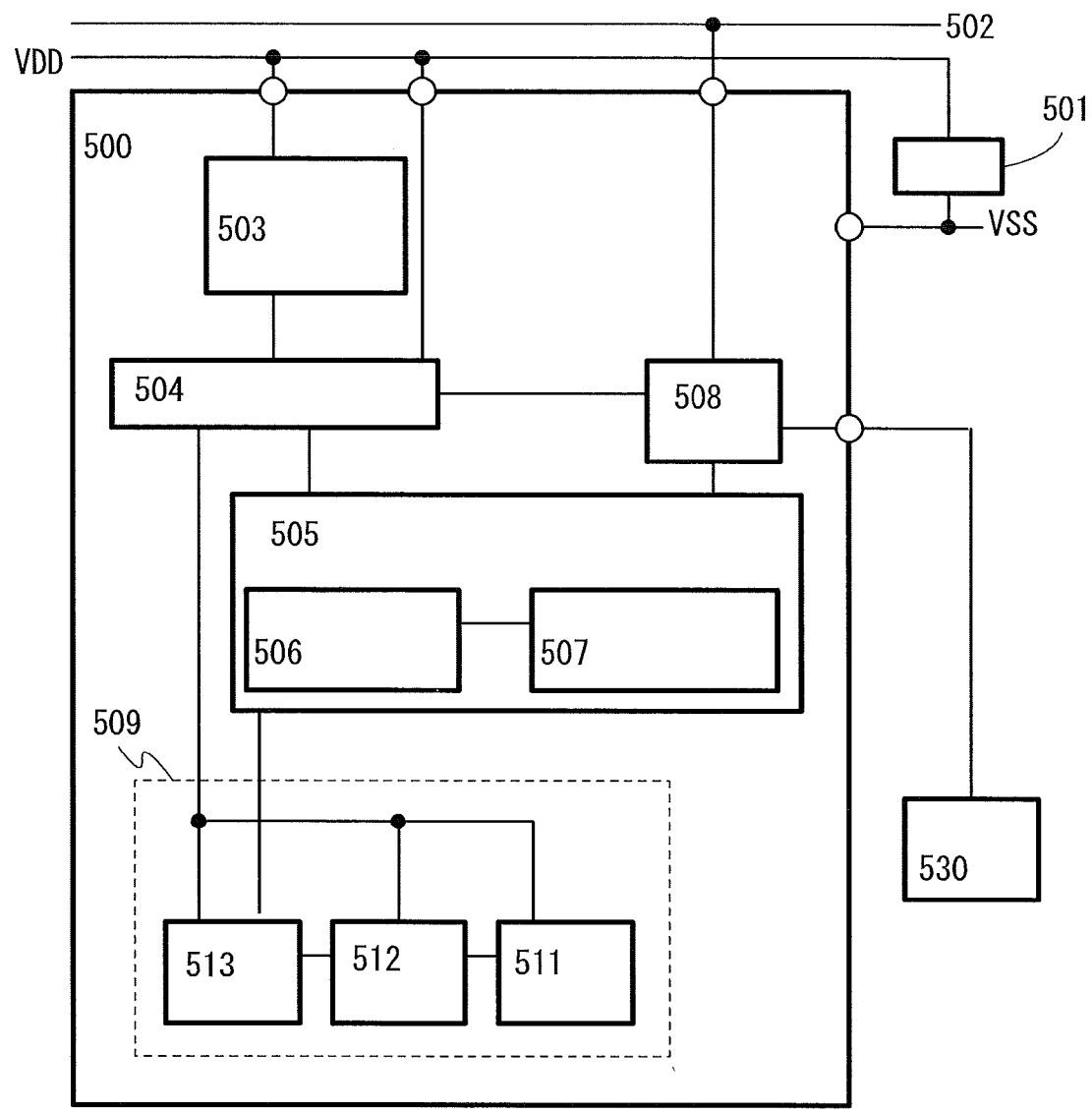
FIG. 29 is a block diagram illustrating an example of a semiconductor device of one embodiment of the present invention.

An alarm system illustrated in FIG. 29 includes at least a microcomputer 500. The microcomputer 500 is provided inside the alarm system. The microcomputer 500 includes a power gate controller 503 electrically connected to a high potential power supply line VDD, a power gate 504 electrically connected to the high potential power supply line VDD and the power gate controller 503, a central processing unit (CPU) 505 electrically connected to the power gate 504, and a sensor portion 509 electrically connected to the power gate 504 and the CPU 505. Further, the CPU 505 includes a volatile memory portion 506 and a nonvolatile memory portion 507.

The CPU 505 is electrically connected to a bus line 502 via an interface 508. The interface 508 as well as the CPU 505 is electrically connected to the power gate 504. As a bus standard of the interface 508, for example, an I²C bus can be used. A light-emitting element 530 electrically connected to the power gate 504 via the interface 508 is provided in the alarm system.

The light-emitting element 530 is preferably an element which emits light with high directivity, and for example, an organic EL element, an inorganic EL element, or an LED can be used.

The power gate controller 503 includes a timer and controls the power gate 504 with the use of the timer. The power gate 504 allows or stops supply of power from the high potential power supply line VDD to the CPU 505, the sensor portion 509, and the interface 508, in accordance with the control by the power gate controller 503. Here, as an example of the power gate 504, a switching element such as a transistor can be given.

With the use of the power gate controller 503 and the power gate 504, power is supplied to the sensor portion 509, the CPU 505, and the interface 508 in a period during which the amount of light is measured, and supply of power to the sensor portion 509, the CPU 505, and the interface 508 can be stopped during an interval between measurement periods. The alarm system operates in such a manner, whereby power consumption can be reduced as compared to the case where power is continuously supplied to the above structures.

In the case where a transistor is used as the power gate 504, it is preferable to use a transistor which has extremely low off-state current and is used for the nonvolatile memory portion 507, for example, any of the transistors each of which includes the multilayer film including the oxide semiconductor layer. With the use of such a transistor, leakage current can be reduced when supply of power is stopped by the power gate 504, so that power consumption can be reduced.

A direct-current power source 501 may be provided in the alarm system so that power is supplied from the direct-current power source 501 to the high potential power supply line VDD. An electrode of the direct-current power source 501 on the high potential side is electrically connected to the high potential power supply line VDD, and an electrode of the direct-current power source 501 on the low potential side is electrically connected to a low potential power supply line VSS. The low potential power supply line VSS is electrically connected to the microcomputer 500. Here, the high potential power supply line VDD is supplied with a high potential H. The low potential power supply line VSS is supplied with a low potential L, for example, a ground potential (GND).

In the case where a battery is used as the direct-current power source 501, for example, a battery case which includes an electrode electrically connected to the high potential power supply line VDD, an electrode electrically connected to the low potential power supply line VSS, and a housing which can hold the battery is provided in a housing. Note that the alarm system does not necessarily include the direct-current power source 501 and may have, for example, a structure in which power is supplied from an alternate-current power source provided outside the alarm system through a wiring.

As the above battery, a secondary battery such as a lithium ion secondary battery (also called a lithium ion storage battery or a lithium ion battery) can be used. Further, a solar battery is preferably provided to charge the secondary battery.

The sensor portion 509 measures a physical quantity relating to an abnormal situation and transmits a measured value to the CPU 505. A physical quantity relating to an abnormal situation depends on the usage of the alarm system, and in an alarm system functioning as a fire alarm, a physical quantity relating to a fire is measured. Thus, the sensor portion 509 measures the amount of light as a physical quantity relating to a fire and senses smoke.

The sensor portion 509 includes an optical sensor 511 electrically connected to the power gate 504, an amplifier 512 electrically connected to the power gate 504, and an AD converter 513 electrically connected to the power gate 504 and the CPU 505. The light-emitting element 530, the optical sensor 511, the amplifier 512, and the AD converter 513 operate when the power gate 504 allows supply of power to the sensor portion 509.

Figure 30:
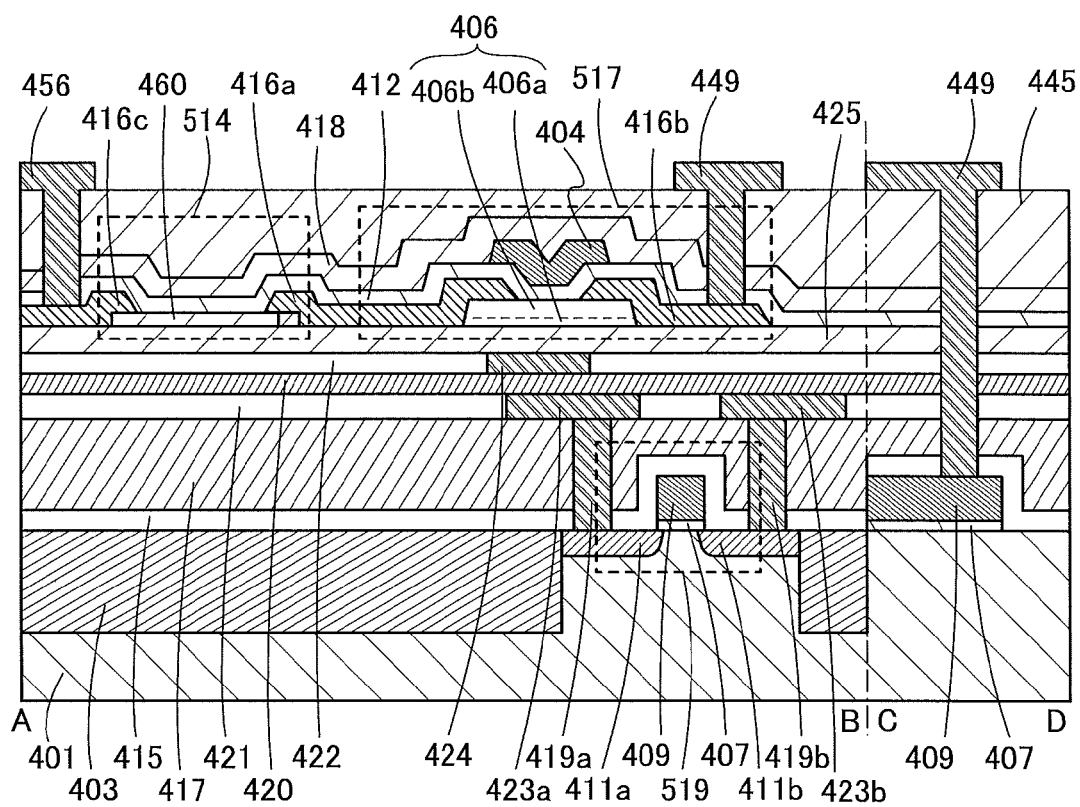
FIG. 30 is a cross-sectional view illustrating an example of a semiconductor device of one embodiment of the present invention.

FIG. 30 illustrates part of the cross section of the alarm system. An n-channel transistor 519 includes element isolation regions 403 in a p-type semiconductor substrate 401, a gate insulating film 407, a gate electrode 409, n-type impurity regions 411a and 411b, an insulating film 415, and an insulating film 417. The n-channel transistor 519 is formed using a semiconductor such as single crystal silicon, so that the n-channel transistor 519 can operate at high speed. Accordingly, a volatile memory portion of a CPU that can achieve high-speed access can be formed.

In addition, contact plugs 419a and 419b are formed in openings which are formed by partly etching the insulating films 415 and 417, and an insulating film 421 having groove portions is formed over the insulating film 417 and the contact plugs 419a and 419b. Wirings 423a and 423b are formed in the groove portions of the insulating film 421. An insulating film 420 is formed over the insulating film 421 and the wirings 423a and 423b by a sputtering method, a CVD method, or the like, and an insulating film 422 having a groove portion is formed over the insulating film 420. An electrode 424 is formed in the groove portion of the insulating film 422. The electrode 424 functions as a back gate electrode of a second transistor 517. The electrode 424 can control the threshold voltage of the second transistor 517.

Moreover, an insulating film 425 is formed over the insulating film 422 and the electrode 424 by a sputtering method, a CVD method, or the like.

The second transistor 517 and a photoelectric conversion element 514 are provided over the insulating film 425. The second transistor 517 includes the multilayer film 406 including the oxide semiconductor layer 406a and the oxide semiconductor layer 406b, the source electrode 416a and the drain electrode 416b which are over and in contact with the multilayer film 406, the gate insulating film 412, the gate electrode 404, and the protective insulating film 418. Moreover, an insulating film 445 which covers the photoelectric conversion element 514 and the second transistor 517 is formed, and a wiring 449 in contact with the drain electrode 416b is formed over the insulating film 445. The wiring 449 functions as a node which electrically connects the drain electrode 416b of the second transistor 517 to the gate electrode 409 of the n-channel transistor 519.

The optical sensor 511 includes the photoelectric conversion element 514, a capacitor, a first transistor, the second transistor 517, a third transistor, and the n-channel transistor 519. As the photoelectric conversion element 514, a photodiode can be used here, for example.

One of terminals of the photoelectric conversion element 514 is electrically connected to the low potential power supply line VSS, and the other of the terminals thereof is electrically connected to one of the source electrode and the drain electrode of the second transistor 517. The gate electrode of the second transistor 517 is supplied with an electric charge accumulation control signal Tx, and the other of the source electrode and the drain electrode thereof is electrically connected to one of a pair of electrodes of the capacitor, one of a source electrode and a drain electrode of the first transistor, and the gate electrode of the n-channel transistor 519 (hereinafter the node is referred to as a node FD in some cases). The other of the pair of electrodes of the capacitor is electrically connected to the low potential power supply line VSS. A gate electrode of the first transistor is supplied with a reset signal Res, and the other of the source electrode and the drain electrode thereof is electrically connected to the high potential power supply line VDD. One of a source electrode and a drain electrode of the n-channel transistor 519 is electrically connected to one of a source electrode and a drain electrode of the third transistor and the amplifier 512. The other of the source electrode and the drain electrode of the n-channel transistor 519 is electrically connected to the high potential power supply line VDD. A gate electrode of the third transistor is supplied with a bias signal Bias, and the other of the source electrode and the drain electrode thereof is electrically connected to the low potential power supply line VSS.

Note that the capacitor is not necessarily provided. For example, in the case where parasitic capacitance of the n-channel transistor 519 or the like is sufficiently large, a structure without the capacitor may be employed.

Further, as each of the first transistor and the second transistor 517, the transistor with extremely low off-state current is preferably used. As the transistor with extremely low off-state current, any of the above transistors each of which includes the multilayer film including the oxide semiconductor layer is preferably used. With such a structure, the potential of the node FD can be held for a long time.

In the structure in FIG. 30, the photoelectric conversion element 514 is electrically connected to the second transistor 517 and is provided over the insulating film 425.

The photoelectric conversion element 514 includes a semiconductor film 460 over the insulating film 425, and the source electrode 416a and an electrode 416c which are in contact with the top surface of the semiconductor film 460. The source electrode 416a is an electrode functioning as the source electrode or the drain electrode of the second transistor 517 and electrically connects the photoelectric conversion element 514 to the second transistor 517.

Over the semiconductor film 460, the source electrode 416a, and the electrode 416c, the gate insulating film 412, the protective insulating film 418, and the insulating film 445 are provided. Further, a wiring 456 is formed over the insulating film 445 and is in contact with the electrode 416c through an opening provided in the gate insulating film 412, the protective insulating film 418, and the insulating film 445.

The electrode 416c can be formed in steps similar to those of the source electrode 416a and the drain electrode 416b, and the wiring 456 can be formed in steps similar to those of the wiring 449.

As the semiconductor film 460, a semiconductor film which can perform photoelectric conversion is provided, and for example, silicon, germanium, or the like can be used. In the case of using silicon for the semiconductor film 460, an optical sensor which senses visible light can be obtained. Further, there is a difference between silicon and germanium in wavelengths of absorbed electromagnetic waves. In the case of using germanium for the semiconductor film 460, a sensor which senses infrared rays can be obtained.

In the above manner, the sensor portion 509 including the optical sensor 511 can be incorporated into the microcomputer 500, so that the number of components can be reduced and the housing of the alarm system can be reduced in size.

In the fire alarm including the above-described IC chip, the CPU 505 in which a plurality of circuits each including any of the above transistors are combined and mounted on one IC chip is used.

<3-3-1. CPU>

Figure 31A:
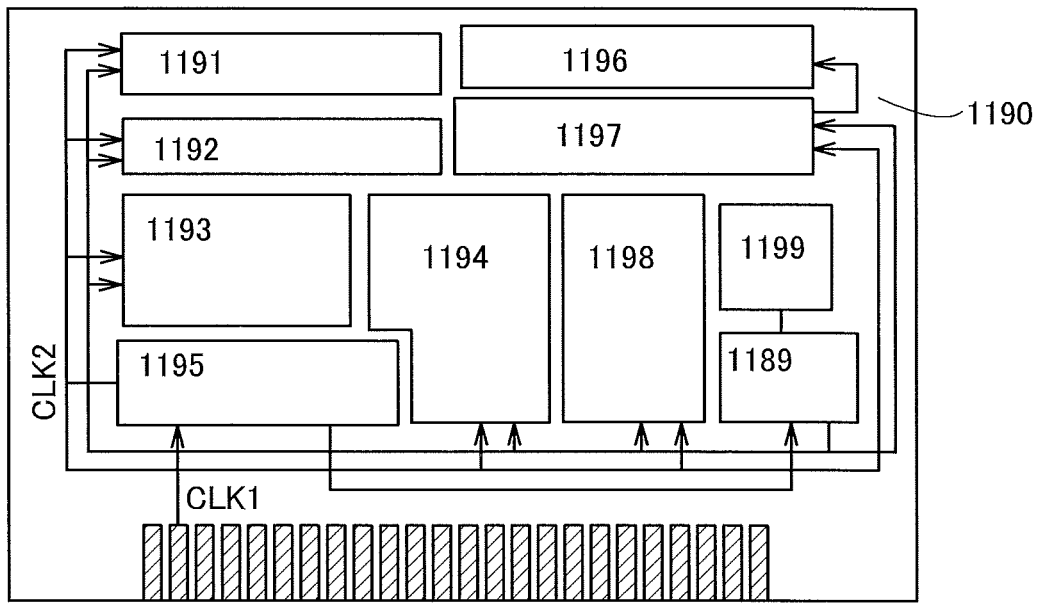
FIGS. 31A to 31C are block diagrams illustrating examples of CPUs of one embodiment of the present invention.
Figure 31B:
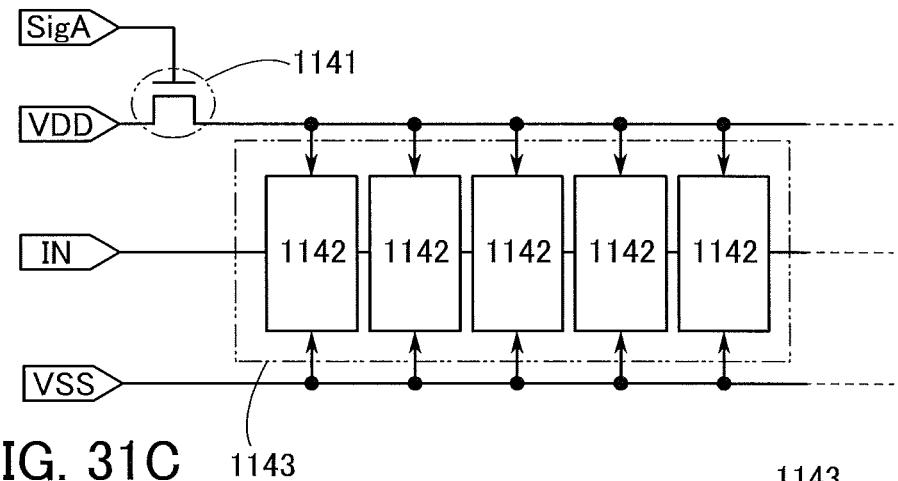
Figure 31C:
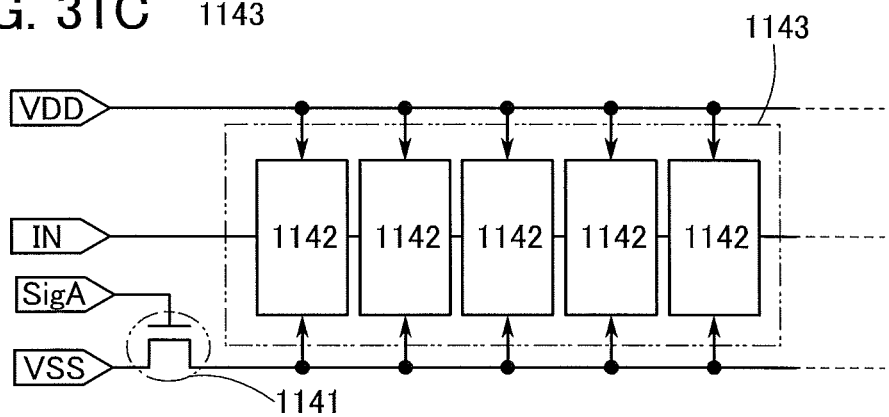

FIGS. 31A to 31C are block diagrams illustrating a specific structure of a CPU at least partly including any of the above transistors.

The CPU illustrated in FIG. 31A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189 over a substrate 1190. A semiconductor substrate, an SOI substrate, a glass substrate, or the like is used as the substrate 1190. The ROM 1199 and the ROM interface 1189 may be provided over separate chips. Needless to say, the CPU in FIG. 31A is just an example of a simplified structure, and an actual CPU may have a variety of structures depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 31A, a memory cell is provided in the register 1196. For the memory cell of the register 1196, the above transistor can be used.

In the CPU illustrated in FIG. 31A, the register controller 1197 selects an operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

The power supply can be stopped by a switching element provided between a memory cell group and a node to which a power supply potential VDD or a power supply potential VSS is supplied, as illustrated in FIG. 31B or FIG. 31C. Circuits illustrated in FIGS. 31B and 31C are described below.

FIGS. 31B and 31C each illustrate a memory device in which any of the above transistors is used as a switching element which controls supply of a power supply potential to a memory cell.

The memory device illustrated in FIG. 31B includes a switching element 1141 and a memory cell group 1143 including a plurality of memory cells 1142. Specifically, for each of the memory cells 1142, the above transistor can be used. Each of the memory cells 1142 included in the memory cell group 1143 is supplied with the high-level power supply potential VDD via the switching element 1141. Further, each of the memory cells 1142 included in the memory cell group 1143 is supplied with a potential of a signal IN and the low-level power supply potential VSS.

In FIG. 31B, any of the above transistors is used as the switching element 1141, and the switching of the transistor is controlled by a signal SigA supplied to a gate electrode layer thereof.

Note that FIG. 31B illustrates the structure in which the switching element 1141 includes only one transistor; however, one embodiment of the present invention is not limited thereto and the switching element 1141 may include a plurality of transistors. In the case where the switching element 1141 includes a plurality of transistors which serve as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 31B, the switching element 1141 may control the supply of the low-level power supply potential VSS.

FIG. 31C illustrates an example of a memory device in which each of the memory cells 1142 included in the memory cell group 1143 is supplied with the low-level power supply potential VSS via the switching element 1141. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be held even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

<3-3-2. Installation Example>

Figure 32A:
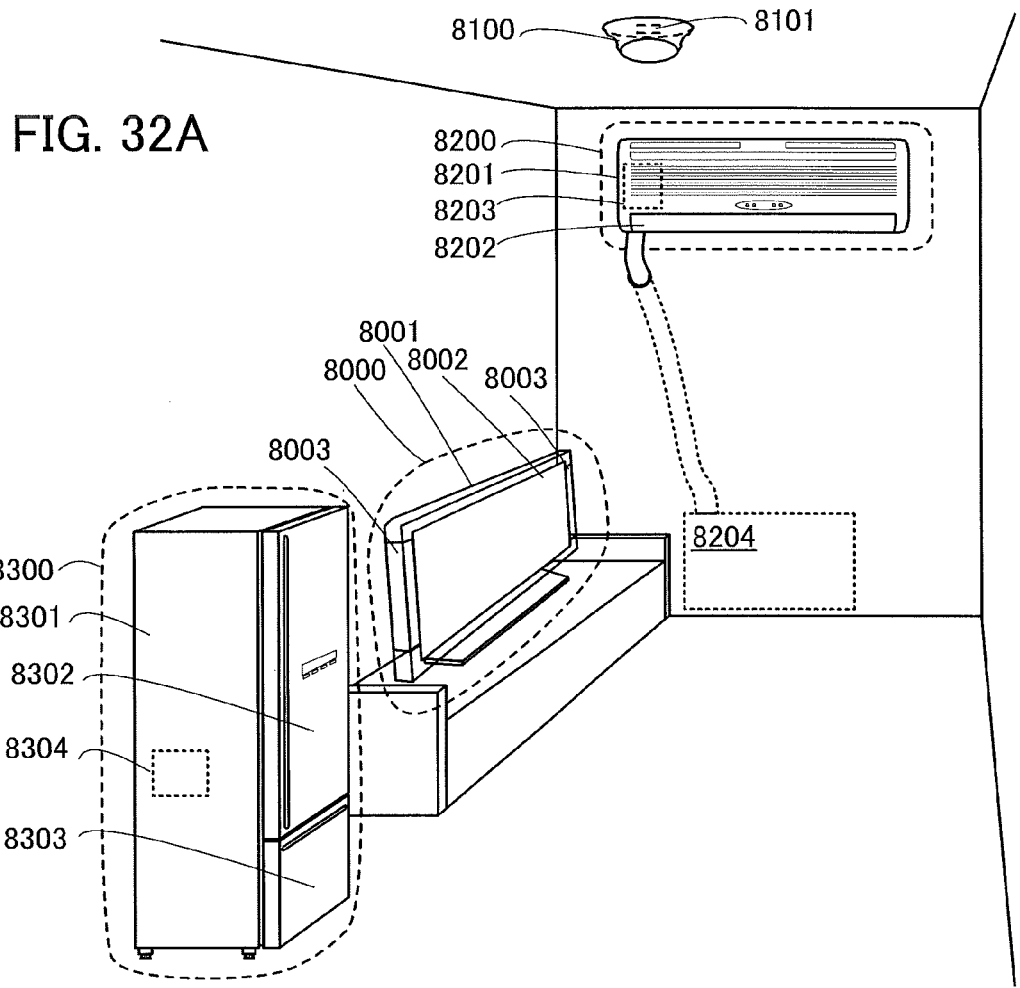
FIGS. 32A to 32C illustrate examples of electronic appliances of one embodiment of the present invention.

In a television set 8000 in FIG. 32A, a display portion 8002 is incorporated in a housing 8001. The display portion 8002 can display an image and a speaker portion 8003 can output sound. The above transistor can be used for the display portion 8002.

A semiconductor display device such as a liquid crystal display device, a light-emitting device in which a light-emitting element such as an organic EL element is provided in each pixel, an electrophoresis display device, a digital micromirror device (DMD), or a plasma display panel (PDP) can be used for the display portion 8002.

In addition, the television set 8000 may include a CPU for performing information communication or a memory. A CPU or a memory that uses any of the above transistors, the above memory device, or the above CPU consumes less power.

In FIG. 32A, an alarm system 8100 is a residential fire alarm, which includes a sensor portion and a microcomputer 8101. The microcomputer 8101 includes a CPU in which any of the above transistors is used.

In FIG. 32A, a CPU that uses any of the above transistors is included in an air conditioner which includes an indoor unit 8200 and an outdoor unit 8204. Specifically, the indoor unit 8200 includes a housing 8201, an air outlet 8202, a CPU 8203, and the like. Although the CPU 8203 is provided in the indoor unit 8200 in FIG. 32A, the CPU 8203 may be provided in the outdoor unit 8204. Alternatively, the CPU 8203 may be provided in both the indoor unit 8200 and the outdoor unit 8204. A CPU that uses any of the above transistors can save the power of the air conditioner.

In FIG. 32A, a CPU that uses any of the above transistors is included in an electric refrigerator-freezer 8300. Specifically, the electric refrigerator-freezer 8300 includes a housing 8301, a door for a refrigerator 8302, a door for a freezer 8303, a CPU 8304, and the like. In FIG. 32A, the CPU 8304 is provided in the housing 8301. A CPU that uses any of the above transistors can save the power of the electric refrigerator-freezer 8300.

Figure 32B:
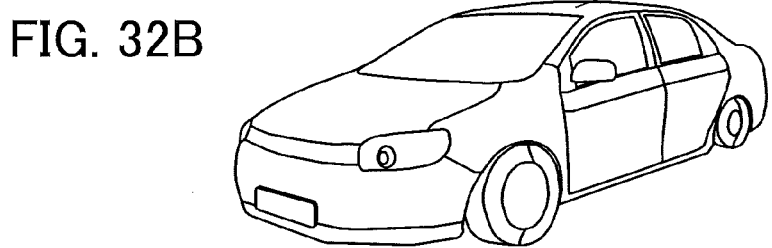
Figure 32C:
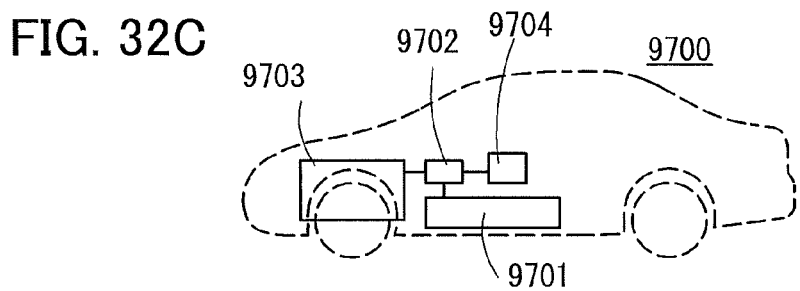

FIGS. 32B and 32C illustrate an example of an electric vehicle. An electric vehicle 9700 is equipped with a secondary battery 9701. The output of the electric power of the secondary battery 9701 is adjusted by a control circuit 9702 and the electric power is supplied to a driving device 9703. The control circuit 9702 is controlled by a processing unit 9704 including a ROM, a RAM, a CPU, or the like which is not illustrated. A CPU that uses any of the above transistors can save the power of the electric vehicle 9700.

The driving device 9703 includes a DC motor or an AC motor either alone or in combination with an internal-combustion engine. The processing unit 9704 outputs a control signal to the control circuit 9702 on the basis of input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

This embodiment shows an example of a basic principle. Thus, part of or the whole of this embodiment can be freely combined with, applied to, or replaced with part of or the whole of another embodiment.

Example 1

In this example, photoresponse of an oxide semiconductor layer was evaluated. In addition, electrical characteristics of a transistor including the oxide semiconductor layer in a channel formation region were evaluated.

Sample 1 has the structure illustrated in FIGS. 1A and 1B. Note that a glass substrate was used as the substrate 100. As the insulating film 112, a stack of a 50-nm-thick silicon oxynitride layer and a 400-nm-thick silicon nitride layer over the silicon oxynitride layer was used. For the electrode 116a and the electrode 116b, a stack of a 50-nm-thick tungsten layer, a 400-nm-thick aluminum layer over the tungsten layer, and a 100-nm-thick titanium layer over the aluminum layer was used. As the insulating film 118, a 450-nm-thick silicon oxynitride film containing excess oxygen was used.

As the oxide semiconductor layer 106a1, a 35-nm-thick oxide semiconductor layer formed by a sputtering method using a target containing In, Ga, and Zn at an atomic ratio of 1:1:1 was used. As the oxide semiconductor layer 106a2, a 20-nm-thick oxide semiconductor layer formed by a sputtering method using a target containing In, Ga, and Zn at an atomic ratio of 1:3:2 was used.

Sample 2 has the structure illustrated in FIGS. 3A and 3B. Note that a glass substrate was used as the substrate 100. As the insulating film 112, a stack of a 50-nm-thick silicon oxynitride layer and a 400-nm-thick silicon nitride layer over the silicon oxynitride layer was used. For the electrode 116a and the electrode 116b, a stack of a 50-nm-thick tungsten layer, a 400-nm-thick aluminum layer over the tungsten layer, and a 100-nm-thick titanium layer over the aluminum layer was used. As the insulating film 118, a 450-nm-thick silicon oxynitride film containing excess oxygen was used.

As the oxide semiconductor layer 106b, a 35-nm-thick oxide semiconductor layer formed by a sputtering method using a target containing In, Ga, and Zn at an atomic ratio of 1:1:1 was used.

Sample 3 has the structure illustrated in FIGS. 5A and 5B. Note that a glass substrate was used as the substrate 100. As the insulating film 112, a stack of a 50-nm-thick silicon oxynitride layer and a 400-nm-thick silicon nitride layer over the silicon oxynitride layer was used. For the electrode 116a and the electrode 116b, a stack of a 50-nm-thick tungsten layer, a 400-nm-thick aluminum layer over the tungsten layer, and a 100-nm-thick titanium layer over the aluminum layer was used. As the insulating film 118, a 450-nm-thick silicon oxynitride film containing excess oxygen was used.

As the oxide semiconductor layer 106c1, a 20-nm-thick oxide semiconductor layer formed by a sputtering method using a target containing In, Ga, and Zn at an atomic ratio of 1:3:2 was used. As the oxide semiconductor layer 106c2, a 35-nm-thick oxide semiconductor layer formed by a sputtering method using a target containing In, Ga, and Zn at an atomic ratio of 1:1:1 was used.

Figure 33A:
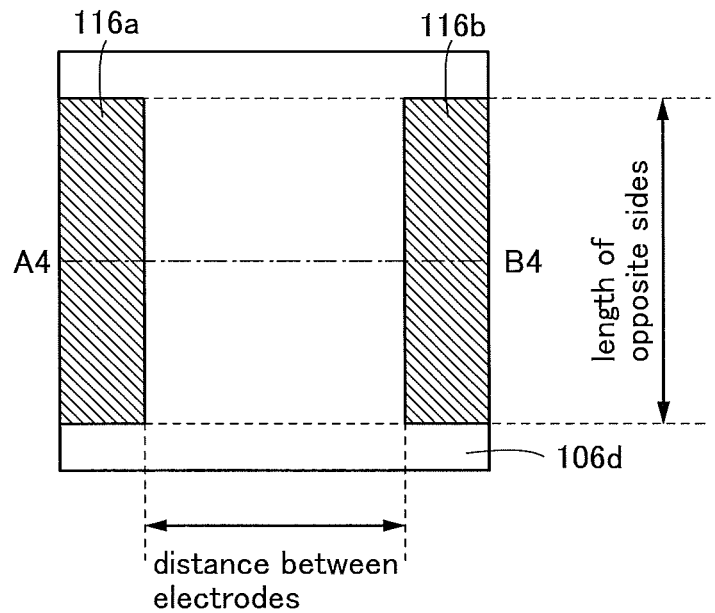
FIGS. 33A and 33B are a top view and a cross-sectional view of a sample of one embodiment of the present invention.
Figure 33B:
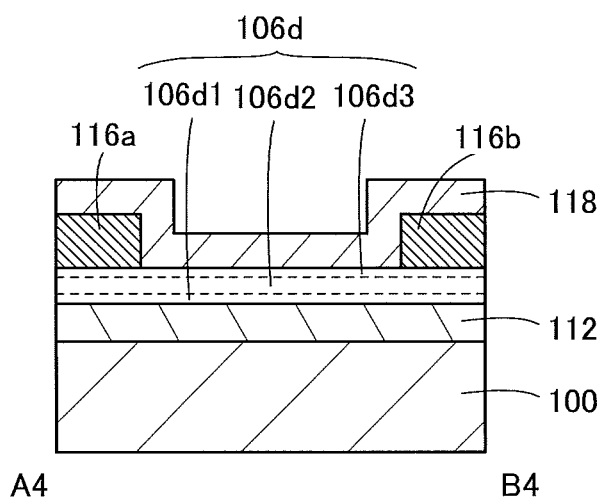

FIGS. 33A and 33B show the structure of Sample 4. FIG. 33B is a cross-sectional view of Sample 4 taken along dashed-dotted line A4-B4 in FIG. 33A.

FIG. 33B is a cross-sectional view of Sample 4 including the substrate 100; the insulating film 112 provided over the substrate 100; a multilayer film 106d including an oxide semiconductor layer 106d1 over the insulating film 112, an oxide semiconductor layer 106d2 over the oxide semiconductor layer 106d1, and an oxide semiconductor layer 106d3 over the oxide semiconductor layer 106d2; the electrode 116a and the electrode 116b provided over and in contact with the multilayer film 106d; and the insulating film 118 provided over the multilayer film 106d, the electrode 116a, and the electrode 116b.

Note that a glass substrate was used as the substrate 100. As the insulating film 112, a stack of a 50-nm-thick silicon oxynitride layer and a 400-nm-thick silicon nitride layer over the silicon oxynitride layer was used. For the electrode 116a and the electrode 116b, a stack of a 50-nm-thick tungsten layer, a 400-nm-thick aluminum layer over the tungsten layer, and a 100-nm-thick titanium layer over the aluminum layer was used. As the insulating film 118, a 450-nm-thick silicon oxynitride film containing excess oxygen was used.

As the oxide semiconductor layer 106d1, a 20-nm-thick oxide semiconductor layer formed by a sputtering method using a target containing In, Ga, and Zn at an atomic ratio of 1:3:2 was used. As the oxide semiconductor layer 106d2, a 35-nm-thick oxide semiconductor layer formed by a sputtering method using a target containing In, Ga, and Zn at an atomic ratio of 1:1:1 was used. As the oxide semiconductor layer 106d3, a 20-nm-thick oxide semiconductor layer formed by a sputtering method using a target containing In, Ga, and Zn at an atomic ratio of 1:3:2 was used.

Note that the same deposition conditions were employed in the sputtering for forming the oxide semiconductor layer 106a1, the oxide semiconductor layer 106b, the oxide semiconductor layer 106c2, and the oxide semiconductor layer 106d2. Further, the same deposition conditions were employed in the sputtering for forming the oxide semiconductor layer 106a2, the oxide semiconductor layer 106c1, the oxide semiconductor layer 106d1, and the oxide semiconductor layer 106d3.

Further, the substrate 100, the insulating film 112, the electrode 116a, the electrode 116b, and the insulating film 118 in Samples 1 to 4 were each formed under the same conditions.

Samples 1 to 4 were subjected to first heat treatment before the formation of the insulating film 118. The first heat treatment was performed at 450° C. in a nitrogen gas atmosphere for one hour, and then at 450° C. in an atmosphere containing 80% nitrogen gas and 20% oxygen gas for one hour. Further, Samples 1 to 4 were subjected to second heat treatment after the formation of the insulating film 118. The second heat treatment was performed at 350° C. in an atmosphere containing 80% nitrogen gas and 20% oxygen gas for one hour.

Next, photoresponse of Samples 1 to 4 was evaluated. Note that in Samples 1 to 4, the distance between the electrode 116a and the electrode 116b (denoted by "distance between electrodes" in FIG. 33A) was 5 μm, and the length of opposite sides of the electrode 116a and the electrode 116b (denoted by "length of opposite sides" in FIG. 33A) was 1000 μm. Irradiation light was light of a xenon lamp (center wavelength: 350 nm) that has passed through a band-pass filter. The intensity of the light was 3.0 mW/cm$^2$. The irradiation light had a spectrum denoted by "light 1" (solid line) in FIG. 34. The measurement temperature was room temperature (20° C. to 25° C.).

Photoresponse was evaluated as follows. While a voltage of 0.1 V was applied between the electrode 116a and the electrode 116b, three steps were performed: the samples were put in a dark state for 60 seconds (first step), then irradiated with light for 180 seconds (second step), and then put in a dark state for 240 seconds (third step). Further, current value was measured. FIGS. 35A to 35D show the measurement results. Photoresponse of Sample 1, photoresponse of Sample 2, photoresponse of Sample 3, and photoresponse of Sample 4 are shown in FIG. 35A, FIG. 35B, FIG. 35C, and FIG. 35D, respectively. Measurement range was adjusted for each sample in order to accurately measure the current value during light irradiation. Therefore, in some samples, current value in the first step and/or the third step performed in a dark state is smaller than the lower limit of measurement. Note that when the current value is close to or smaller than the lower limit of measurement, the measured current value might include a large amount of noise.

According to Models A to C described in the embodiment, the oxide semiconductor layer 106a1 with a low density of trap states serves as a main current path in Sample 1, and the oxide semiconductor layer 106d2 with a low density of trap states serves as a main current path in Sample 4. Meanwhile, the oxide semiconductor layer 106b with a high density of trap states serves as a main current path in Sample 2, and the oxide semiconductor layer 106c2 with a high density of trap states serves as a main current path in Sample 3. Therefore, a larger amount of current flows upon light irradiation in Samples 1 and 4 than in Samples 2 and 3. Note that the maximum current values in Sample 1, Sample 2, Sample 3, and Sample 4 were $1.8 \times 10^{-6}$ A, $1.3 \times 10^{-8}$ A, $3.0 \times 10^{-7}$ A, and $3.0 \times 10^{-6}$ A, respectively.

Further, according to Models A to C described in the embodiment, in Samples 1 and 4, the step in which recombination of electrons and holes proceeds rapidly occupies a relatively small proportion of the period during which the recombination proceeds, and the step in which the recombination proceeds slowly occupies a relatively large proportion of the period. On the other hand, in Sample 2, the step in which recombination of electrons and holes proceeds rapidly occupies a relatively large proportion of the period during which the recombination proceeds, and the step in which the recombination proceeds slowly occupies a relatively small proportion of the period. Further, in Sample 3, the step in which recombination of electrons and holes proceeds rapidly occupies most of the period during which the recombination proceeds, and the step in which the recombination proceeds slowly occupies a small proportion of the period. Therefore, in Samples 1 and 4, as compared with Sample 2, a relatively large amount of current flows for a long time even after light irradiation is stopped. In Sample 3, current hardly flows after light irradiation is stopped.

FIGS. 36A to 36D show the results of photoresponse with normalized current values obtained by dividing the current values in FIGS. 35A to 35D by the maximum current values. Photoresponse of Sample 1, photoresponse of Sample 2, photoresponse of Sample 3, and photoresponse of Sample 4 are shown in FIG. 36A, FIG. 36B, FIG. 36C, and FIG. 36D, respectively.

Figure 36A:
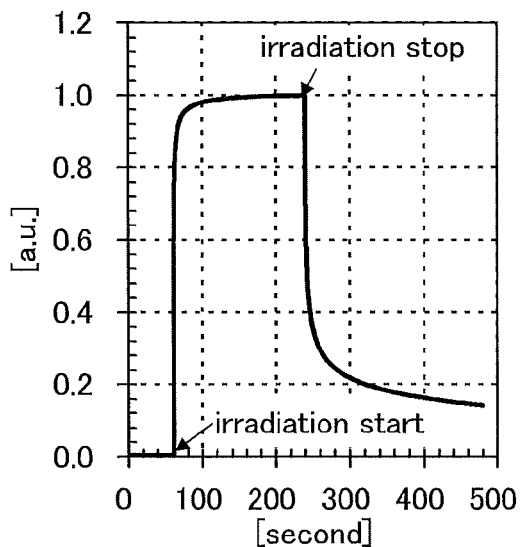
FIGS. 36A to 36D show photoresponse of samples.
Figure 36B:
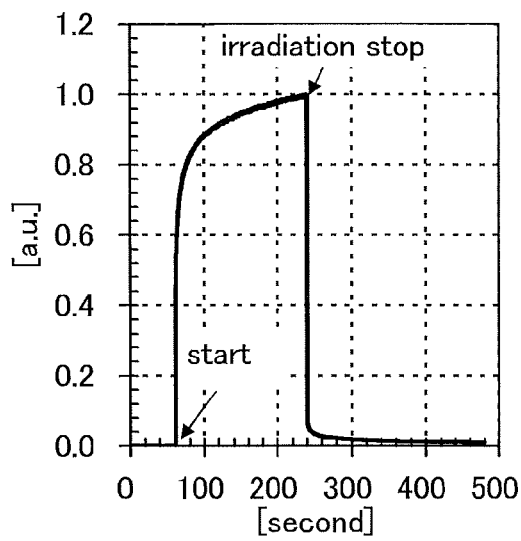
Figure 36C:
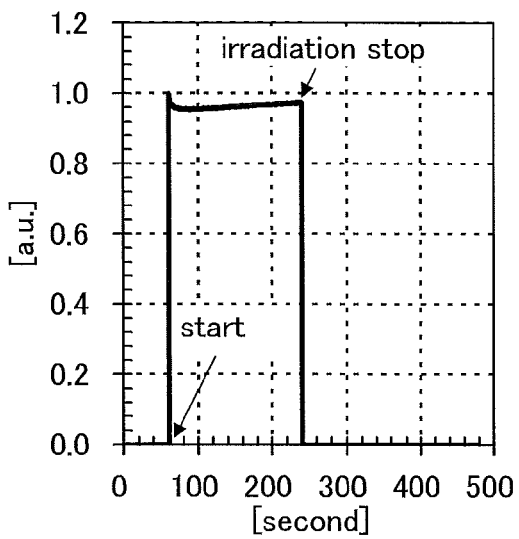
Figure 36D:
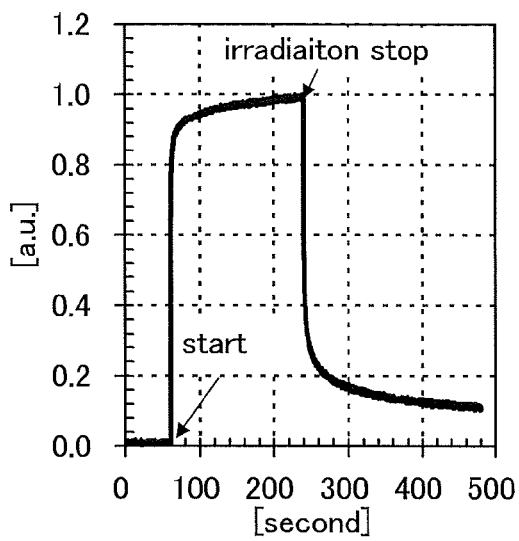

According to FIG. 36A, the normalized current value (current value/maximum current value) of Sample 1 at a time five seconds after the start of light irradiation was 0.89, and that at a time five seconds after the stop of light irradiation was 0.42. According to FIG. 36B, the normalized current value of Sample 2 at a time five seconds after the start of light irradiation was 0.68, and that at a time five seconds after the stop of light irradiation was 0.04. According to FIG. 36C, the normalized current value of Sample 3 at a time five seconds after the start of light irradiation was 0.97, and that at a time five seconds after the stop of light irradiation was 0.00. According to FIG. 36D, the normalized current value of Sample 4 at a time five seconds after the start of light irradiation was 0.88, and that at a time five seconds after the stop of light irradiation was 0.32.

Next, Transistors 1 to 4 corresponding to Samples 1 to 4 were fabricated. FIGS. 37A to 37D illustrate the structures of Transistors 1 to 4.

Figure 37A:
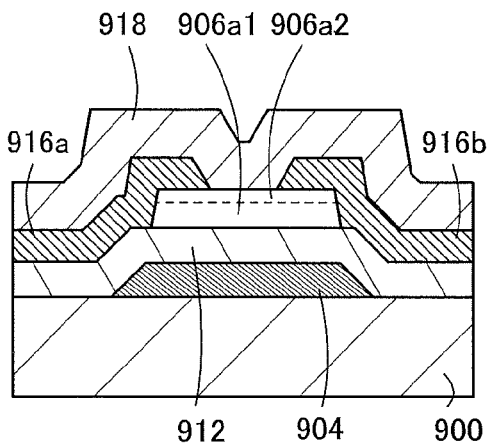
FIGS. 37A to 37D illustrate cross-sectional structures of transistors.

FIG. 37A illustrates the structure of Transistor 1. A glass substrate was used as a substrate 900. A 100-nm-thick tungsten film was used as a gate electrode 904. As a gate insulating film 912, a stack of a 50-nm-thick silicon oxynitride layer and a 400-nm-thick silicon nitride layer over the silicon oxynitride layer was used. For a source electrode 916a and a drain electrode 916b, a stack of a 50-nm-thick tungsten layer, a 400-nm-thick aluminum layer over the tungsten layer, and a 100-nm-thick titanium layer over the aluminum layer was used. As a protective insulating film 918, a 450-nm-thick silicon oxynitride film containing excess oxygen was used.

In Transistor 1, as an oxide semiconductor layer 906a1, a 35-nm-thick oxide semiconductor layer formed by a sputtering method using a target containing In, Ga, and Zn at an atomic ratio of 1:1:1 was used. As an oxide semiconductor layer 906a2, a 20-nm-thick oxide semiconductor layer formed by a sputtering method using a target containing In, Ga, and Zn at an atomic ratio of 1:3:2 was used.

Figure 37B:
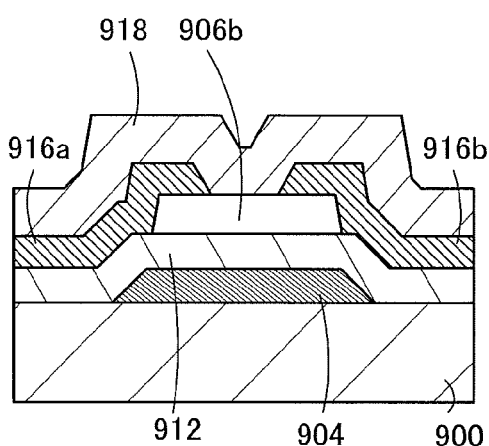

FIG. 37B illustrates the structure of Transistor 2. A glass substrate was used as the substrate 900. A 100-nm-thick tungsten film was used as the gate electrode 904. As the gate insulating film 912, a stack of a 50-nm-thick silicon oxynitride layer and a 400-nm-thick silicon nitride layer over the silicon oxynitride layer was used. For the source electrode 916a and the drain electrode 916b, a stack of a 50-nm-thick tungsten layer, a 400-nm-thick aluminum layer over the tungsten layer, and a 100-nm-thick titanium layer over the aluminum layer was used. As the protective insulating film 918, a 450-nm-thick silicon oxynitride film containing excess oxygen was used.

In Transistor 2, as an oxide semiconductor layer 906b, a 35-nm-thick oxide semiconductor layer formed by a sputtering method using a target containing In, Ga, and Zn at an atomic ratio of 1:1:1 was used.

Figure 37C:
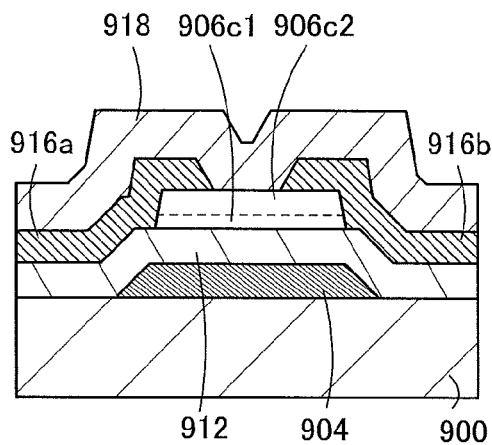

FIG. 37C illustrates the structure of Transistor 3. A glass substrate was used as the substrate 900. A 100-nm-thick tungsten film was used as the gate electrode 904. As the gate insulating film 912, a stack of a 50-nm-thick silicon oxynitride layer and a 400-nm-thick silicon nitride layer over the silicon oxynitride layer was used. For the source electrode 916a and the drain electrode 916b, a stack of a 50-nm-thick tungsten layer, a 400-nm-thick aluminum layer over the tungsten layer, and a 100-nm-thick titanium layer over the aluminum layer was used. As the protective insulating film 918, a 450-nm-thick silicon oxynitride film containing excess oxygen was used.

In Transistor 3, as an oxide semiconductor layer 906c1, a 20-nm-thick oxide semiconductor layer formed by a sputtering method using a target containing In, Ga, and Zn at an atomic ratio of 1:3:2 was used. As an oxide semiconductor layer 906c2, a 35-nm-thick oxide semiconductor layer formed by a sputtering method using a target containing In, Ga, and Zn at an atomic ratio of 1:1:1 was used.

Figure 37D:
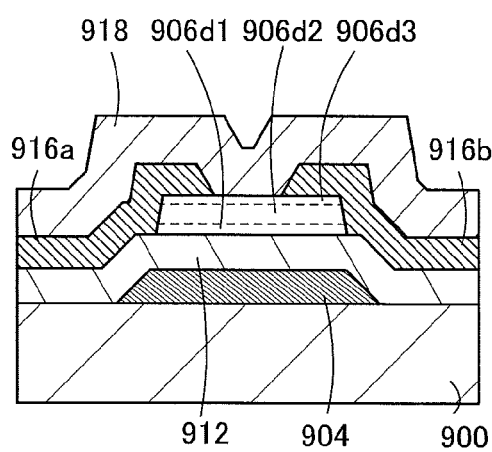

FIG. 37D illustrates the structure of Transistor 4. A glass substrate was used as the substrate 900. A 100-nm-thick tungsten film was used as the gate electrode 904. As the gate insulating film 912, a stack of a 50-nm-thick silicon oxynitride layer and a 400-nm-thick silicon nitride layer over the silicon oxynitride layer was used. For the source electrode 916a and the drain electrode 916b, a stack of a 50-nm-thick tungsten layer, a 400-nm-thick aluminum layer over the tungsten layer, and a 100-nm-thick titanium layer over the aluminum layer was used. As the protective insulating film 918, a 450-nm-thick silicon oxynitride film containing excess oxygen was used.

In Transistor 4, as an oxide semiconductor layer 906d1, a 20-nm-thick oxide semiconductor layer formed by a sputtering method using a target containing In, Ga, and Zn at an atomic ratio of 1:3:2 was used. As an oxide semiconductor layer 906d2, a 35-nm-thick oxide semiconductor layer formed by a sputtering method using a target containing In, Ga, and Zn at an atomic ratio of 1:1:1 was used. As an oxide semiconductor layer 906d3, a 20-nm-thick oxide semiconductor layer formed by a sputtering method using a target containing In, Ga, and Zn at an atomic ratio of 1:3:2 was used.

Note that the same deposition conditions were employed in the sputtering for forming the oxide semiconductor layer 906a1, the oxide semiconductor layer 906b, the oxide semiconductor layer 906c2, and the oxide semiconductor layer 906d2. Further, the same deposition conditions were employed in the sputtering for forming the oxide semiconductor layer 906a2, the oxide semiconductor layer 906c1, the oxide semiconductor layer 906d1, and the oxide semiconductor layer 906d3.

Further, the substrate 900, the gate electrode 904, the gate insulating film 912, the source electrode 916a, the drain electrode 916b, and the protective insulating film 918 in Transistors 1 to 4 were each formed under the same conditions.

Transistors 1 to 4 were subjected to first heat treatment before the formation of the protective insulating film 918. The first heat treatment was performed at 450° C. in a nitrogen gas atmosphere for one hour, and then at 450° C. in an atmosphere containing 80% nitrogen gas and 20% oxygen gas for one hour. Further, Transistors 1 to 4 were subjected to second heat treatment after the formation of the protective insulating film 918. The second heat treatment was performed at 350° C. in an atmosphere containing 80% nitrogen gas and 20% oxygen gas for one hour.

In the above manner, Transistors 1 to 4 corresponding to Samples 1 to 4 were prepared.

Figure 38:
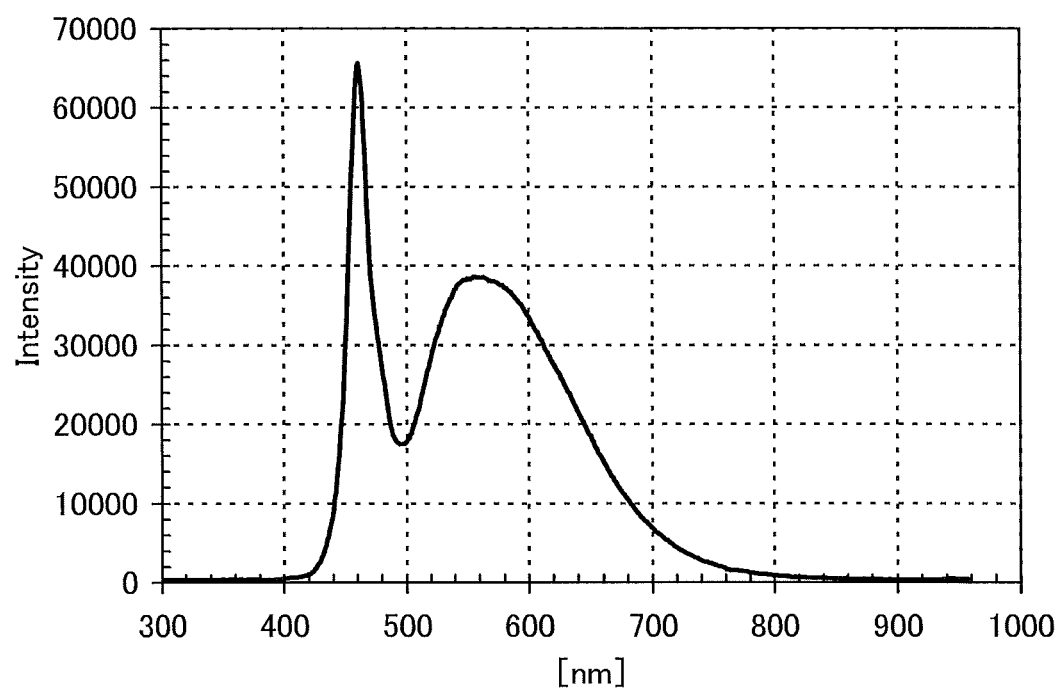
FIG. 38 shows a spectrum of irradiation light.

Next, gate BT stress tests (GBT tests) were performed on the Transistors 1 to 4. The GBT tests were performed in a dark state (dark) or a light state (photo). Note that in the light state, the transistors were irradiated with white LED light with 3000 lx. FIG. 38 shows an emission spectrum of the white LED light used in the GBT test in the light state.

The GBT tests were performed on the transistors with a channel length L of 6 μm and a channel width W of 50 μm. The Vg–Id characteristics were measured by measurement of drain current under the conditions that the drain voltage was 10 V and the gate voltage was swept from −30 V to 30 V.

In the positive GBT test (+GBT), first, the substrate temperature was set to 80° C. and first measurement of Vg–Id characteristics was conducted. After that, the transistors were held for 2000 seconds at a gate voltage Vg of 30 V and a drain voltage Vd of 0 V, and then second measurement of Vg–Id characteristics was conducted.

In the negative GBT test (−GBT), first, the substrate temperature was set to 80° C. and first measurement of Vg–Id characteristics was conducted. After that, the transistors were held for 2000 seconds at a gate voltage Vg of −30 V and a drain voltage Vd of 0 V, and then second measurement of Vg–Id characteristics was conducted.

Figure 39A:
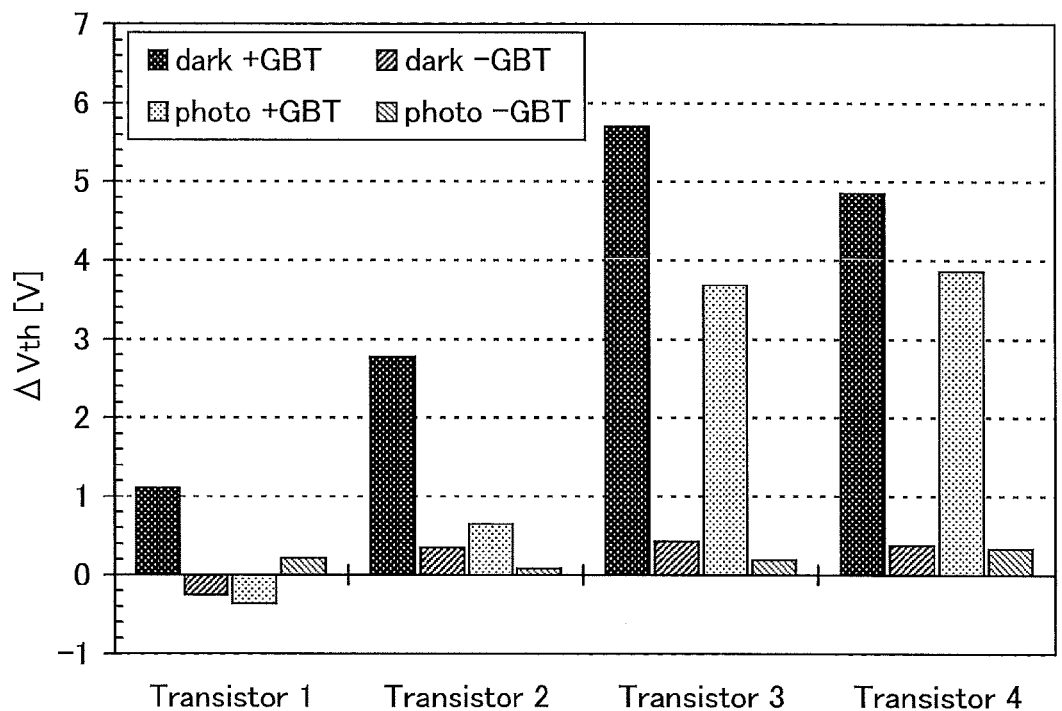
FIGS. 39A and 39B show ΔVth and ΔShift of transistors between before and after GBT tests.
Figure 39B:
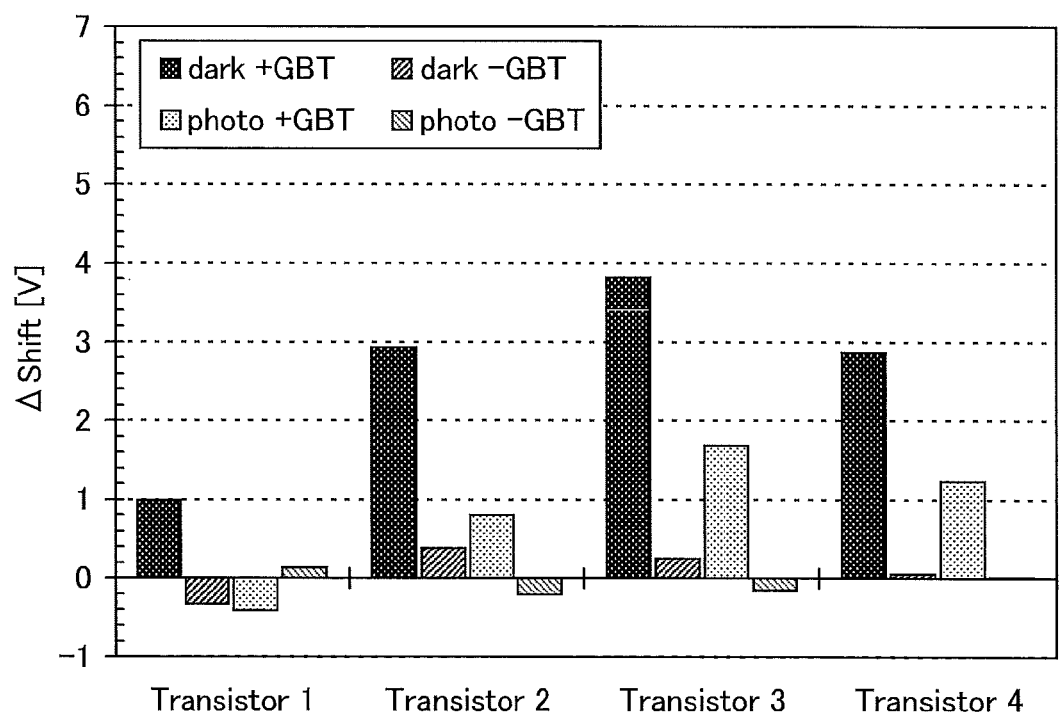

FIGS. 39A and 39B show changes in threshold voltage (ΔVth) and shift value (ΔShift) between before and after the GBT tests.

Note that the threshold voltage (Vth) refers to a gate voltage when a channel is formed (voltage between a source and a gate). In a curve where the horizontal axis indicates the gate voltage (Vg) and the vertical axis indicates the square root of drain current (Id; current between a source and a drain) and where data are plotted (Vg–√Id characteristics), the threshold voltage was defined as a gate voltage at a point of intersection of an extrapolated tangent line having the highest inclination with the square root of drain current of 0 (Id=0 A). In a curve where the horizontal axis indicates the gate voltage (Vg) and the vertical axis indicates the logarithm of the drain current (Id) and where data are plotted, the shift value (Shift) is defined as a gate voltage at a point of intersection of an extrapolated tangent line having the highest inclination with a drain current of $1 \times 10^{-12}$ A.

According to FIGS. 39A and 39B, the amounts of change in threshold voltage and shift value of Transistor 1 were smaller than those of Transistor 2, particularly by the positive GBT test in a dark state. Further, the amounts of change in threshold voltage and shift value of Transistor 1 were smaller than those of Transistor 3, particularly by the positive GBT test in a dark state and by the positive GBT test in a light state.

This is presumably because Transistor 1 has a lower density of trap states in the channel formation region than those of Transistors 2 and 3, and thus fluctuations of electrical characteristics due to capture of charges by the trap states are small.

According to FIGS. 39A and 39B, the amounts of change in threshold voltage and shift value of Transistor 4 were smaller than those of Transistor 3, particularly by the positive GBT test in a dark state.

This is presumably because, like Transistor 1, Transistor 4 has a lower density of trap states in the channel formation region than that of Transistor 3, and thus fluctuations of electrical characteristics due to capture of charges by the trap states are small.

This example shows that the density of trap states in the main current path in the oxide semiconductor layer can be evaluated by photoresponse. This example also shows that a transistor with a low density of trap states in the channel formation region (main current path) has stable electrical characteristics.

This example can be implemented in appropriate combination with the embodiment or Example 2.

Example 2

In this example, photoresponse of Samples 1 and 2 described in Example 1 was evaluated under conditions different from those in Example 1.

Figure 40A:
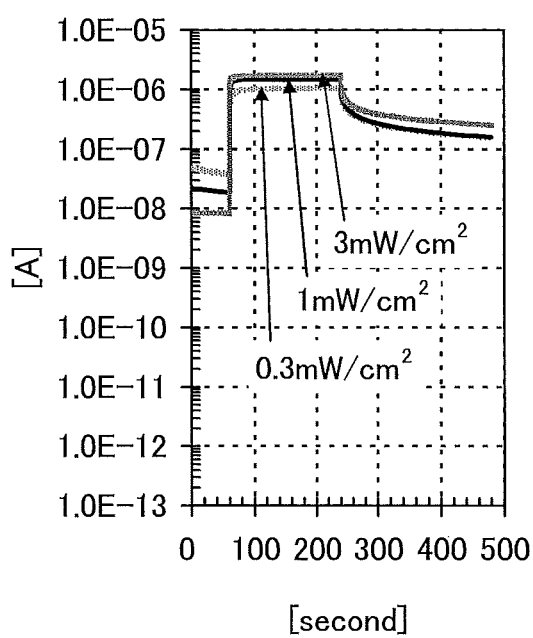
FIGS. 40A and 40B show photoresponse of samples.
Figure 40B:
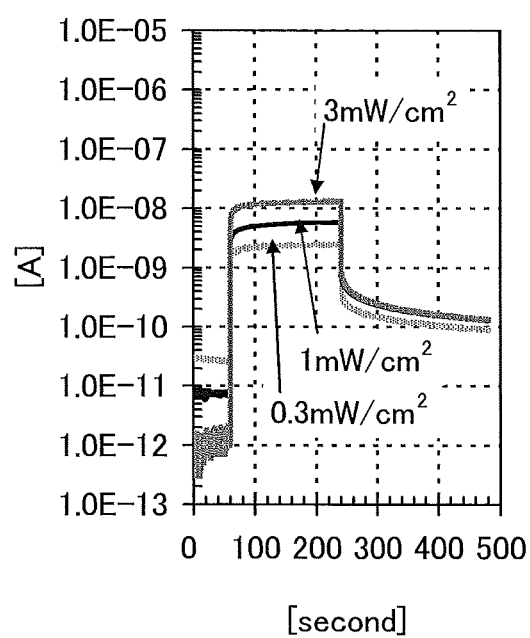

FIGS. 40A and 40B show the photoresponse to irradiation light with intensities of 0.3 mW/cm², 1 mW/cm², and 3 mW/cm². FIG. 40A shows the photoresponse of Sample 1, and FIG. 40B shows the photoresponse of Sample 2. Refer to Example 1 for description on other conditions for evaluating photoresponse.

According to FIGS. 40A and 40B, current value is increased as the intensity of light with which Samples 1 and 2 are irradiated is increased.

Figure 41A:
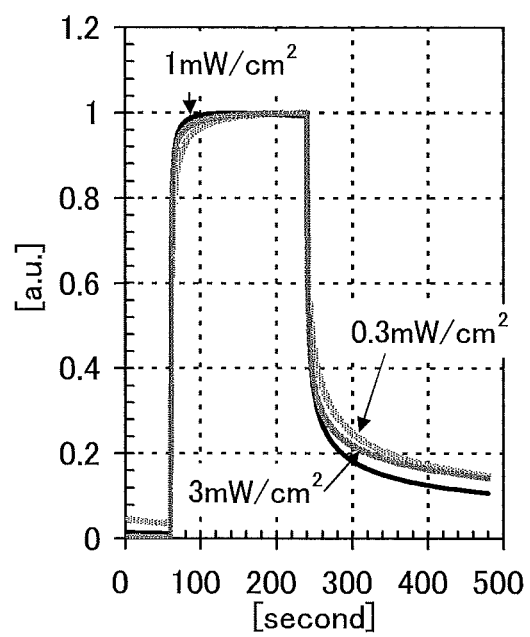
FIGS. 41A and 41B show photoresponse of samples.
Figure 41B:
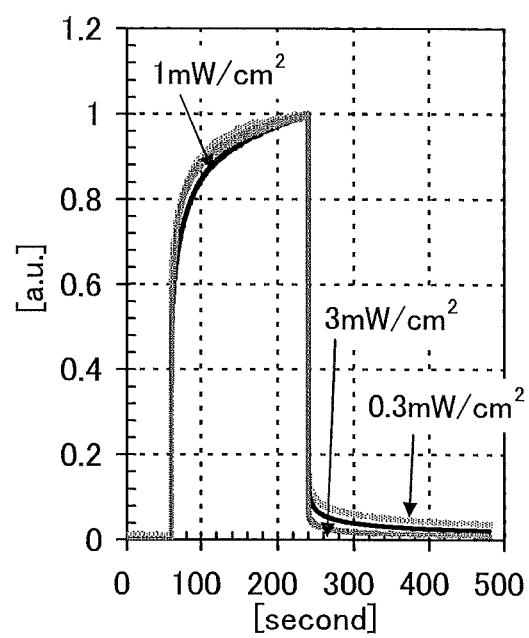

FIGS. 41A and 41B show the results of photoresponse in FIGS. 40A and 40B that are converted into normalized current values. FIG. 41A shows the photoresponse of Sample 1, and FIG. 41B shows the photoresponse of Sample 2.

According to FIGS. 41A and 41B, even in the case where the intensity of irradiation light is varied, the results of photoresponse are similar when converted into normalized current values.

Figure 42A:
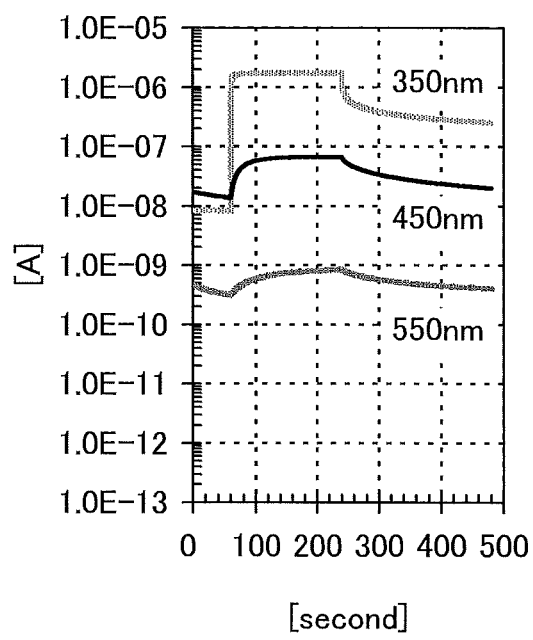
FIGS. 42A and 42B show photoresponse of samples.
Figure 42B:
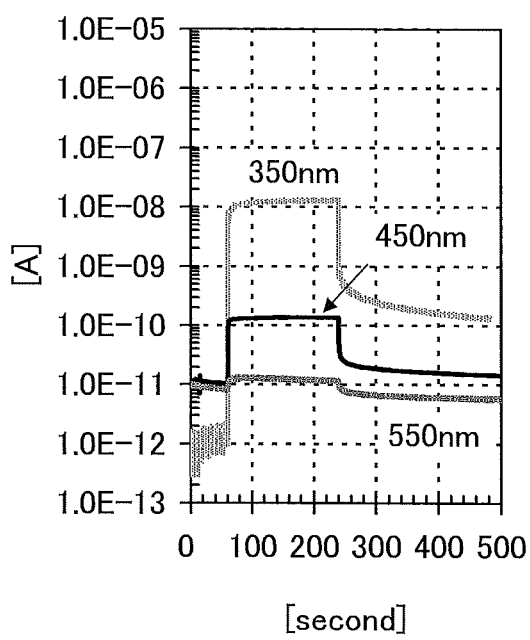

FIGS. 42A and 42B show the photoresponse to irradiation light with a center wavelength of 350 nm (see "light1" in FIG.

Figure 34:
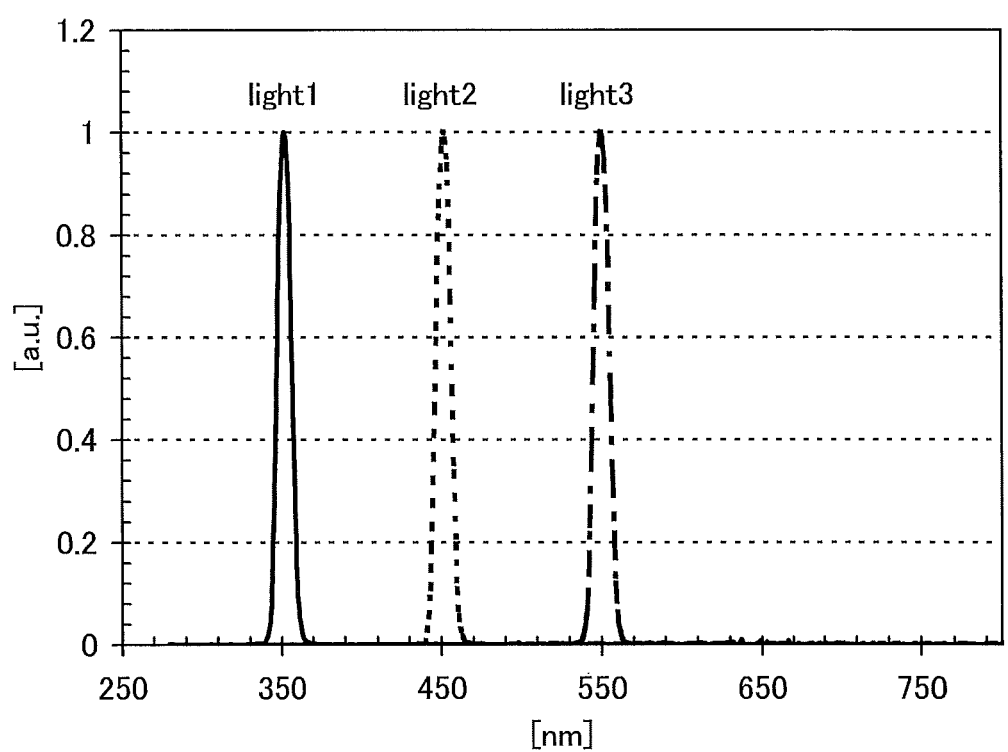
FIG. 34 shows spectra of irradiation light.
Figure 35A:
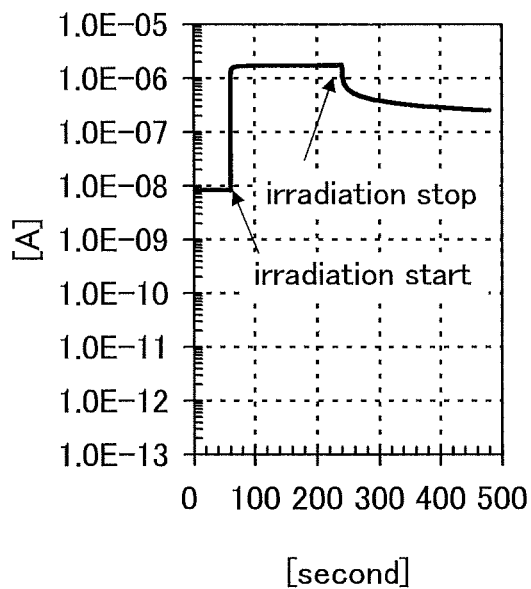
FIGS. 35A to 35D show photoresponse of samples.
Figure 35B:
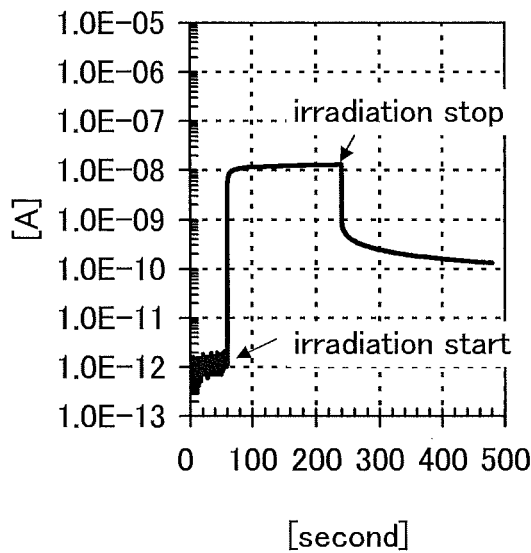
Figure 35C:
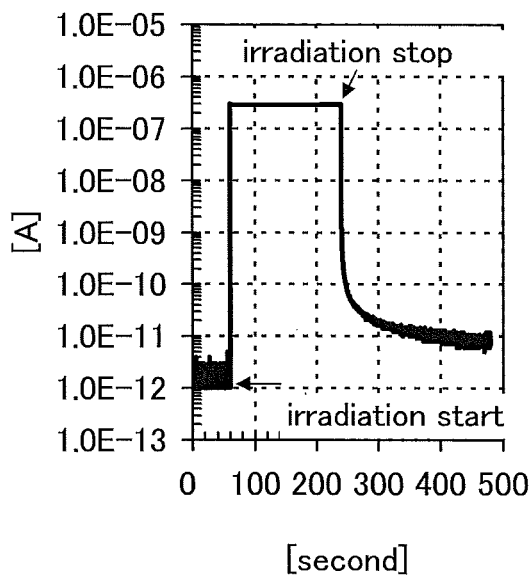
Figure 35D:
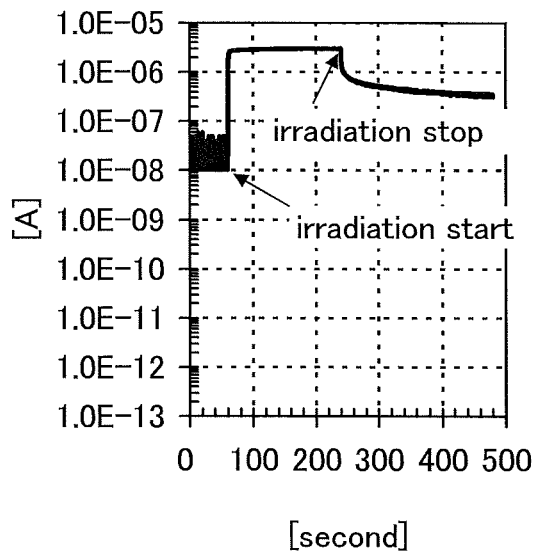

34), light with a center wavelength of 450 nm (see "light2" in FIG. 34), and light with a center wavelength of 550 nm (see "light3" in FIG. 34). FIG. 42A shows the photoresponse of Sample 1, and FIG. 42B shows the photoresponse of Sample 2. Refer to Example 1 for description on other conditions for evaluating photoresponse.

According to FIGS. 42A and 42B, the current value is increased as the center wavelength of light with which Samples 1 and 2 are irradiated is shortened.

Figure 43A:
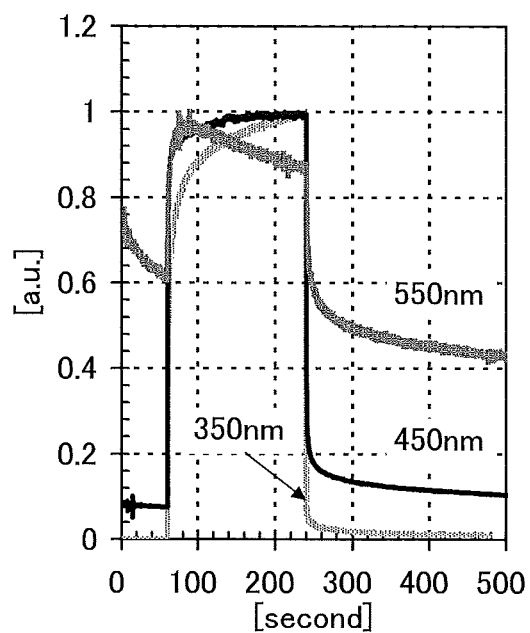
FIGS. 43A and 43B show photoresponse of samples.
Figure 43B:
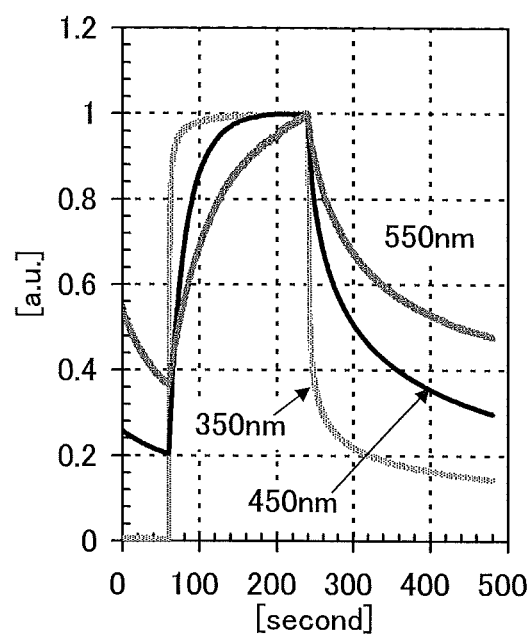

FIGS. 43A and 43B show the results of photoresponse in FIGS. 42A and 42B that are converted into normalized current values. FIG. 43A shows the photoresponse of Sample 1, and FIG. 43B shows the photoresponse of Sample 2.

According to FIGS. 43A and 43B, in the case where the center wavelength of irradiation light is varied, the results of photoresponse are not similar even when converted into normalized current values. Accordingly, in evaluating trap states by photoresponse, it is preferable to use light with a center wavelength suitable for a sample to be measured.

Figure 44A:
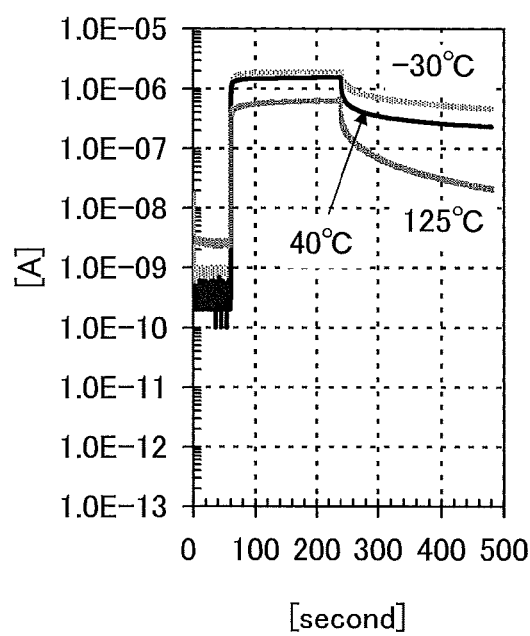
FIGS. 44A and 44B show photoresponse of samples.
Figure 44B:
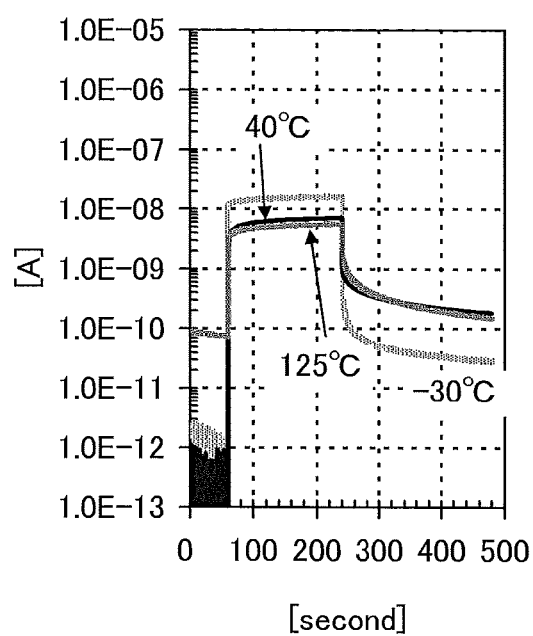

FIGS. 44A and 44B show the photoresponse at measurement temperatures of −30° C., 40° C., and 125° C. FIG. 44A shows the photoresponse of Sample 1, and FIG. 44B shows the photoresponse of Sample 2. Refer to Example 1 for description on other conditions for evaluating photoresponse.

According to FIGS. 44A and 44B, as the measurement temperature of Samples 1 and 2 is increased, the value of current that flows upon irradiation of the samples is decreased. Further, in Sample 1, the higher the measurement temperature is, the sooner the current value is decreased after the stop of light irradiation. In Sample 2, the current value is decreased sooner after the stop of light irradiation at the measurement temperature of −30° C. than at 40° C. and 125° C.

Figure 45A:
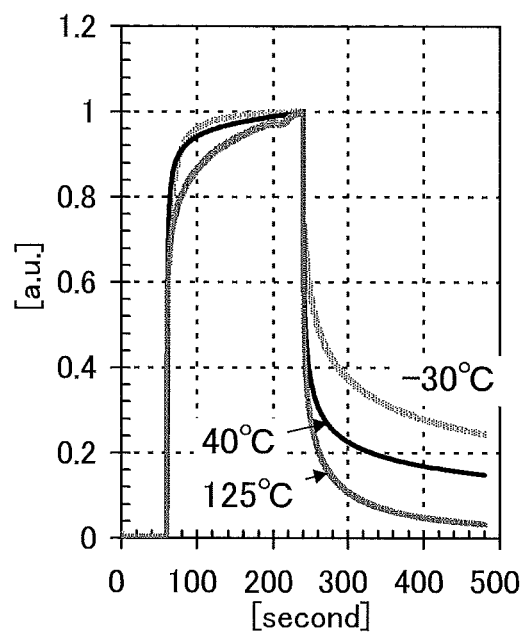
FIGS. 45A and 45B show photoresponse of samples.
Figure 45B:
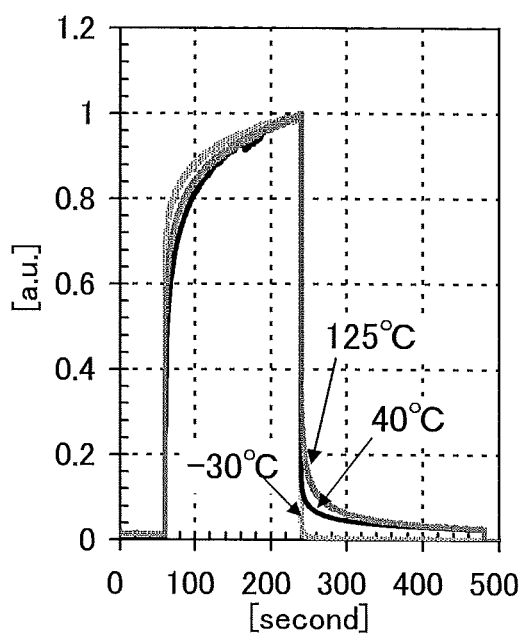

FIGS. 45A and 45B show the results of photoresponse in FIGS. 44A and 44B that are converted into normalized current values. FIG. 45A shows the photoresponse of Sample 1, and FIG. 45B shows the photoresponse of Sample 2.

The results of photoresponse in FIGS. 45A and 45B where current values are converted into normalized current values show tendencies similar to those in FIGS. 44A and 44B.

According to Model A described in the embodiment, the step in which recombination of electrons and holes proceeds slowly follows the stop of light irradiation in Sample 1. The results show that, on the assumption that movement of electrons from the conduction band of the oxide semiconductor layer $906a1$ to the conduction band of the oxide semiconductor layer $906a2$ limits the speed of the step, recombination proceeds more rapidly as the measurement temperature is increased.

According to Model B described in the embodiment, the step in which recombination of electrons and holes proceeds rapidly follows the stop of light irradiation in Sample 2. The results show that, on the assumption that state-to-state recombination in the oxide semiconductor layer $906b$ causes the step, electrons or holes captured by the trap states are excited again more easily as the measurement temperature is increased.

FIGS. 44A and 44B and FIGS. 45A and 45B show that more information can be obtained from photoresponse by changing measurement temperature. Accordingly, in evaluating trap states by photoresponse, it is preferable to vary the measurement temperature.

This example can be implemented in appropriate combination with the embodiment or Example 1.

Note that in this specification and the like, in a diagram or a text described in one embodiment or example, part of the diagram or the text is taken out, and one embodiment of the invention can be constituted. Thus, in the case where a diagram or a text related to a certain part is described, a content taken out from the diagram or the text of the certain part is also disclosed as one embodiment of the invention and can constitute one embodiment of the invention. Therefore, for example, part of a diagram or a text including one or more of active elements (e.g., transistors and diodes), wirings, passive elements (e.g., capacitors and resistors), conductive layers, insulating layers, semiconductor layers, organic materials, inorganic materials, components, devices, operating methods, manufacturing methods, and the like can be taken out to constitute one embodiment of the invention. For example, M circuit elements (e.g., transistors or capacitors) (M is an integer) are picked up from a circuit diagram in which N circuit elements (e.g., transistors or capacitors) (N is an integer, where M<N) are provided, whereby one embodiment of the invention can be constituted. As another example, M layers (M is an integer) are picked up from a cross-sectional view in which N layers (N is an integer, where M<N) are provided, whereby one embodiment of the invention can be constituted. As another example, M elements (M is an integer) are picked up from a flow chart in which N elements (N is an integer, where M<N) are provided, whereby one embodiment of the invention can be constituted.

Note that, in the case where at least one specific example is illustrated in a diagram or a text described in one embodiment in this specification and the like, it will be readily appreciated by those skilled in the art that a broader concept of the specific example can be derived. Therefore, in the case where at least one specific example is illustrated in the diagram or the text described in one embodiment, a broader concept of the specific example is disclosed as one embodiment of the invention and can constitute one embodiment of the invention.

Note that, in this specification and the like, a content illustrated in at least a diagram (which may be part of the diagram) is disclosed as one embodiment of the invention and can constitute one embodiment of the invention. Therefore, when a certain content is illustrated in a diagram, the content is disclosed as one embodiment of the invention even without text description and can constitute one embodiment of the invention. Similarly, a diagram obtained by taking out part of a diagram is disclosed as one embodiment of the invention and can constitute one embodiment of the invention.

This application is based on Japanese Patent Application serial no. 2012-263819 filed with Japan Patent Office on Nov. 30, 2012, the entire contents of which are hereby incorporated by reference.

What is claimed is:

1. An evaluation method for a semiconductor device comprising the steps of:
    applying a voltage between a first electrode and a second electrode at a time T0 so that a current flows in an oxide semiconductor layer electrically connected to the first electrode and the second electrode;
    irradiating the oxide semiconductor layer with light having an energy higher than an energy gap of the oxide semiconductor layer, wherein the irradiating step starts at a time T1 and stops at a time T2;
    comparing a value of a current flowing between the first electrode and the second electrode at a time T3 with a maximum value of a current flowing between the first electrode and the second electrode between the time T1 and the time T2; and
    comparing a value of a current flowing between the first electrode and the second electrode at a time T4 with the maximum value of the current flowing between the first electrode and the second electrode between the time T1 and the time T2; and removing the voltage between the first electrode and the second at time T5, wherein the time T1 is after the time T0, wherein the time T3 is after a period of greater than or equal to 1 second and less than or equal to 15 seconds from the time T1 and before the time T2, wherein the time T4 is after a period of greater than or equal to 1 second and less than or equal to 15 seconds from the time T2, and wherein the time T5 is after the time T4.

2. The evaluation method for a semiconductor device according to claim 1, wherein the time T3 is five seconds after the time T1, and wherein the time T4 is five seconds after the time T2.

3. The evaluation method for a semiconductor device according to claim 1, wherein the time T2 is after a period of greater than or equal to 100 seconds and less than or equal to 300 seconds from the time T1.

4. The evaluation method for a semiconductor device according to claim 1, wherein a temperature around the semiconductor device is kept within a range of 20° C. to 25° C. from the time T0 until the time T5.

5. The evaluation method for a semiconductor device according to claim 1, further comprising the step of judging whether the value of the current flowing between the first electrode and the second electrode at the time T3 is greater than or equal to 70% and less than 100% of the maximum value of the current flowing between the first electrode and the second electrode between the time T1 and the time T2.

6. The evaluation method for a semiconductor device according to claim 1, further comprising the step of judging whether the value of the current flowing between the first electrode and the second electrode at the time T4 is greater than or equal to 5% and less than 100% of the maximum value of the current flowing between the first electrode and the second electrode between the time T1 and the time T2.

7. The evaluation method for a semiconductor device according to claim 1, further comprising the steps of:

judging whether the value of the current flowing between the first electrode and the second electrode at the time T3 is greater than or equal to 70% and less than 100% of the maximum value of the current flowing between the first electrode and the second electrode between the time T1 and the time T2; and judging whether the value of the current flowing between the first electrode and the second electrode at the time T4 is greater than or equal to 5% and less than 100% of the maximum value of the current flowing between the first electrode and the second electrode between the time T1 and the time T2.

8. The evaluation method for a semiconductor device according to claim 1, wherein the light has a peak intensity in a wavelength range of 340 nm to 360 nm.

9. The evaluation method for a semiconductor device according to claim 1, wherein the light has an intensity of 3 mW/cm$^2$.

10. The evaluation method for a semiconductor device according to claim 1, wherein the oxide semiconductor layer includes a first oxide semiconductor layer and a second oxide semiconductor layer over the first oxide semiconductor layer.

11. An evaluation method for a semiconductor device comprising the steps of:

applying a voltage between a first electrode and a second electrode at a time T0 so that a current flows in an oxide semiconductor layer electrically connected to the first electrode and the second electrode;

irradiating the oxide semiconductor layer with light having an energy higher than an energy gap of the oxide semiconductor layer, wherein the irradiating step starts at a time T1 and stops at a time T2;

comparing a value of a current flowing between the first electrode and the second electrode at a time T3 with a maximum value of a current flowing between the first electrode and the second electrode between the time T1 and the time T2; and comparing a value of a current flowing between the first electrode and the second electrode at a time T4 with the maximum value of the current flowing between the first electrode and the second electrode between the time T1 and the time T2; and removing the voltage between the first electrode and the second at time T5, wherein the time T1 is after the time T0, wherein the time T3 is between the time T1 and the time T2, wherein the time T4 is after a period of greater than or equal to 1 second and less than or equal to 15 seconds from the time T2, and wherein the time T5 is after the time T4.

* * * * *